(12) United States Patent
Hishiki et al.

(10) Patent No.: US 10,847,451 B2
(45) Date of Patent: Nov. 24, 2020

(54) DEVICE FOR MOUNTING SEMICONDUCTOR ELEMENT, LEAD FRAME, AND SUBSTRATE FOR MOUNTING SEMICONDUCTOR ELEMENT

(71) Applicant: Ohkuchi Materials Co., Ltd., Kagoshima (JP)

(72) Inventors: Kaoru Hishiki, Isa (JP); Keiichi Otaki, Isa (JP); Hidehiko Sasaki, Isa (JP); Kotaro Tomeoka, Isa (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 16/833,137

(22) Filed: Mar. 27, 2020

(65) Prior Publication Data

US 2020/0312753 A1    Oct. 1, 2020

(30) Foreign Application Priority Data

Mar. 28, 2019  (JP) .................................. 2019-064221

(51) Int. Cl.
| | |
|---|---|
| *H05K 1/09* | (2006.01) |
| *H01L 23/495* | (2006.01) |
| *H01L 23/00* | (2006.01) |
| *H05K 1/11* | (2006.01) |
| *H05K 1/18* | (2006.01) |

(52) U.S. Cl.
CPC ........ *H01L 23/49582* (2013.01); *H01L 24/16* (2013.01); *H01L 24/48* (2013.01); *H05K 1/09* (2013.01); *H05K 1/11* (2013.01); *H05K 1/181* (2013.01); *H01L 2224/16245* (2013.01); *H01L 2224/48247* (2013.01)

(58) Field of Classification Search
CPC .......... H05K 1/09; H05K 1/092; H05K 1/095; H05K 1/097
See application file for complete search history.

(56) References Cited

U.S. PATENT DOCUMENTS

| | | | | |
|---|---|---|---|---|
| 2003/0132025 A1* | 7/2003 | Wakihara | ............. | H05K 3/4661 174/256 |
| 2017/0231101 A1* | 8/2017 | Miki | ........................ | H05K 3/06 |

FOREIGN PATENT DOCUMENTS

| | | |
|---|---|---|
| JP | 3259894 B2 | 2/2002 |
| JP | 3626075 B2 | 3/2005 |

(Continued)

*Primary Examiner* — Jeremy C Norris
(74) *Attorney, Agent, or Firm* — Westerman, Hattori, Daniels & Adrian, LLP

(57) ABSTRACT

A device for mounting a semiconductor element includes a metal plate serving as a base, a roughened silver plating layer with acicular projections, formed on at least either of: (a) top faces; and (b) faces that form concavities or through holes between the top faces and bottom faces; of the metal plate, and a reinforcing plating layer covering, as an outermost plating layer, an outer surface of the acicular projections in the roughened silver plating layer. The roughened silver plating layer has a crystal structure in which the crystal direction <101> occupies a largest proportion among the crystal directions <001>, <111>, and <101>. An outer surface of the reinforcing plating layer is shaped to have acicular projections with a surface area ratio of 1.30 or more and 6.00 or less to the corresponding smooth surface, as inheriting the shape of the acicular projections in the roughened silver plating layer.

7 Claims, 54 Drawing Sheets

(56) References Cited

FOREIGN PATENT DOCUMENTS

| | | | |
|---|---|---|---|
| JP | 4032063 | B2 | 1/2008 |
| JP | 4508064 | B2 | 7/2010 |
| JP | 4853508 | B2 | 1/2012 |
| JP | 5151438 | B2 | 2/2013 |

* cited by examiner

FIG.27H2 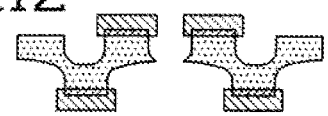

FIG.31H2 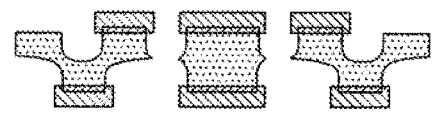
FIG.31I 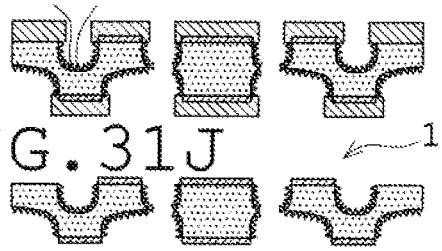  FIG.31I' 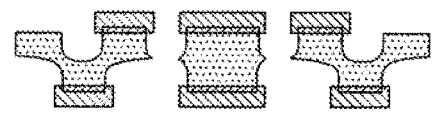

DEVICE FOR MOUNTING SEMICONDUCTOR ELEMENT, LEAD FRAME, AND SUBSTRATE FOR MOUNTING SEMICONDUCTOR ELEMENT

CROSS-REFERENCE TO RELATED PATENT APPLICATIONS

This application claims the benefit of Japanese Patent Application No. 2019-064221 filed in Japan on Mar. 28, 2019, the contents of which are incorporated herein by reference.

BACKGROUND OF THE INVENTION

1) Field of the Invention

The present invention relates to a device for mounting semiconductor element thereon, such as a lead frame and a substrate for mounting semiconductor element thereon, in which a metal plate is provided with silver plating on at least either of (a) and (b) of the metal plate, which are to be in contact with a sealing resin, where (a) is top faces, and (b) is faces that form concavities or through holes between the top faces and bottom faces.

2) Description of Related Art

One of devices for mounting semiconductor elements thereon is a lead frame. Conventionally, often used are lead frames in which silver plating, as outermost plating, is applied to the entirety or a part of the surface of a lead frame base. Silver or an alloy containing silver, however, has poor adhesion to a sealing resin. Therefore, such a lead frame involves a problem in reliability, for the sealing resin is easily peeled off the lead frame by shock or heat.

To solve this problem, there is known a technique in which an outer surface of the lead frame base is processed into a roughened state having unevenness by microetching treatment, to produce a physical anchor effect, thereby improving adhesion to a sealing resin.

However, the lead frame base often used in manufacture of a lead frame is made of a copper alloy containing silicon, to generate impurity residue called smut if undergoing microetching treatment. For this reason, it is unsuitable to use the technique of roughening the surface of a lead frame base made of a copper alloy into a roughened state having unevenness by microetching process.

Further, in the case of a lead frame using a lead frame base made of a copper alloy, in order to secure good bondability with metal wires used at the time of bonding with a semiconductor element, it is necessary to minimize the influence of diffusion of copper, which resides in the underlying lead frame base made of a copper alloy. Therefore, when a plating layer made of a noble metal or a noble metal alloy such as silver or an alloy containing silver is formed directly on a lead frame base made of a copper alloy without an undercoat plating layer being provided, it is generally necessary to make the thickness of the plating layer made of a noble metal or a noble metal alloy 2 μm or more.

On the other hand, in recent years, for size reduction and cost reduction of semiconductor packages, high-density packaging upon use of light, thin, short and small parts have been demanded. For size reduction, plating layers are required to be made thinner. Regarding plating layers made of noble metals or noble metal alloys, they are required to be made much thinner from the standpoint of cost reduction also.

In a lead frame using a lead frame base made of a copper alloy, one of the measures for reducing the thickness of a plating layer made of a noble metal or a noble metal alloy is to form, as an undercoat plating layer beneath the plating layer made of a noble metal or a noble metal alloy, a plating layer made of nickel or an alloy containing nickel, which prevents copper diffusion.

However, even if the plating layer made of a noble metal or a noble metal alloy is made thin, adhesiveness to the resin cannot be improved.

As conventional art relating to these issues, Japanese Patent No. 3259894 discloses, with respect to an undercoat plating layer beneath the plating layer made of a noble metal or a noble metal alloy, the technique of forming a dense and planar nickel plating layer on the entire surface of a copper alloy and then forming thereon a nickel plating layer in which crystal growth in the vertical direction is given priority over crystal growth in the horizontal direction to form an outer surface with unevenness, thereby producing physical anchor effect for improving adhesiveness to sealing resin.

Japanese Patent No. 4853508 discloses, with respect to an undercoat plating layer beneath the plating layer made of a noble metal or a noble metal alloy, the technique of forming, on a copper alloy, a nickel plating layer shaped to have conical projections and then forming thereon a nickel plating layer having good leveling property so that projections are shaped hemispherical, thereby improving adhesiveness to sealing resin and preventing seepage of epoxy resin component.

Japanese Patent No. 5151438 discloses the technique of forming, on a nickel layer having a rough surface, noble metal plating layers composed of a gold layer and a silver layer.

Another of devices for mounting semiconductor elements thereon is a substrate for mounting a semiconductor element thereon, which is designed so that a metal plate is processed or removed in manufacturing a semiconductor package, thereby completing the package.

In accordance with demands for higher pin count, smaller size and thinner shape, there have emerged various kinds of semiconductor packages such as BGA (Ball Grid Array) packages which use solder balls, CPS (Chip Size Package) in which outer leads are arranged under a semiconductor element, packages in which semiconductor elements are flip-chip connected, etc.

Of these packages, as those can satisfy the above demands at a relatively low cost, there are QFN (Quad Flat Non-lead) type packages which are resin-sealed after semiconductor elements are flip-chip connected with terminals for mounting the semiconductor elements.

For example, Japanese Patent No. 4032063 describes a semiconductor package in which a semiconductor element is flip-chip mounted. In manufacturing of this semiconductor package, upon use of a substrate for mounting a semiconductor element thereon in which columnar terminal portions with internal connection terminals for flip-chip mounting arranged at the top faces thereof are formed on the upper surface side by half-etching performed on the upper surface side of a metal material, resin-sealing is performed on the upper surface side of the substrate for mounting a semiconductor element thereon, and then half-etching is performed on the lower surface side, to isolate the columnar terminal portions for flip-chip mounting as well as to form external connection terminal portions on the lower surface side.

In order to form the external connection terminal portions, gold plating is applied in advance to sites that are to be the external connection terminal portions and then half-etching is performed upon use of this gold plating as a mask, to isolate the columnar terminal portions for flip-chip mounting. Therefore, the metal material at the sites where the columnar terminal portions are formed is not etched either on the upper surface side or on the lower surface side and thus remains with its original thickness.

It is known that: forming a resist mask with a predetermined patterning on one-side surface of a base having a conductivity; electrodepositing a conductive metal on the base where not covered with the resist mask, to form a metal layer for mounting a semiconductor element thereon and an electrode layer to be connected with an external board; removing the resist mask, to form a substrate for mounting a semiconductor element thereon; mounting-and-wire-bonding or flip-chip mounting a semiconductor element on the substrate for mounting a semiconductor element thereon and then performing resin-sealing; and removing the base produces a semiconductor package in which other-side surface of the electrodeposited conductive metal is exposed.

Japanese Patent No. 3626075 describes that, by electrodepositing a conductive metal to exceed the thickness of a resist mask, there is obtained a substrate for mounting a semiconductor element thereon having overhang portions at upper rims of a metal layer for mounting a semiconductor element thereon and an electrode layer for connection with the outside, so that, in resin-sealing, the overhangs of the metal layer and the electrode layer bite into the resin to securely remain on the resin side.

Japanese Patent No. 4508064 describes that a metal layer or a electrode layer is formed to have an inverted trapezoidal shape by making a resist mask to have a trapezoidal shape upon use of scattered ultraviolet light in forming the resist mask.

Japanese Patent No. 5151438 describes that the contact area between a metal layer and a sealing resin is increased by a roughened surface given to the outer surface of the metal layer, thereby enhancing adhesion between the metal layer and the resin sealing to make overhang portions of the metal layer securely remain on the resin side.

The techniques disclosed by Japanese Patent No. 3259894, Japanese Patent No. 4853508 and Japanese Patent No. 5151438 are such that, for the purpose of improving adhesion to resin, an undercoat plating layer is formed to have its outer surface as a roughened surface and that a noble metal plating layer is laminated as following the shape of the roughened surface.

As another measure for improving adhesion to a resin, it is conceivable to roughen the outer surface of a noble metal plating layer having being formed as a smooth noble metal plating layer on the surface of the lead frame base. For this purpose, the smooth noble metal plating layer before having a roughened surface should be formed thick.

In the semiconductor package described in Japanese Patent No. 4032063, gold plating is applied to the lower surface of a metal material that is to be external connection terminal portions, and half-etching is performed upon use of this gold plating as a mask, to form external connection terminal portions. While the gold plating on the lower surface of the external connection terminal portions is considered to be necessary for solder bonding between the external connection terminal portions and the board, this configuration leaves the columnar terminal portions for flip-chip mounting to maintain the original thickness of the metal material.

Also, although resin-sealing is to be performed after flip-chip connection of the semiconductor element with the internal connection terminal portions, the protrusion of the columnar terminal portions formed by half-etching is small.

According to the method of electrodepositing a conductive metal to exceed the thickness of the resist mask described in Japanese Patent No. 3626075, the plating layer is formed to have overhangs, but controlling the amount of overhang is difficult.

According to the method of forming a resist layer using scattered ultraviolet light described in Japanese Patent No. 4508064, if the thickness of the resist layer to be used is about 50 μm, since the ultraviolet light is absorbed by the resist and attenuates as travelling closer to the base, the cross-sectional shape of the opening may be almost rectangular or further to be normal trapezoidal with a shorter top side.

By roughening the outer face of the connection terminal surface on the semiconductor element mounting side as taught by Japanese Patent No. 5151438, it is possible to obtain a certain degree of adhesion between the sealing resin and the lead terminals after formation of the leadless package, but this technique requires a noble metal plating layer for semiconductor element connection to be laminated on the roughened undercoat plating layer.

Further, according to Japanese Patent No. 3626075, Japanese Patent No. 4508064 and Japanese Patent No. 5151438, low speed plating is generally used for roughening an undercoat plating layer.

After repeated trial and error, the present inventors have found that some improvement could be made for the plating layer in its entirety to be thin, to have a remarkably high adhesion with the resin and to retain such a state.

SUMMARY OF THE INVENTION

A device for mounting a semiconductor element thereon of embodiments of the present invention includes a metal plate serving as a base, a roughened silver plating layer having acicular projections formed on at least either of (a) and (b) of the metal plate, where (a) is top faces and (b) is faces that form concavities or through holes between the top faces and bottom faces, and a reinforcing plating layer with a thickness of 0.4 μm or more and 4.0 μm or less that covers, as an outermost plating layer, an outer surface of the acicular projections in the roughened silver plating layer, wherein the roughened silver plating layer has a crystal structure in which the crystal direction <101> occupies a largest proportion among the crystal directions <001>, <111> and <101>, and wherein an outer surface of the reinforcing plating layer is shaped to have acicular projections with a surface area ratio of 1.30 or more and 6.00 or less to a surface area of a smooth surface, as inheriting the acicular projections of the roughened silver plating layer.

A substrate for mounting a semiconductor element thereon according to some of embodiment modes of the present invention includes a metal plate made of a copper-based material and columnar terminal portions defined by concavities formed on an upper surface of the metal plate, wherein top faces of the columnar terminal portions are provided with a roughened silver plating layer having acicular projections, wherein a reinforcing plating layer with a thickness of 0.4 μm or more and 4.0 μm or less is formed, as an outermost plating layer, to cover an outer surface of the acicular projections in the roughened silver plating layer, wherein the roughened silver plating layer has a crystal structure in which the crystal direction <101> occupies a largest proportion among the crystal directions <001>, <111> and <101>, and wherein an outer surface of the reinforcing plating layer is shaped to have acicular projections with a surface area ratio of 1.30 or more and 6.00 or less to a surface area of a smooth surface, as inheriting the acicular projections of the roughened silver plating layer.

A substrate for mounting a semiconductor element thereon of some of the embodiment modes of the present invention includes a metal plate and columnar terminal portions composed only of plating layers and formed on an upper surface of the metal plate, wherein the columnar terminal portions include a roughened silver plating layer having acicular projections and a reinforcing plating layer with a thickness of 0.4 µm or more and 4.0 µm or less covering, as an outermost plating layer, an outer surface of the acicular projections in the roughened silver plating layer, wherein the roughened silver plating layer has a crystal structure in which the crystal direction <101> occupies a largest proportion among the crystal directions <001>, <111> and <101>, and wherein an outer surface of the reinforcing plating layer is shaped to have acicular projections with a surface area ratio of 1.30 or more and 6.00 or less to a surface area of a smooth surface, as inheriting the acicular projections of the roughened silver plating layer.

According to the embodiment modes of the present invention, a device for mounting a semiconductor element, such as a lead frame or a substrate for mounting a semiconductor element, provided with silver plating on at least either of (a) and (b) of the metal plate, which are to be in contact with a sealing resin, where (a) is top faces and (b) is faces that form concavities or through holes between the top faces and bottom faces, can be manufactured with improved productivity owing to reduction in cost and operation time and can retain remarkably high adhesion to the sealing resin while staying the total thickness of the plating layers including the silver plating layer to be thin.

These and other features of the present invention will become apparent from the following detailed description of the preferred embodiments when taken in conjunction with the accompanying drawings.

BRIEF DESCRIPTION OF THE DRAWINGS

FIG. 1A is a plan view and FIG. 1B is an explanatory diagram schematically showing the A-A cross section in FIG. 1A.

FIG. 5A is a plan view and FIG. 5B is an explanatory diagram schematically showing the B-B cross section in FIG. 5A.

FIG. 9A is a top view, FIG. 9B is a bottom view and FIG. 9C is an explanatory diagram schematically showing the C-C cross section in FIG. 9A.

FIG. 13A is a top view, FIG. 13B is a bottom view and FIG. 13C is an explanatory diagram schematically showing the D-D cross section in FIG. 13A.

FIG. 17A is a top view, FIG. 17B is a bottom view and FIG. 17C is an explanatory diagram schematically showing the E-E cross section in FIG. 17A.

FIG. 21A is a top view, FIG. 21B is a bottom view and FIG. 21C is an explanatory diagram schematically showing the F-F cross section in FIG. 21A.

FIG. 25A is a top view, FIG. 25B is a bottom view and FIG. 25C is an explanatory diagram schematically showing the G-G cross section in FIG. 25A.

FIGS. 27A-27H to 27I-27J and FIGS. 27A-27H to 27H2-27J' are explanatory diagrams that show one example and another example of manufacturing procedure for a lead frame for mounting a semiconductor element thereon according to the seventh embodiment mode of the present invention.

FIG. 29A is a top view, FIG. 29B is a bottom view and FIG. 29C is an explanatory diagram schematically showing the H-H cross section in FIG. 29A.

FIGS. 31A-31H to 31I-31J and FIGS. 31A-31H to 31H2-31J' are explanatory diagrams that show one example and another example of manufacturing procedure for a lead frame for mounting a semiconductor element thereon according to the eighth embodiment mode of the present invention.

FIG. 33A is a top view, FIG. 33B is a bottom view and FIG. 33C is an explanatory diagram schematically showing the I-I cross section in FIG. 33A.

FIG. 37A is a top view, FIG. 37B is a bottom view and FIG. 37C is an explanatory diagram schematically showing the J-J cross section in FIG. 37A.

FIG. 40A is a top view, FIG. 40B is a bottom view and FIG. 40C is an explanatory diagram schematically showing the K-K cross section in FIG. 40A.

FIG. 44A is a top view, FIG. 44B is a bottom view and FIG. 44C is an explanatory diagram schematically showing the L-L cross section in FIG. 44A.

FIG. 47A is a top view and FIG. 47B is an explanatory diagram schematically showing the M-M cross section in FIG. 47A.

FIG. 51A is a top view and FIG. 51B is an explanatory diagram schematically showing the N-N cross section in FIG. 51A.

DETAILED DESCRIPTION OF THE EMBODIMENTS

Figure 1A:
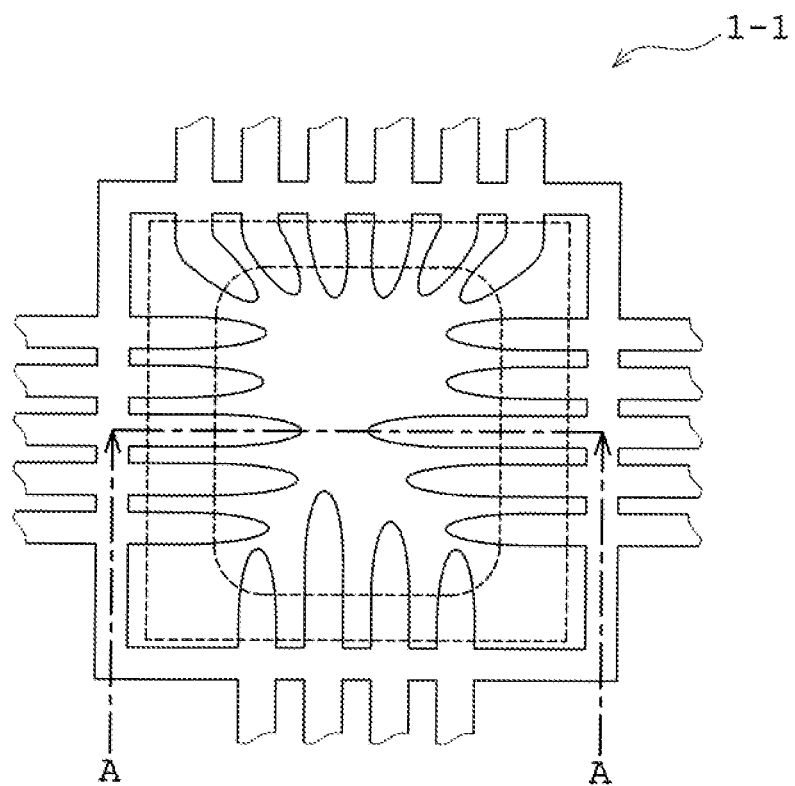
FIGS. 1A-1B are diagrams that show one example of lead frame according to a first embodiment mode of the present invention, where

Preceding the description of the embodiment modes, the background leading to the derivation of the present invention and the operation and effect of the present invention will be described.

Lead Frame as Device for Mounting Semiconductor Element in the Process to Derive Present Invention The present inventors considered that, in order to improve adhesion to a sealing resin and to reduce the total thickness of plating layers while reducing cost and working time for forming a roughened outer surface for improved productivity, it was necessary to form, either directly on the lead frame base or on a undercoat plating layer with a smooth outer surface provided on the lead frame base, a silver plating layer with a roughened outer surface not by roughening the outer surface of a smooth silver plating layer.

Then, in the process of trial and error, the present inventors derived a lead frame in which a roughened silver plating layer with acicular projections formed not by roughening an outer surface of a smooth silver plating layer was provided, as an outermost plating layer, on at least either of (a) and (b) of a metal plate, which would be in contact with a sealing resin, where (a) is top faces and (b) is faces that form concavities or through holes between the top faces and bottom faces.

In the present application, the acicular projections included in the roughened silver plating layer are defined as an aggregate of a plurality of acicular projections having a surface area ratio (here, the ratio of the surface area of the roughened silver plating layer to the surface area of a corresponding smooth surface) of 1.30 or more and 6.00 or less.

It was found that a roughened silver plating layer having acicular projections with such a surface area ratio would make a sealing resin easily flow into the roots of the individual projections of the acicular projections, so that, when the sealing resin is cured, the large contact area and the intricate contour can enhance the physical anchor effect.

Further, as a result of repeated trial and error by the present inventors, it was found that a roughened silver plating layer having acicular projections could be formed by growing a crystal structure in which the proportion of a predetermined crystal direction is high as being different from the crystal structure of a conventional smooth silver plating layer or of a roughened silver plating layer formed by roughening an outer surface of a smooth silver plating layer, and that the roughened surface having the acicular projections formed of well-grown such a crystal structure would be effective in remarkably improving adhesion to the sealing resin compared with a roughened surface formed by the conventional technique. In this way, the following lead frame was derived.

The above-mentioned lead frame includes a lead frame base made of a copper-based material and a roughened silver plating layer having acicular projections, provided as an outermost plating layer and formed on at least either of (a) and (b) of the lead frame base, which are to be in contact with a sealing resin, where (a) is top faces and (b) is faces that form concavities or through holes between the top faces and bottom faces, wherein the roughened silver plating layer has a crystal structure in which the crystal direction <101> occupies a largest proportion among the crystal directions <001>, <111> and <101>.

As in the above-mentioned lead frame, if a roughened silver plating layer has acicular projections having a surface area ratio (i.e. the ratio of the surface area of the roughened silver plating layer to the surface area of a corresponding smooth surface) of 1.30 or more and 6.00 or less, a sealing resin would easily flow into the roots of the individual acicular projections. Therefore, when the sealing resin is cured, the large contact area and the intricate contour can enhance the physical anchor effect, to achieve good adhesion. The directions in which the individual acicular projections extend are not uniform; not only the upward direction and oblique directions but also the shape of bent needles are included. If the individual acicular projections are randomly extended radially, the anchor effect on the sealing resin can be further enhanced.

In addition, as in the above-mentioned lead frame, if a roughened silver plating layer with acicular projections provided as an outermost plating layer on at least either of (a) and (b) of the lead frame base made of a copper-based material, where (a) is top faces and (b) is faces that form concavities or through holes between the top faces and bottom faces, is configured to have a crystal structure in which the crystal direction <101> occupies a largest proportion among the crystal directions <001>, <111> and <101>, such a roughened silver plating layer allows a sealing resin to easily flow into its deeper portions and accordingly exerts higher adhesion to the sealing resin than other roughened silver plating layers such as those having roughened surfaces with a surface area ratio (i.e. the ratio of the surface area of the silver plating layer to the surface area of a smooth surface) of less than 1.30 and those formed by roughening the outer surface of a smooth silver plating layer having the conventional crystal structure, which is different from the crystal structure in which the crystal direction <101> occupies a largest proportion among the crystal directions <001>, <111> and <101>.

Further, in the configuration of the above-mentioned lead frame, at a semiconductor element mounting portion, on which a semiconductor element is to be mounted, and internal connection terminal portions, which are to be electrically connected with the semiconductor element directly or via wires, on the upper surface side, the contact area with the connection member such as solder or paste is increased by the acicular projections of the roughened silver plating layer, whereby seepage of moisture can be prevented, the strain caused by thermal expansion is prevented, and delamination between the connection member and the plating film is prevented.

The roughened silver plating layer having acicular projections with a crystal structure in which the crystal direction <101> occupies a largest proportion among the crystal directions <001>, <111> and <101> in the above-mentioned lead frame can be formed by use of the lead frame base as a base.

Also, in the configuration of the above-mentioned lead frame, since adhesion to the sealing resin can be remarkably improved by the crystal structure of the roughened silver plating layer, in the case where a barrier plating layer is needed to be formed as an undercoat plating layer for preventing copper constituting the material of the lead frame base from diffusing under a high temperature environment, a smooth undercoat plating layer having such a degree of thickness as prevents diffusion of copper in the base serves the purpose; it is not necessary to form an undercoat plating layer with a roughened outer surface.

The roughened silver plating layer having acicular projections with a crystal structure in which the crystal direction <101> occupies a largest proportion among the crystal directions <001>, <111> and <101> can be formed by silver plating under the conditions described later, without roughening the outer surface of a smooth silver plating layer.

Therefore, by employing the above-mentioned lead frame, it is possible to minimize the processing cost of the roughened surface for improved adhesion with a resin, and to minimize the total thickness of the plating layers.

Substrate for Mounting Semiconductor Element as Device for Mounting Semiconductor Element in the Process to Derive Present Invention (Part 1)

Regarding a substrate for mounting a semiconductor element thereon having columnar terminal portions defined by concavities formed on the upper surface of a metal plate made of a copper-based material, the present inventors considered, as a measure for improving adhesion between the columnar terminal portions and a resin, the configuration in which an undercoat plating layer on the top faces of the columnar terminal portions is formed with its outer surface made as a roughened surface and thereon a noble metal plating layer is laminated as following the shape of the roughened surface. However, in order to form the roughened outer surface of the undercoat plating layer to have such unevenness as to maintain high adhesion to the resin even if the noble metal plating layer is laminated thereon, the undercoat plating layer has to be formed thick. Moreover, since the plating rate for forming an undercoat plating layer with a roughened surface is slow, the working time increases to raise the cost and lower the productivity.

Also, the present inventors considered, as another measure for improving adhesion to the resin, the configuration in which a noble metal plating layer is processed, after being formed on the top faces of the columnar terminal portions as having a smooth outer surface, to have its outer surface roughened. However, in order to form the outer surface of the noble metal plating layer to be a roughened surface having such uneven shape as to improve adhesion to the resin, the smooth noble metal plating layer before roughening treatment should be formed thick, and thus the cost of noble metal plating layer would increase, to lower the productivity.

Next, the present inventors considered that, in order to improve adhesion to the sealing resin and to reduce the total thickness of plating layers while reducing the cost and working time for forming a roughened outer surface for improved productivity, it was necessary to form, either directly on the top faces of the columnar terminal portions or on an undercoat plating layer with a smooth outer surface formed on the top faces of the columnar terminal portions, a silver plating layer with a roughened outer surface not by roughening the outer surface of a smooth silver plating layer.

Then, in the process of trial and error, the present inventors derived a substrate for mounting a semiconductor element thereon in which a roughened silver plating layer with acicular projections formed not by roughening the outer surface of a smooth silver plating layer was provided as the outermost plating layer covering the top faces of the columnar terminal portions.

In the type of substrate for mounting a semiconductor element thereon having columnar terminal portions defined by concavities formed on the upper surface of a metal plate, acicular projections included in the roughened silver plating layer are defined as an aggregate of a plurality of acicular projections having a surface area ratio (here, the ratio of the surface area of the roughened silver plating layer to the surface area of a smooth surface) of 1.30 or more and 6.00 or less.

It was found that a roughened silver plating layer having acicular projections with such a surface area ratio would make a sealing resin easily flow into the roots of the individual acicular projections, so that, when the sealing resin be cured, the large contact area and the intricate contour could enhance the physical anchor effect.

Further, as a result of repeated trial and error by the present inventors, it was found that a roughened silver plating layer having acicular projections could be formed by growing a crystal structure in which the proportion of a predetermined crystal direction is high as being different from a crystal structure of a conventional smooth silver plating layer or of a roughened silver plating layer formed by roughening the outer surface of a smooth silver plating layer, and that the roughened surface having the acicular projections formed of well-grown such a crystal structure would be effective in remarkably improving adhesion to sealing resin compared with a roughened surface formed by the conventional technique. In this way, the following substrate for mounting a semiconductor element thereon was derived.

The above-mentioned substrate for mounting a semiconductor element thereon has columnar terminal portions defined by concavities formed on the upper surface of a metal plate made of a copper-based material, wherein top faces of the columnar terminal portions are provided with, as an outermost plating layer, a roughened silver plating layer having acicular projections, and the roughened silver plating layer has a crystal structure in which the crystal direction <101> occupies a largest proportion among the crystal directions <001>, <111> and <101>.

As in the above-mentioned substrate for mounting a semiconductor element thereon, if the roughened silver plating layer has acicular projections having a surface area ratio of 1.30 or more and 6.00 or less (i.e. the ratio of the surface area of the roughened silver plating layer to the surface area of a corresponding smooth surface), a sealing resin would easily flow into the roots of the individual acicular projections. Therefore, when the sealing resin is cured, the large contact area and the intricate contour can enhance the physical anchor effect, to achieve good adhesion. The directions in which the individual acicular projections extend are not uniform; not only the upward direction and oblique directions but also the shape of bent needles are included. If the individual acicular projections are randomly extended radially, the anchor effect on the sealing resin can be further enhanced.

In addition, as in the above-mentioned substrate for mounting a semiconductor element thereon, if the roughened silver plating layer with acicular projections provided as an outermost plating layer on the top faces of the columnar terminal portions is configured to have a crystal structure in which the crystal direction <101> occupies a largest proportion among the crystal directions <001>, <111> and <101>, such a roughened silver plating layer allows a sealing resin to easily flow into its deeper portions and accordingly exerts higher adhesion to the sealing resin than other roughened silver plating layers such as those having roughened surfaces with a surface area ratio (i.e. the ratio of the surface area of the silver plating layer to the surface area of the corresponding smooth surface) of less than 1.30 and those formed by roughening the outer surface of a smooth silver plating layer having the conventional crystal structure, which is different from the crystal structure in which the crystal direction <101> occupies a largest proportion among the crystal directions <001>, <111> and <101>.

Also, in the configuration of the above-mentioned substrate for mounting a semiconductor element thereon, at the semiconductor element mounting portion, on which a semiconductor element is to be mounted, and at internal connection terminal portions, which are to be electrically connected with the semiconductor element directly or via wires, on the upper surface side of the columnar terminal portions, the contact area with a connection member such as solder or paste is increased by the acicular projections of the roughened silver plating layer, whereby seepage of moisture can be prevented, the strain caused by thermal expansion is prevented, and delamination between the connection member and the plating film is prevented.

The roughened silver plating layer having acicular projections with a crystal structure in which the crystal direction <101> occupies a largest proportion among the crystal directions <001>, <111> and <101> of the above-mentioned substrate for mounting a semiconductor element thereon can be formed by use of sites corresponding to the columnar terminal portions on the upper surface of the metal plate, which serves as a base of the substrate for mounting a semiconductor element thereon, as a plating base.

Also, in the configuration of the above-mentioned substrate for mounting a semiconductor element thereon, since adhesion to the sealing resin can be remarkably improved by the crystal structure of the roughened silver plating layer, in the case where a barrier plating layer is needed to be formed as an undercoat plating layer for preventing copper constituting the material of the columnar terminal portions from diffusing under a high temperature environment, a smooth undercoat plating layer having such a degree of thickness as prevents diffusion of copper in the base serves the purpose; it is not necessary to form an undercoat plating layer with a roughened outer surface.

The roughened silver plating layer having acicular projections with a crystal structure in which the crystal direction <101> occupies a largest proportion among the crystal directions <001>, <111> and <101> can be formed by silver plating under the conditions described later, without roughening the outer surface of a smooth silver plating layer.

Therefore, by employing the above-mentioned substrate for mounting a semiconductor element thereon, it is possible to minimize the processing cost of the roughened surface for improved adhesion with resin, and to minimize the total thickness of the plating layers.

Substrate for Mounting Semiconductor Element as Device for Mounting Semiconductor Element in the Process to Derive Present Invention (Part 2)

Regarding the substrate for mounting a semiconductor element thereon provided with columnar terminal portions composed only of plating layers, the present inventors considered, as a measure for improving adhesion between a resin and the columnar terminal portions composed only of plating layers, which are used as terminals in a semiconductor package or the like, the configuration in which an undercoat plating layer for top faces of the columnar terminal portions is formed with its outer surface made as a roughened surface and thereon a noble metal plating layer is laminated as following the shape of the roughened surface. However, in order to give the roughened outer surface of the undercoat plating layer such a degree of unevenness as to maintain high adhesion between the resin and the noble metal plating layer to be laminated thereon, the undercoat plating layer has to be formed thick. Moreover, since the plating rate for forming an undercoat plating layer with a roughened surface is slow, the working time increases to raise the cost and lower the productivity.

Also, the present inventors considered, as another measure for improving adhesion to the resin, the configuration in which a noble metal plating layer is processed, after being formed on the top faces of the columnar terminal portions as having a smooth outer surface, to have its outer surface roughened. However, in order to form the outer surface of the noble metal plating layer to be a roughened surface having such uneven shape as to improve adhesion to the resin, the smooth noble metal plating layer before roughening treatment should be formed thick, and thus the cost of noble metal plating layer would increase, to lower the productivity.

Next, the present inventors considered that, in order to improve adhesion to the sealing resin and to reduce the total thickness of plating layers while reducing the cost and working time for forming a roughened outer surface for improved productivity, it was necessary, regarding the configuration of columnar terminal portions provided on a metal plate, to laminate an undercoat plating layer to be smooth and thereon to form a silver plating layer with a roughened outer surface not by roughening the outer surface of a smooth silver plating layer.

Then, in the process of trial and error, the present inventors derived a substrate for mounting a semiconductor element thereon in which, regarding the configuration of columnar terminal portions composed only of plating layers and provided on a metal plate, a roughened silver plating layer with acicular projections formed not by roughening an outer surface of a smooth silver plating layer is formed as an outermost plating layer on the upper surface side of the undercoat plating layer.

In the type of substrate for mounting a semiconductor element thereon of the present application provided with columnar terminal portions composed only of plating layers, the acicular projections included in the roughened silver plating layer are defined as an aggregate of a plurality of acicular projections having a surface area ratio (i.e, the ratio of the surface area of the roughened silver plating layer to the surface area of a corresponding smooth surface) of 1.30 or more and 6.00 or less.

It was found that a roughened silver plating layer having acicular projections with such a surface area ratio would make sealing resin easily flow into the roots of the individual acicular projections, so that, when the sealing resin be cured, the large contact area and the intricate contour could enhance the physical anchor effect to achieve good adhesion.

Further, as a result of repeated trial and error by the present inventors, it was found that a roughened silver plating layer having acicular projections could be formed by growing a crystal structure in which the proportion of a predetermined crystal direction is high as being different from a crystal structure of a conventional smooth silver plating layer or of a roughened silver plating layer formed by roughening the outer surface of a smooth silver plating layer, and that a roughened surface having acicular projections formed of well-grown such a crystal structure would be effective in remarkably improving adhesion to a sealing resin compared with a roughened surface formed by the conventional technique. In this way, the following substrate for mounting a semiconductor element thereon was derived.

The above-mentioned substrate for mounting a semiconductor element thereon includes a metal plate and columnar terminal portions composed only of plating layers and formed on an upper surface of the metal plate, wherein the columnar terminal portions include, as an outermost plating layer, a roughened silver plating layer having acicular projections, and the roughened silver plating layer has a crystal structure in which the crystal direction <101> occupies a largest proportion among the crystal directions <001>, <111> and <101>.

As in the above-mentioned substrate for mounting a semiconductor element thereon, if the roughened silver plating layer has acicular projections having a surface area ratio of 1.30 or more and 6.00 or less (i.e. the ratio of the surface area of the roughened silver plating layer to the surface area of a corresponding smooth surface), the sealing resin would easily flow into the roots of the individual acicular projections. Therefore, when the sealing resin is cured, the large contact area and the intricate contour can enhance the physical anchor effect, to achieve good adhesion. The directions in which the individual acicular projections extend are not uniform; not only the upward direction and oblique directions but also the shape of bent needles are included. If the individual acicular projections are randomly extended radially, the anchor effect on the sealing resin can be further enhanced.

Further, as in the above-mentioned substrate for mounting a semiconductor element thereon, if a roughened silver plating layer with acicular projections provided as an outermost plating layer on the upper surface of the undercoat plating layer in the columnar terminal portions is configured to have a crystal structure in which the crystal direction <101> occupies a largest proportion among the crystal directions <001>, <111> and <101>, such a roughened silver plating layer allows a sealing resin to easily flow into its deeper portions and accordingly exerts higher adhesion to the sealing resin than other roughened silver plating layers such as those having roughened surfaces with a surface area ratio (i.e. the ratio of the surface area of the silver plating layer to the surface area of a corresponding smooth surface) of less than 1.30 and those formed by roughening the outer surface of a smooth silver plating layer having the conventional crystal structure, which is different from the crystal structure in which the crystal direction <101> occupies a largest proportion among the crystal directions <001>, <111> and <101>.

Also, if the configuration is made as in the above-mentioned substrate for mounting a semiconductor element thereon, at the semiconductor element mounting portion, on which a semiconductor element is to be mounted, and at internal connection terminal portions, which are to be electrically connected with the semiconductor element directly or via wires, on the upper surface side of the columnar terminal portions, the contact area with the connection member such as solder or paste is increased by the acicular projections of the roughened silver plating layer, whereby seepage of moisture can be prevented, the strain caused by thermal expansion is prevented, and delamination between the connection member and the plating film is prevented.

Also, if the configuration is made as in the above-mentioned substrate for mounting a semiconductor element thereon, since adhesion to the sealing resin can be remarkably improved by the crystal structure of the roughened silver plating layer having acicular projections, a thin and smooth undercoat plating layer formed at the columnar terminal portions serves the purpose; it is not necessary to form an undercoat plating layer with a roughened surface.

The roughened silver plating layer having acicular projections with a crystal structure in which the crystal direction <101> occupies a largest proportion among the crystal directions <001>, <111> and <101> can be formed by silver plating under the conditions described later, without roughening the surface of a smooth silver plating layer.

Therefore, by employing the above-mentioned substrate for mounting a semiconductor element thereon, it is possible to minimize the processing cost of the roughened surface for improved adhesion with resin, and to minimize the total thickness of the plating layers.

Improvements to Lead Frames and Substrates for Mounting Semiconductor Elements as Devices for Mounting Semiconductor Elements in the Process to Derive Present Invention Further, as a result of repeated trial and error in relation to these devices for mounting semiconductor elements configured as lead frames and substrates for mounting semiconductor elements by the present inventors, it has been found that the remarkably high adhesion to the sealing resin could be retained by reinforcing the acicular projections in the roughened silver plating layer. In this way, the present invention has been derived.

A device for mounting a semiconductor element thereon of embodiment modes of the present invention includes a metal plate serving as a base, a roughened silver plating layer having acicular projections formed on at least either of (a) and (b) of the metal plate, where (a) is top faces and (b) is faces that form concavities or through holes between the top faces and bottom faces, and a reinforcing plating layer that covers, as an outermost plating layer, an outer surface of the acicular projections in the roughened silver plating layer, wherein the roughened silver plating layer has a crystal structure in which the crystal direction <101> occupies a largest proportion among the crystal directions <001>, <111> and <101>, and wherein an outer surface of the reinforcing plating layer is shaped to have acicular projections with a surface area ratio of 1.30 or more and 6.00 or less to a surface area of a smooth surface, as inheriting the acicular projections of the roughened silver plating layer.

Further, as in the device for mounting a semiconductor element thereon of the embodiment modes of the present invention, if the configuration is made so that a reinforcing plating layer is provided as an outermost plating layer covering an outer surface of the acicular projections in the roughened silver plating layer, that the roughened silver plating layer has a crystal structure in which the crystal direction <101> occupies a largest proportion among the crystal directions <001>, <111> and <101>, and that an outer surface of the reinforcing plating layer is shaped to have acicular projections with a surface area ratio of 1.30 or more and 6.00 or less to a surface area of a smooth surface as inheriting the acicular projections of the roughened silver plating layer, the strength of the acicular projections in the roughened silver plating layer is reinforced by the reinforcing plating layer and thus breakage does not easily occur.

Therefore, the configuration as in the device for mounting a semiconductor element thereon of the embodiment modes of the present invention can prevent decrease in adhesion to the resin owing to breakage of the acicular projections in the roughened silver plating layer, thereby retaining a remarkably high adhesion to the sealing resin.

In the device for mounting a semiconductor element thereon of the embodiment modes of the present invention, the reinforcing plating layer covering the outer surface of the acicular projections of the roughened silver plating layer should have such a degree of thickness as to retain a surface area ratio of 1.30 or more and 6.00 or less to the surface area of the corresponding smooth surface inheriting the acicular projections of the roughened silver plating layer as well as to retain a sufficient strength not to cause peeling breakage of the acicular projections.

If composed of a silver plating layer, the reinforcing plating layer preferably has a thickness of 0.4 μm or more and 4.0 μm or less, much preferably 1.0 μm. If composed of a nickel plating layer, the reinforcing plating layer preferably has a thickness of 0.4 μm or more and 4.0 μm or less, much preferably 1.0 μm.

If the thickness of the reinforcing plating layer having such a plating layer composition is less than 0.4 μm, peeling breakage is likely to occur. On the other hand, if it exceeds 4.0 μm, the surface area ratio of the outer surface of the reinforcing plating layer to the surface area of the smooth surface falls below 1.30.

In the case where a nickel plating layer forms the reinforcing plating layer, a palladium plating layer and a gold plating layer are laminated on the nickel plating layer in this order.

The thickness of the palladium plating layer preferably is 0.005 μm or more and 0.1 μm or less, much preferably 0.01 μm. The thickness of the gold plating layer preferably is 0.0005 μm or more and 0.01 μm or less, much preferably 0.001 μm. Within these ranges of thickness, even if the palladium plating layer and the gold plating layer are laminated, the surface area ratio of the outer surface of the reinforcing plating layer to the surface area of a smooth surface can be kept within the range of 1.30 or more and 6.00 or less.

In the case where the reinforcing plating layer is configured of a nickel plating layer, a palladium plating layer and a gold plating layer laminated in this order, the upper limit of the total thickness of the reinforcing plating layer is 4.0 μm, also.

Further, in the device for mounting a semiconductor element thereon of the embodiment modes of the present invention, preferably, the average diameter of crystal grains in the roughened silver plating layer is smaller than 0.28 μm.

If the average diameter of crystal grains in the roughened silver plating layer is 0.28 μm or greater, after crystals for silver plating grow in the height direction, spaces between the crystals come to be wide and thus the surface area ratio (i.e. the ratio of the surface area of the roughened silver plating layer to the surface area of the corresponding smooth surface) fails to be within the range of 1.30 to 6.00.

If the average diameter of crystal grains in the roughened silver plating layer is smaller than 0.28 μm, after crystals for silver plating grow in the height direction, spaces between the crystals comes to be narrow and thus the surface area ratio (i.e. the ratio of the surface area of the roughened silver plating layer to the surface area of the corresponding smooth surface) can be within the range of 1.30 to 6.00. Much preferably, the roughened silver plating layer has crystal grains with an average diameter of 0.15 μm or more and 0.25 μm or less.

In the device for mounting a semiconductor element thereon of the embodiment modes of the present invention, an undercoat plating layer may be provided between the metal plate serving as a base and the roughened silver plating layer.

The roughened silver plating layer having acicular projections with a crystal structure in which the crystal direction <101> occupies a largest proportion among the crystal directions <001>, <111> and <101> in the device for mounting a semiconductor element thereon of the embodiment modes of the present invention can be obtained by plating upon use of a silver plating bath having a silver concentration of 1.0 g/L to 10 g/L, which is a methanesulfonic acid-based silver plating solution, for 5 to 60 seconds at a temperature of 55° C. to 65° C. and a current density of 3 A/dm$^2$ to 20 A/dm$^2$.

Lead Frame as Device for Mounting Semiconductor Element According to Some of the Embodiment Modes of the Present Invention A device for mounting a semiconductor element thereon of some of the embodiment modes of the present invention is configured as a lead frame, and a metal plate serving as a base is a lead frame base made of a copper-based material.

In the lead frame of some of the embodiment modes of the present invention, an undercoat plating layer may be provided between the lead frame base and the roughened silver plating layer.

It is preferable that the shape of the acicular projections included in the roughened silver plating layer in the lead frame of the embodiment modes of the present invention is determined only by the roughened silver plating layer itself without being affected by the surface shape of the base thereunder. The surface state of the base may be smooth or roughened. In consideration of costs such as productivity, it is preferable that the base is prepared only by activation treatment on the surface of the lead frame base, on which a roughened silver plating layer is to be formed. In the case where the influence of diffusion of copper, which forms the material of the lead frame base, under a high temperature environment should be taken into consideration, it is preferable to provide a smooth undercoat plating layer as a barrier plating layer between the lead frame base and the roughened silver plating layer. In this case, since it suffices to form the plating layer thinly and smoothly to a thickness as to prevent diffusion of the base copper, a thin undercoat layer is preferable.

According to the lead frame of some of the embodiment modes of the present invention, in the case where silver plating layers including a roughened silver plating layer are directly formed on at least either of (a) and (b) of the lead frame base, where (a) is top faces and (b) is faces that form concavities or through holes between the top faces and bottom faces, without an undercoat plating layer between, it is preferable to form, on at least either of (a) and (b) of the lead frame base, a silver strike plating layer with a thickness of 0.2 μm or more and 3.0 μm or less, much preferably 1.5 μm, and thereon to laminate a roughened silver plating layer having acicular projections at its outer surface with a thickness of 0.2 μm or more and 3.0 μm or less, much preferably 0.5 μm.

In the case where a nickel plating layer is provided as the undercoat barrier plating layer, it is preferable that the thickness of the nickel plating layer provided on at least either of (a) and (b) of the lead frame base, where (a) is top faces and (b) is faces that form concavities or through holes between the top faces and bottom faces, is 0.3 μm or more and 3.0 μm or less. To be specific, it is preferable to form, on at least either of (a) and (b) of the lead frame base, a nickel plating layer with a thickness of 0.3 μm or more and 3.0 μm or less, preferably 1.0 μm, and thereon to laminate a roughened silver plating layer having acicular projections at its outer surface with a thickness of 0.2 μm or more and 3.0 μm or less, much preferably 0.5 μm.

In the case where a palladium plating layer is provided between the undercoat nickel plating layer and the roughened silver plating layer, the thickness of the palladium plating layer is preferably 0.005 μm or more and 0.1 μm or less. To be specific, it is preferable to form a palladium plating layer with a thickness of 0.005 μm or more and 0.1 μm or less, much preferably 0.01 μm, on the nickel plating layer formed on (a) and (b) of the lead frame base, where (a) is top faces and (b) is faces that form concavities or through holes between the top faces and bottom faces.

In the case where a gold plating layer is provided between the two undercoat plating layers, which are composed of the nickel plating layer and the palladium plating layer, and the roughened silver plating layer, the thickness of the gold plating layer is preferably 0.0005 μm or more and 0.01 μm or less. To be specific, it is preferable to form a gold plating layer of 0.0005 μm or more and 0.01 μm or less, much preferably 0.001 μm on the nickel plating layer and the palladium plating layer formed on (a) and (b) of the lead frame base, where (a) is top faces and (b) is faces that form concavities or through holes between the top faces and bottom faces In these cases, a silver flash layer with a thickness of 0.4 μm or more and 4.0 μm or less, preferably 1.0 μm is formed as a reinforcing plating layer covering the outer surface of the acicular projections in the roughened silver plating layer.

As a reinforcing plating player covering the outer surface of acicular projections of the roughened silver plating layer, a three-layer plating layer composed of a nickel plating layer with a thickness of 0.4 μm or more and 4.0 μm or less, preferably 1.0 μm, a palladium plating layer with a thickness of 0.005 μm or more and 0.1 μm or less, preferably 0.01 μm, and a gold plating layer with a thickness of 0.0005 μm or more and 0.01 μm or less, preferably 0.001 μm may be laminated in place of the silver flash layer. In the case where the reinforcing plating layer is configured of a nickel plating layer, a palladium plating layer and a gold plating layer laminated in this order, the upper limit of the total thickness of the reinforcing plating layer is 4.0 μm.

Substrate for Mounding Semiconductor Element as Device for Mounting Semiconductor Element According to Another Some of the Embodiment Modes of the Present Invention (Part 1)

A substrate for mounting a semiconductor element thereon of another some of the embodiment modes of the present invention includes a metal plate made of a copper-based material having columnar terminal portions defined by concavities formed on the upper surface thereof, a roughened silver plating layer having acicular projections and formed on top faces of the columnar terminal portions, and a reinforcing plating layer that covers, as an outermost plating layer, an outer surface of the acicular projections of the roughened silver plating layer, wherein the roughened silver plating layer has a crystal structure in which the crystal direction <101> occupies a largest proportion among the crystal directions <001>, <111> and <101>, and an outer surface of the reinforcing plating layer is shaped to have acicular projections with a surface area ratio of 1.30 or more and 6.00 or less to a surface area of a smooth surface, as inheriting the acicular projections of the roughened silver plating layer.

In the substrate for mounting a semiconductor element thereon of these another some of the embodiment modes of the present invention, an undercoat plating layer may be provided between the top faces of columnar terminal portions and the roughened silver plating layer.

It is preferable that the shape of the acicular projections included in the roughened silver plating layer in the substrate for mounting a semiconductor element thereon of these another some of the embodiment modes of the present invention is determined only by the roughened silver plating layer itself without being affected by the surface morphology of the base thereunder. The surface morphology of the base may be smooth or roughened. In consideration of costs such as productivity, it is preferable that the base is prepared only by activation treatment, in the upper surface of the metal plate, at the sites corresponding to the columnar terminal portions on which a roughened silver plating layer is to be formed. In the case where the influence of diffusion of copper, which forms the material of the columnar terminal portions as a base, under a high temperature environment should be taken into consideration, it is preferable to provide a smooth undercoat plating layer as a barrier plating layer between the columnar terminal portions and the roughened silver plating layer. In this case, since it suffices to form the plating layer thinly and smoothly to a thickness as to prevent diffusion of the base copper, a thin undercoat plating layer is preferable.

According to the substrate for mounting a semiconductor element thereon of these another some of the embodiment modes of the present invention, in the case where silver plating layers including the roughened silver plating layer are directly formed on the top faces of the columnar terminal portions without an undercoat plating layer between, it is preferable to form, on the outer surface of the sites corresponding to the columnar terminal portions on the upper surface of the metal plate, a silver strike plating layer with a thickness of 0.2 μm or more and 3.0 μm or less, much preferably 1.5 μm, and thereon to laminate a roughened silver plating layer having acicular projections at its outer surface and having a thickness of 0.2 μm or more and 3.0 μm or less, much preferably 0.5 μm.

In the case where a nickel plating layer is provided as an undercoat barrier plating layer, it is preferable that the thickness of the nickel plating layer on the top faces of the columnar terminal portions is 0.3 μm or more and 3.0 μm or less. To be specific, it is preferable to form, on the outer surface of the sites corresponding to the columnar terminal portions on the upper surface of the metal plate, a nickel plating layer with a thickness of 0.3 μm or more and 3.0 μm or less, much preferably 1.0 μm, and thereon to laminate a roughened silver plating layer having acicular projections at its outer surface and having a thickness of 0.2 μm or more and 3.0 μm or less, much preferably 0.5 μm.

In the case where a palladium plating layer is provided between the undercoat nickel plating layer and the roughened silver plating layer, the thickness of the palladium plating layer is preferably 0.005 μm or more and 0.1 μm or less. To be specific, it is preferable to form a palladium plating layer with a thickness of 0.005 μm or more and 0.1 μm or less, much preferably 0.01 μm, on the nickel plating layer formed on the outer surface of the sites corresponding to the columnar terminal portions on the upper surface of the metal plate.

In the case where a gold plating layer is provided between the two-layer structure of nickel and palladium undercoat plating layers and the roughened silver plating layer, the thickness of the gold plating layer is preferably 0.0005 μm or more and 0.01 μm or less. To be specific, it is preferable to form a gold plating layer of 0.0005 μm or more and 0.01 μm or less, much preferably 0.001 μm on the nickel and palladium plating layers formed on the outer surface of the sites corresponding to the columnar terminal portions on the upper surface of the metal plate.

In these cases, a silver flash layer with a thickness of 0.4 μm or more and 4.0 μm or less, much preferably 1.0 μm is formed as a reinforcing plating layer covering the outer surface of the acicular projections of the roughened silver plating layer.

As a reinforcing plating player covering the outer surface of acicular projections of the roughened silver plating layer, a three-layer plating layer composed of a nickel plating layer with a thickness of 0.4 μm or more and 4.0 μm or less, preferably 1.0 μm, a palladium plating layer with a thickness of 0.005 μm or more and 0.1 μm or less, preferably 0.01 μm, and a gold plating layer with a thickness of 0.0005 μm or more and 0.01 μm or less, preferably 0.001 μm may be laminated in place of the silver flash layer. In the case where the reinforcing plating layer is configured of a nickel plating layer, a palladium plating layer and a gold plating layer laminated in this order, the upper limit of the total thickness of the reinforcing plating layer is 4.0 μm.

Substrate for Mounding Semiconductor Element as Device for Mounting Semiconductor Element According to Still Another Some of the Embodiment Modes of the Present Invention (Part 2)

A substrate for mounting a semiconductor element thereon of still another some of the Embodiment modes of the present invention includes a metal plate and columnar terminal portions composed only of plating layers and formed on an upper surface of the metal plate, wherein the columnar terminal portions include a roughened silver plating layer having acicular projections and a reinforcing plating layer that covers, as an outermost plating layer, an outer surface of the acicular projections of the roughened silver plating layer, wherein the roughened silver plating layer has a crystal structure in which the crystal direction <101> occupies a largest proportion among the crystal directions <001>, <111> and <101>, and an outer surface of the reinforcing plating layer is shaped to have acicular projections with a surface area ratio of 1.30 or more and 6.00 or less to a surface area of a smooth surface, as inheriting the acicular projections of the roughened silver plating layer.

Also, in the substrate for mounting a semiconductor element thereon of these still another some of the embodiment modes of the present invention, the configuration is preferably made so that a plating layer that is in contact with the metal plate in the columnar terminal portions is a gold plating layer.

Also, in the substrate for mounting a semiconductor element thereon of these still another some of the embodiment modes of the present invention, plating layers beneath the reinforcing plating layer in the columnar terminal portions preferably are configured to be composed of plating layers of metals laminated in order of appearance in any of the following (1) to (6) from the metal plate side:

(1) gold/nickel/silver
(2) gold/palladium/nickel/silver
(3) gold/palladium/nickel/palladium/silver
(4) gold/nickel/palladium/silver
(5) gold/nickel/palladium/gold/silver
(6) gold/palladium/nickel/palladium/gold/silver.

In the case where the plating layers beneath the reinforcing plating layer in the columnar terminal portions are composed of plating layers made of metals laminated in the order of gold/nickel/silver, it is preferable that, on one-side surface of the metal plate at sites corresponding to the columnar terminal portions, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a roughened silver plating layer with acicular projections with a thickness of 0.2 μm or more and 3.0 μm or less, much preferably 0.5 μm.

In the case where the plating layers beneath the reinforcing plating layer in the columnar terminal portions are composed of plating layers made of metals laminated in the order of gold/palladium/nickel/silver, it is preferable that, on one-side surface of the metal plate at sites corresponding to the columnar terminal portions, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a roughened silver plating layer with acicular projections with a thickness of 0.2 μm or more and 3.0 μm or less, much preferably 0.5 μm.

In the case where the plating layers beneath the reinforcing plating layer in the columnar terminal portions are composed of plating layers made of metals laminated in the order of gold/palladium/nickel/palladium/silver, it is preferable that, on one-side surface of the metal plate at sites corresponding to the columnar terminal portions, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a roughened silver plating layer with acicular projections with a thickness of 0.2 μm or more and 3.0 μm or less, much preferably 0.5 μm.

In the case where the plating layers beneath the reinforcing plating layer in the columnar terminal portions are composed of plating layers made of metals laminated in the order of gold/nickel/palladium/silver, it is preferable that, on one-side surface of the metal plate at sites corresponding to the columnar terminal portions, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 µm or more and 1.5 µm or less, much preferably 0.05 µm, on which formed is a roughened silver plating layer with acicular projections with a thickness of 0.2 µm or more and 3.0 µm or less, much preferably 0.5 µm.

In the case where the plating layers beneath the reinforcing plating layer in the columnar terminal portions are composed of plating layers made of metals laminated in the order of gold/nickel/palladium/gold/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a gold plating layer with a thickness of 0.0005 µm or more and 0.5 µm or less, much preferably 0.005 µm, on which formed is a roughened silver plating layer with acicular projections with a thickness of 0.2 µm or more and 3.0 µm or less, much preferably 0.5 µm.

In the case where the plating layers beneath the columnar terminal portions are composed of plating layers made of metals laminated in the order of gold/palladium/nickel/palladium/gold/silver, it is preferable that, on one-side surface of the metal plate at sites corresponding to the columnar terminal portions, there is formed a gold plating layer with a thickness of 0.005 µm or more and 0.5 µm or less, much preferably 0.05 µm, on which formed is a palladium plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a gold plating layer with a thickness of 0.0005 µm or more and 0.5 µm or less, much preferably 0.005 µm, on which formed is a roughened silver plating layer with acicular projections with a thickness of 0.2 µm or more and 3.0 µm or less, much preferably 0.5 µm.

In these cases, a silver flash layer with a thickness of 0.4 µm or more and 4.0 µm or less, preferably 1.0 µm is formed as a reinforcing plating layer covering the outer surface of the acicular projections in the roughened silver plating layer.

As a reinforcing plating player covering the outer surface of acicular projections of the roughened silver plating layer, a three-layer plating layer composed of a nickel plating layer with a thickness of 0.4 µm or more and 4.0 µm or less, preferably 1.0 µm, a palladium plating layer with a thickness of 0.005 µm or more and 0.1 µm or less, preferably 0.01 µm, and a gold plating layer with a thickness of 0.0005 µm or more and 0.01 µm or less, preferably 0.001 µm may be laminated in place of the silver flash layer. In the case where the reinforcing plating layer is configured of a nickel plating layer, a palladium plating layer and a gold plating layer laminated in this order, the upper limit of the total thickness of the reinforcing plating layer is 4.0 µm.

Also, in the substrate for mounting a semiconductor element thereon of the still another some of the embodiment modes of the present invention, stainless steel-based alloys can also be adopted as a material of the metal plate, in addition to copper-based materials such as copper alloys.

In the substrate for mounting a semiconductor element thereon of these still another some of the embodiment modes of the present invention, in the case where the material of the metal plate is a stainless steel-based alloy, the plating layers beneath the reinforcing plating layer in the columnar terminal portions are composed of plating layers made of metals laminated in the order of gold/nickel/palladium/silver. In this case, it is preferable that, on the upper surface of the metal plate at sites corresponding to the columnar terminal portions, there is formed a gold plating layer with a thickness of 0.005 µm or more and 0.5 µm or less, much preferably 0.05 µm, on which formed is a smooth-crystal nickel plating layer with a thickness of 20.0 µm or more and 80.0 µm or less, much preferably 30.0 µm, on which formed is a palladium plating layer with a thickness of 0.005 µm or more and 1.5 µm or less, much preferably 0.05 µm, on which formed is a roughened silver plating layer with acicular projections with a thickness of 0.2 µm or more and 3.0 µm or less, much preferably 0.5 µm.

In this case, a silver flash layer with a thickness of 0.4 µm or more and 4.0 µm or less, preferably 1.0 µm is formed as a reinforcing plating layer covering the outer surface of the acicular projections in the roughened silver plating layer.

As a reinforcing plating player covering the outer surface of acicular projections of the roughened silver plating layer, a three-layer plating layer composed of a nickel plating layer with a thickness of 0.4 µm or more and 4.0 µm or less, preferably 1.0 µm, a palladium plating layer with a thickness of 0.005 µm or more and 0.1 µm or less, preferably 0.01 µm, and a gold plating layer with a thickness of 0.0005 µm or more and 0.01 µm or less, preferably 0.001 µm may be laminated in place of the silver flash layer. In the case where the reinforcing plating layer is configured of a nickel plating layer, a palladium plating layer and a gold plating layer laminated in this order, the upper limit of the total thickness of the reinforcing plating layer is 4.0 µm.

Therefore, according to the embodiment modes of the present invention, a device for mounting a semiconductor element, such as a lead frame or a substrate for mounting a semiconductor element, provided with silver plating on at least either of the following (a) and (b) of the metal plate, which are to be in contact with a sealing resin, where (a) is top faces and (b) is faces that form concavities or through holes between the top faces and bottom faces, can be manufactured with improved productivity owing to reduction in cost and operation time and can retain remarkably high adhesion to the sealing resin while staying the total thickness of the plating layers including the silver plating layer to be thin.

Hereinafter, substrates for mounting semiconductor elements thereon to which the embodiment modes of the present invention are applied and a manufacturing method therefor will be described. The present invention is not limited to the following detailed description unless otherwise specifically limited.

First Embodiment Mode

Figure 1B:
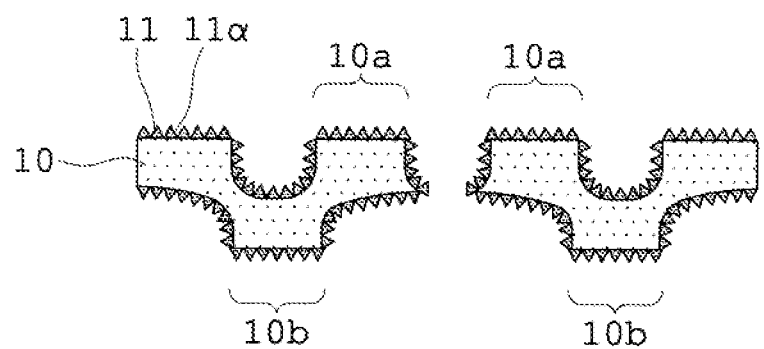
Figure 2:
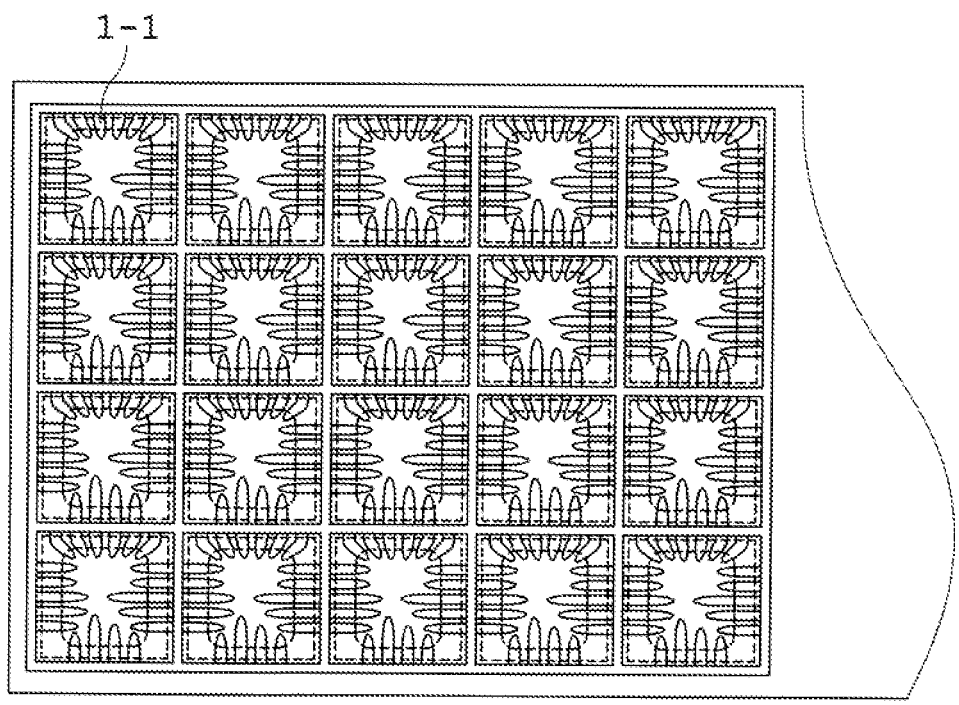
FIG. 2 is a plan view that shows one example of lead frames arrayed in multiple rows according to the first embodiment mode of the present invention.

FIGS. 1A-1B are diagrams that show one example of a lead frame according to a first embodiment mode of the present invention, where FIG. 1A is a plan view and FIG. 1B is an explanatory diagram schematically showing the A-A cross section in FIG. 1A. FIG. 2 is a plan view that shows one example of lead frames arrayed in multiple rows according to the first embodiment mode of the present invention. FIGS. 3A-3F are explanatory diagrams that show one example of manufacturing procedure for a lead frame for mounting a semiconductor element thereon according to the first embodiment mode of the present invention. FIGS.

4A-4E are explanatory diagrams that show one example of manufacturing procedure for a semiconductor package using the lead frame for mounting a semiconductor element thereon according to the first embodiment mode of the present invention.

As shown in FIG. 1A, a lead frame 1-1 of this embodiment mode includes a plurality of terminals extending from four sides toward a site on which a semiconductor element is to be mounted. As shown in FIG. 1B, a roughened silver plating layer 11 covering the entire surface of a lead frame base 10 made of a copper-based material and a reinforcing plating layer 11α covering, as an outermost plating layer, an outer surface of acicular projections in the roughened silver plating layer 11 are provided. In FIG. 1B, the reference numeral 10a denotes internal connection terminal portions to be electrically connected to the semiconductor element, and the reference numeral 10b denotes external connection terminal portions.

The roughened silver plating layer 11 has acicular projections having a surface area ratio of 1.30 or more and 6.00 or less (i.e. the ratio of the surface area of the roughened silver plating layer to the surface area of a corresponding smooth surface).

The roughened silver plating layer 11 has a crystal structure in which the crystal direction <101> occupies a largest proportion among the crystal directions <001>, <111> and <101>.

The average diameter of crystal grains in the roughened silver plating layer 11 is smaller than 0.28 μm.

An outer surface of the reinforcing plating layer 11α is shaped to have acicular projections with a surface area ratio of 1.30 or more and 6.00 or less to a surface area of a smooth surface, as inheriting the acicular projections of the roughened silver plating layer 11.

In this embodiment mode, the roughened silver plating layer 11 is formed to have a thickness of 0.2 μm or more and 3.0 μm or less upon use the lead frame base 10 made of a copper-based material as a base.

As a modification of this embodiment mode, between the lead frame base 10 made of a copper-based material and the roughened silver plating layer 11, an undercoat plating layer may be provided, to function as a barrier plating layer for preventing copper from diffusing under a high temperature. In this case, the undercoat plating layer can be composed of any of a nickel plating layer, nickel/palladium plating layers and nickel/palladium/gold plating layers, and the roughened silver plating layer 11 is preferably formed to have a thickness of 0.2 μm or more and 3.0 μm or less.

To be specific, in an exemplary case where an undercoat plating layer, which functions as a barrier plating layer for preventing diffusion of copper when electrical connection with a semiconductor element is made via solder, is composed of nickel/palladium plating layers or nickel/palladium/gold plating layers, the roughened silver plating layer 11 is preferably formed to have a thickness of 0.2 μm or more and 3.0 μm or less.

The reinforcing plating layer 11α is configured of a silver flash layer with a thickness of 0.4 μm or more and 4.0 μm or less, preferably 1.0 μm.

The reinforcing plating player 11α may be configured of, in place of the silver flash layer, a three-layer plating layer composed of a nickel plating layer with a thickness of 0.4 μm or more and 4.0 μm or less, preferably 1.0 μm, a palladium plating layer with a thickness of 0.005 μm or more and 0.1 μm or less, preferably 0.01 μm, and a gold plating layer with a thickness of 0.0005 μm or more and 0.01 μm or less, preferably 0.001 μm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 μm.

The lead frame 1-1 of this embodiment mode is configured so that, as shown in FIG. 2, the individual lead frames 1-1 are arrayed in multiple rows.

Next, one example of manufacturing procedure for the lead frame 1 of this embodiment mode will be described in reference to FIGS. 3A-3F.

Figure 3A:
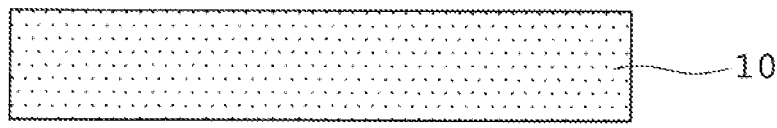
FIGS. 3A-3F are explanatory diagrams that show one example of manufacturing procedure for the lead frame for mounting a semiconductor element thereon according to the first embodiment mode of the present invention.

First, a metal plate 10 made of a copper-based material is prepared as a lead frame base (See FIG. 3A).

Figure 3B:
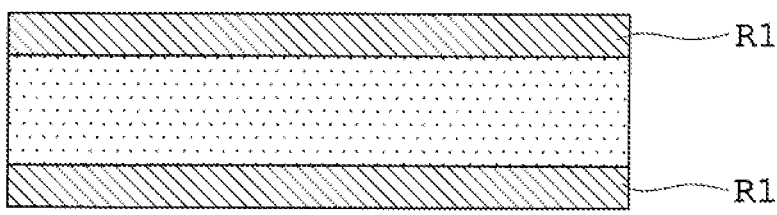

Then, resist layers R1 are formed on both surfaces of the metal plate 10 (See FIG. 3B).

Figure 3C:
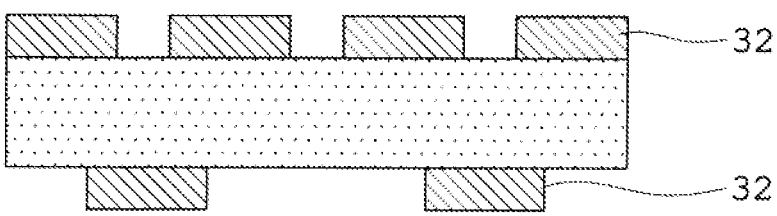

Then, exposure and development are performed upon use of glass masks carrying a pattern corresponding to a predetermined lead frame shape, to form etching resist masks 32 (See FIG. 3C).

Figure 3D:
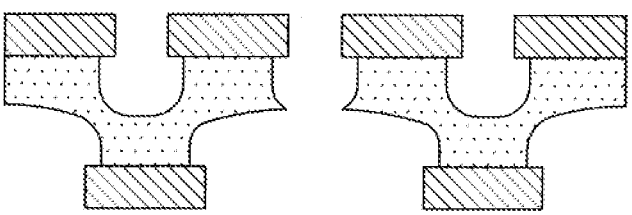

Then, etching is performed on both sides, to form the predetermined lead frame shape (See FIG. 3D).

Figure 3E:
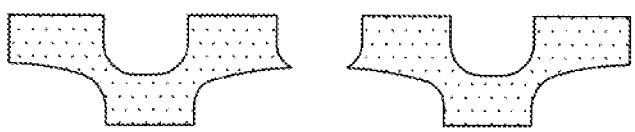

Then, the etching resist masks 32 are removed (See FIG. 3E).

Figure 3F:
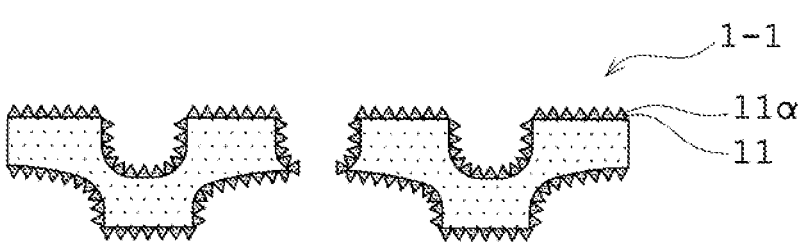

Then, a roughened silver plating layer 11 having acicular projections is formed to cover the entire surface of the metal plate 10 having been shaped into the predetermined lead frame shape, and thereon a reinforcing plating layer 11α is formed as an outermost plating layer, to cover an outer surface of the acicular projections in the roughened silver plating layer 11 (See FIG. 3F).

Thereby, the lead frame 1-1 of this embodiment mode is completed.

Regarding the process of forming the roughened silver plating layer 11 having acicular projections, the roughened silver plating layer 11 is directly formed on the lead frame base 10 only upon activation treatment of the surface of the lead frame base 10 or is formed on a nickel plating layer formed as a barrier plating layer to a thickness as to prevent diffusion of the underlying copper. In the case where adhesiveness of the roughened silver plating layer 11 is unreliable, a silver strike plating layer may be formed directly before roughened silver plating, so that the roughened silver plating layer 11 is formed thereon.

In order to form the roughened silver plating layer 11 having acicular projections with a surface area ratio (i.e. the ratio of the surface area of the roughened silver plating layer to the surface area of a corresponding smooth surface) of 1.30 or more and 6.00 or less and with a crystal structure in which the crystal direction <101> occupies a largest proportion among the crystal directions <001>, <111> and <101>, the silver concentration in a silver plating bath composed of a methanesulfonic acid-based silver plating solution is set to 1.0 g/L or more and 10 g/L or less. In particular, it is much preferable that the silver concentration is in the range of 1.5 g/L or more and 5.0 g/L or less.

A silver concentration lower than 1.0 g/L is not preferable because the roughened silver plating film cannot be formed sufficiently. A silver concentration higher than 10 g/L causes the film of the roughened silver plating layer to have a smooth surface, or fails to form acicular silver crystals, and thus is not preferable.

As an alternative to the silver strike plating used to improve bondability between the base and the roughened silver plating layer 11, a plating layer of palladium or of an alloy containing palladium may be used to suitably bond the base and the roughened silver plating layer 11.

Further, a plating layer of gold or of an alloy containing gold may be formed beneath the roughened silver plating layer 11 in order to improve bondability to a semiconductor element.

In the case where the roughened silver plating layer 11 is formed directly on the lead frame base without an undercoat plating layer between, the thickness of the roughened silver plating layer 11 needs to be 0.2 μm or more, and is preferably 0.2 μm or more and 3.0 μm or less. Further, from the viewpoint of cost, it is much preferable that the thickness is 0.3 μm or more and 1.0 μm or less.

In the case where plating layers made of nickel/palladium plating or plating layers made of nickel/palladium/gold plating are provided as undercoat plating layers functioning as a barrier for preventing copper diffusion when electrical connection with a semiconductor element is made via solder, the thickness of the roughened silver plating layer 11 is preferably 0.2 μm or more and 3.0 μm or less.

The reinforcing plating layer 11α covering the outer surface of the acicular projections in the roughened silver plating layer 11 is formed by laminating a silver flash layer of 0.4 μm or more and 4.0 μm or less, preferably 1.0 μm.

The reinforcing plating player 11α covering the outer surface of the acicular projections in the roughened silver plating layer 11 may be configured of, in place of a silver flash layer, a three-layer plating layer composed of a nickel plating layer with a thickness of 0.4 μm or more and 4.0 μm or less, preferably 1.0 μm, a palladium plating layer with a thickness of 0.005 μm or more and 0.1 μm or less, preferably 0.01 μm, and a gold plating layer with a thickness of 0.0005 μm or more and 0.01 μm or less, preferably 0.001 μm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 μm.

Next, one example of manufacturing procedure for a semiconductor package using the lead frame 1-1 of this embodiment mode will be described in reference to FIGS. 4A-4E.

Figure 4A:
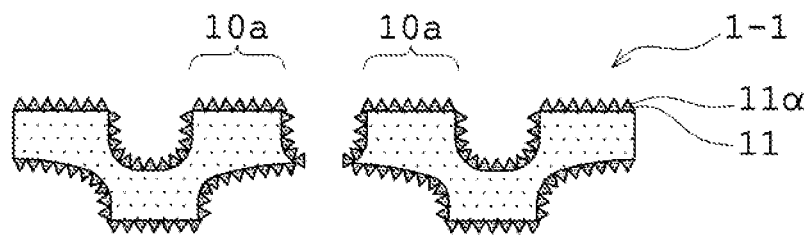
FIGS. 4A-4E are explanatory diagrams that show one example of manufacturing procedure for a semiconductor package using the lead frame for mounting a semiconductor element thereon according to the first embodiment mode of the present invention.

First, the lead frame 1-1 manufactured in accordance with the manufacturing procedure shown in FIGS. 3A-3F is prepared (See FIG. 4A).

Figure 4B:
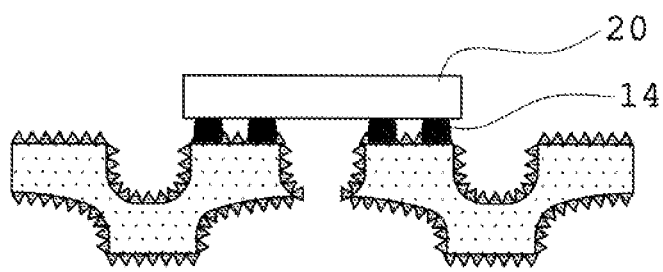

Then, solder 14 is printed on a semiconductor element mounting site in the internal connection terminal portions 10a on the upper surface side of the lead frame 1-1, and a semiconductor element 20 is mounted thereon and fixed, so that electrodes of the semiconductor element 20 and the internal connection terminal portions 10a of the lead frame 1-1 are electrically connected (See FIG. 4B).

Figure 4C:
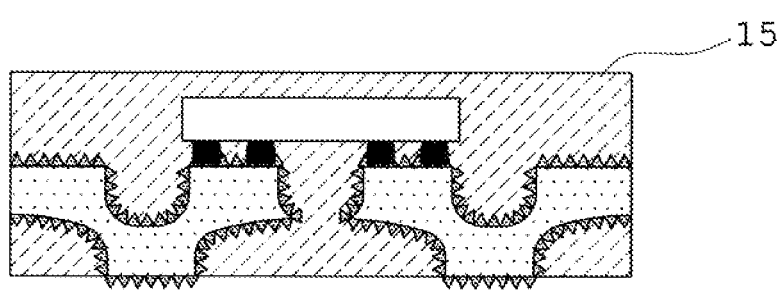

Then, a mold is used to seal, with a sealing resin 15, a surrounding space region except the external connection terminal portions 10b on the lower surface side of the lead frame 1-1 (See FIG. 4C).

Figure 4D:
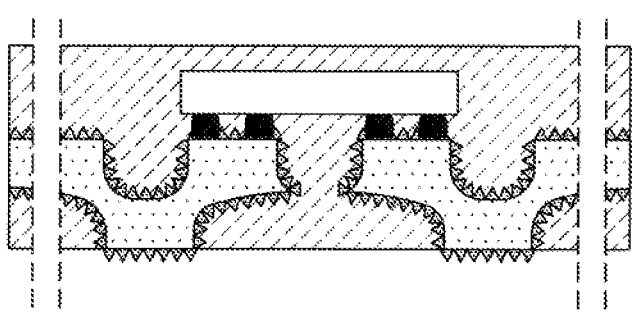

Lastly, semiconductor packages arrayed in multiple rows are singulated by dicing, pressing or the like (See FIG. 4D).

Figure 4E:
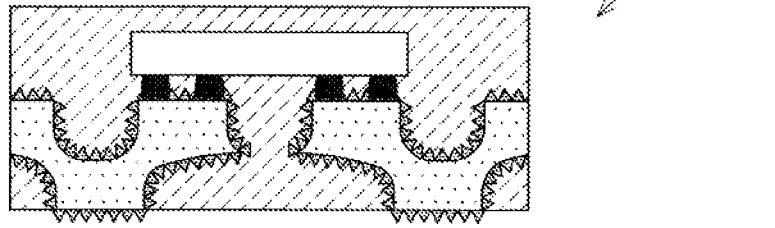

Thereby, a semiconductor package 2-1 using the lead frame 1 of this embodiment mode is obtained (See FIG. 4E).

Second Embodiment Mode

Figure 5A:
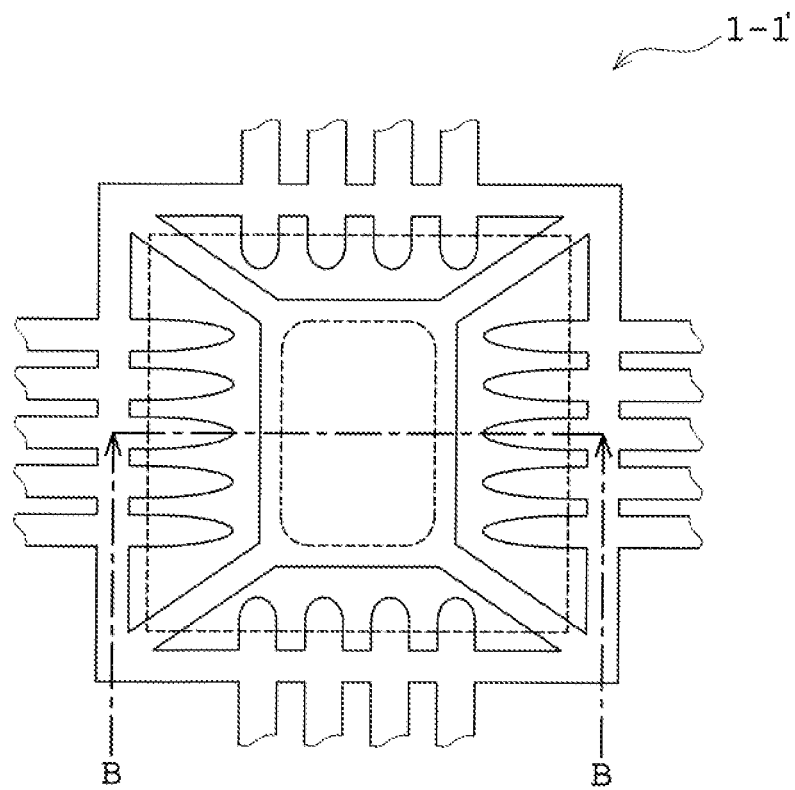
FIGS. 5A-5B are diagrams that show one example of lead frame according to a second embodiment mode of the present invention, where
Figure 5B:
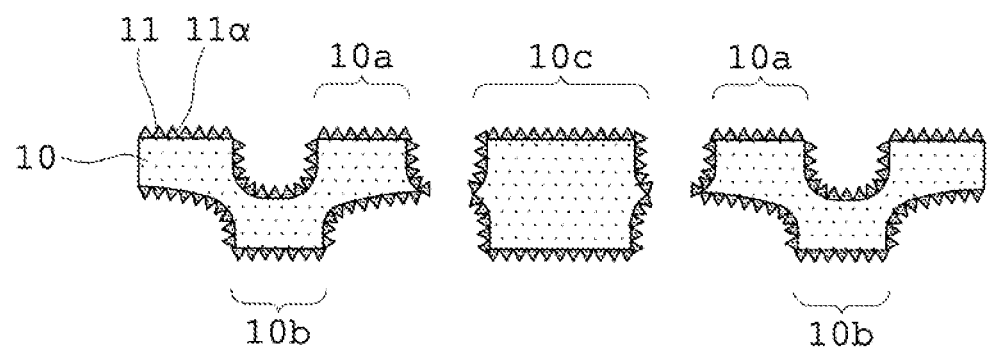
Figure 6:
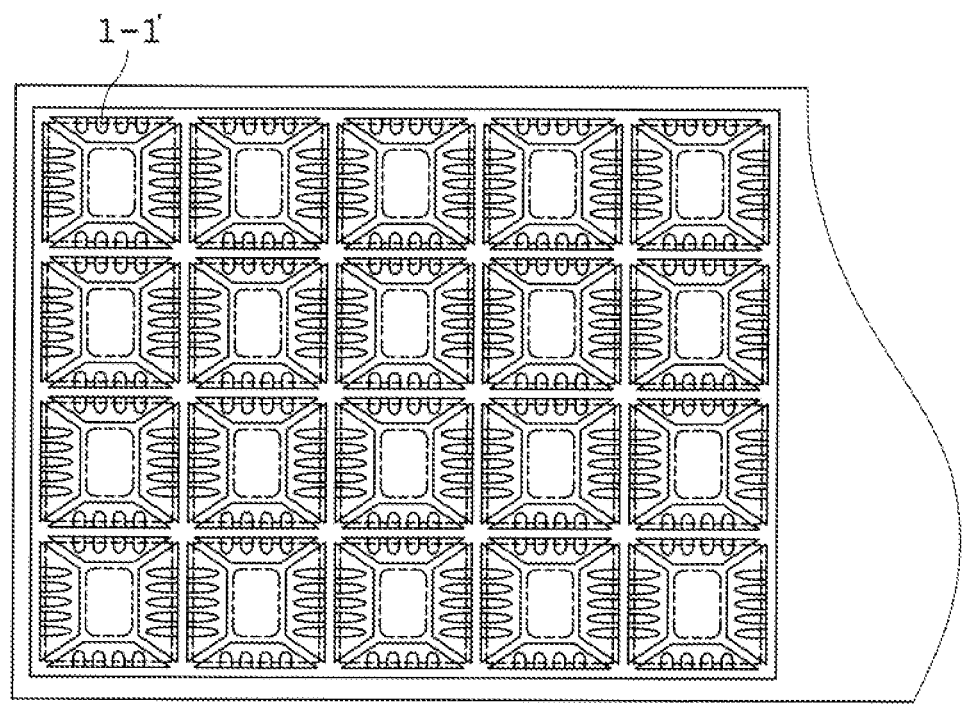
FIG. 6 is a plan view that shows one example of lead frames arrayed in multiple rows according to the second embodiment mode of the present invention.
Figure 7A:
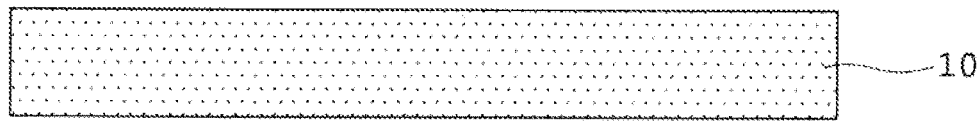
FIGS. 7A-7F are explanatory diagrams that show one example of manufacturing procedure for the lead frame for mounting a semiconductor element thereon according to the second embodiment mode of the present invention.
Figure 7B:
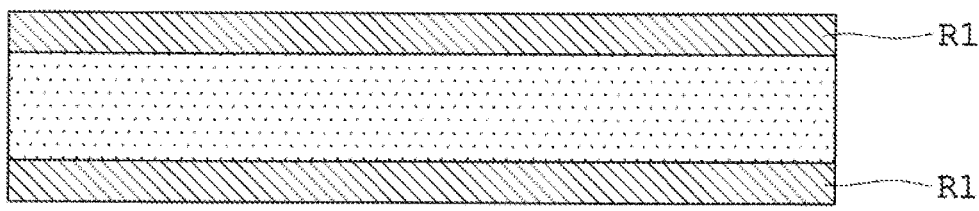
Figure 7C:
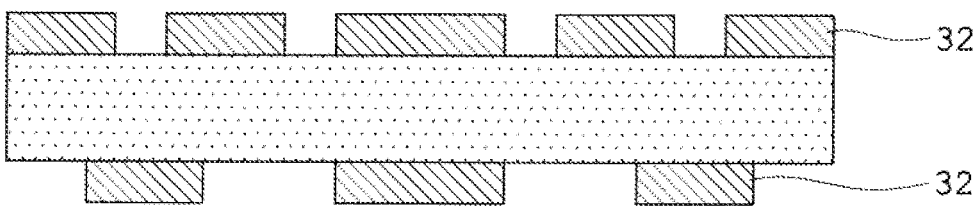
Figure 7D:
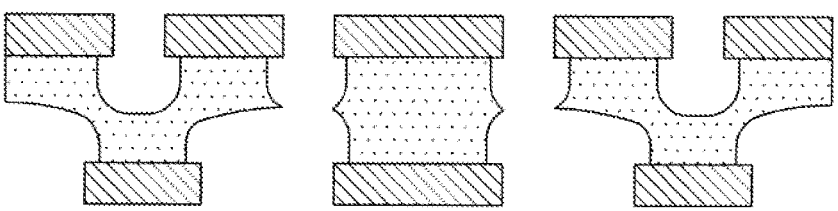
Figure 7E:
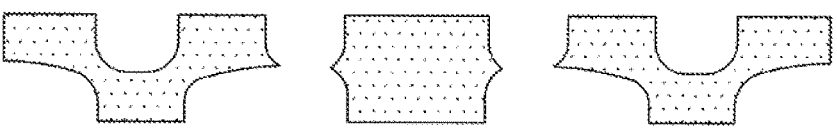
Figure 7F:
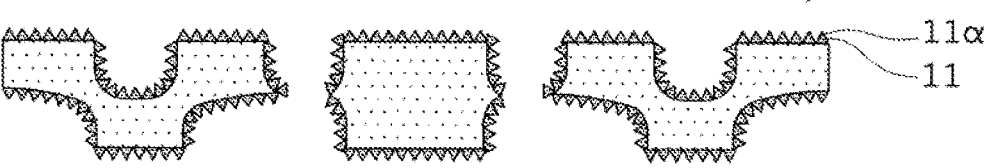

FIGS. 5A-5B are diagrams that show one example of a lead frame according to a second embodiment mode of the present invention, where FIG. 5A is a plan view and FIG. 5B is an explanatory diagram schematically showing the B-B cross section in FIG. 5A. FIG. 6 is a plan view that shows one example of lead frames arrayed in multiple rows according to the second embodiment mode of the present invention. FIGS. 7A-7F are explanatory diagrams that show one example of manufacturing procedure for a lead frame for mounting a semiconductor element thereon according to the second embodiment mode of the present invention. FIGS. 8A-8E are explanatory diagrams that show one example of manufacturing procedure for a semiconductor package using the lead frame for mounting a semiconductor element thereon according to the second embodiment mode of the present invention.

As shown in FIGS. 5A-5B, a lead frame 1-1' of this embodiment mode includes a pad portion 10c for mounting a semiconductor element thereon and a plurality of terminals extending from four sides toward the pad portion 10c, and, as shown in FIG. 5B, a roughened silver plating layer 11 covering the entire surface of a lead frame base 10 made of a copper-based material and a reinforcing plating layer 11α covering, as an outermost plating layer, an outer surface of acicular projections in the roughened silver plating layer 11 are provided. In FIG. 5B, the reference numeral 10a denotes internal connection terminal portions to be electrically connected to the semiconductor element, and the reference numeral 10b denotes external connection terminal portions.

The roughened silver plating layer 11 has acicular projections having a surface area ratio of 1.30 or more and 6.00 or less (i.e. the ratio of the surface area of the roughened silver plating layer to the surface area of a corresponding smooth surface).

The roughened silver plating layer 11 has a crystal structure in which the crystal direction <101> occupies a largest proportion among the crystal directions <001>, <111> and <101>.

The average diameter of crystal grains in the roughened silver plating layer 11 is smaller than 0.28 μm.

An outer surface of the reinforcing plating layer 11α is shaped to have acicular projections with a surface area ratio of 1.30 or more and 6.00 or less to a surface area of a smooth surface, as inheriting the acicular projections of the roughened silver plating layer 11.

In this embodiment mode, the roughened silver plating layer 11 is formed to have a thickness of 0.2 μm or more and 3.0 μm or less upon use the lead frame base 10 made of a copper-based material as a plating base.

As a modification of this embodiment mode, between the lead frame base 10 made of a copper-based material and the roughened silver plating layer 11, an undercoat plating layer may be provided, to function as a barrier plating layer for preventing copper from diffusing under high temperature. In this case, the undercoat plating layer can be composed of any of a nickel plating layer, nickel/palladium plating layers and nickel/palladium/gold plating layers, and the roughened silver plating layer 11 is preferably formed to have a thickness of 0.2 μm or more and 3.0 μm or less.

To be specific, in an exemplary case where an undercoat plating layer, which functions as a barrier plating layer for preventing diffusion of copper when electrical connection with a semiconductor element is made by wire bonding, is composed of a nickel plating layer, the roughened silver plating layer 11 is preferably formed to have a thickness of 0.2 μm or more and 3.0 μm or less.

Also, in an exemplary case where an undercoat plating layer, which functions as a barrier plating layer for preventing diffusion of copper when electrical connection with a semiconductor element is made by wire bonding, is composed of nickel/palladium plating layers, the roughened silver plating layer 11 is preferably formed to have a thickness of 0.2 μm or more and 3.0 μm or less.

The reinforcing plating layer 11α is configured of a silver flash layer with a thickness of 0.4 μm or more and 4.0 μm or less, preferably 1.0 μm.

The reinforcing plating player 11α may be configured of, in place of the silver flash layer, a three-layer plating layer composed of a nickel plating layer with a thickness of 0.4 μm or more and 4.0 μm or less, preferably 1.0 μm, a palladium plating layer with a thickness of 0.005 μm or more and 0.1 μm or less, preferably 0.01 μm, and a gold plating layer with a thickness of 0.0005 μm or more and 0.01 μm or less, preferably 0.001 μm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 μm.

The lead frame 1-1' of this embodiment mode is configured so that, as shown in FIG. 6, the individual lead frames 1-1' are arrayed in multiple rows.

Next, one example of manufacturing procedure for the lead frame 1-1' of this embodiment mode will be described in reference to FIGS. 7A-7F.

The manufacturing procedure for the lead frame 1-1' of this embodiment mode is substantially the same as the manufacturing procedure for the lead frame 1-1 of the first embodiment mode shown in FIGS. 3A-3F, and the processes for forming the roughened silver plating layer 11 having acicular projections and the reinforcing plating layer 11α covering the outer surface of the acicular projections in the roughened silver plating layer 11 are also substantially the same as those in the lead frame 1-1 of the first embodiment mode (See FIGS. 7A-7F).

In the case where the roughened silver plating layer 11 is formed directly on the lead frame base without an undercoat plating layer between, the thickness of the roughened silver plating layer 11 needs to be 0.2 μm or more, and is preferably 0.2 μm or more and 3.0 μm or less. Further, from the viewpoint of cost, it is much preferable that the thickness is 0.3 μm or more and 1.0 μm or less.

In the case where a nickel plating layer is provided as an undercoat plating layer functioning as a barrier for preventing copper diffusion when electrical connection with a semiconductor element is made by wire bonding, the thickness of the roughened silver plating layer 11 is preferably 0.2 μm or more and 3.0 μm or less.

In the case where nickel/palladium plating layers are provided as undercoat plating layers functioning as a barrier for preventing copper diffusion when electrical connection with a semiconductor element is made by wire bonding, the thickness of the roughened silver plating layer 11 is preferably 0.2 μm or more and 3.0 μm or less.

The reinforcing plating layer 11α covering the outer surface of the acicular projections in the roughened silver plating layer 11 is formed by laminating a silver flash layer of 0.4 μm or more and 4.0 μm or less, preferably 1.0 μm.

The reinforcing plating player 11α covering the outer surface of the acicular projections in the roughened silver plating layer 11 may be configured of, in place of a silver flash layer, a three-layer plating layer composed of a nickel plating layer with a thickness of 0.4 μm or more and 4.0 μm or less, preferably 1.0 μm, a palladium plating layer with a thickness of 0.005 μm or more and 0.1 μm or less, preferably 0.01 μm, and a gold plating layer with a thickness of 0.0005 μm or more and 0.01 μm or less, preferably 0.001 μm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 μm.

Next, one example of manufacturing procedure for a semiconductor package using the lead frame 1-1' of this embodiment mode will be described in reference to FIGS. 8A-8E.

Figure 8A:
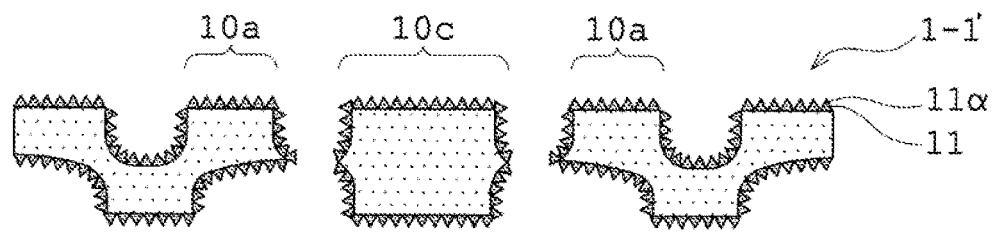
FIGS. 8A-8E are explanatory diagrams that show one example of manufacturing procedure for a semiconductor package using the lead frame for mounting a semiconductor element thereon according to the second embodiment mode of the present invention.

First, the lead frame 1-1' manufactured in accordance with the manufacturing procedure shown in FIGS. 7A-7F is prepared (See FIG. 8A).

Figure 8B:
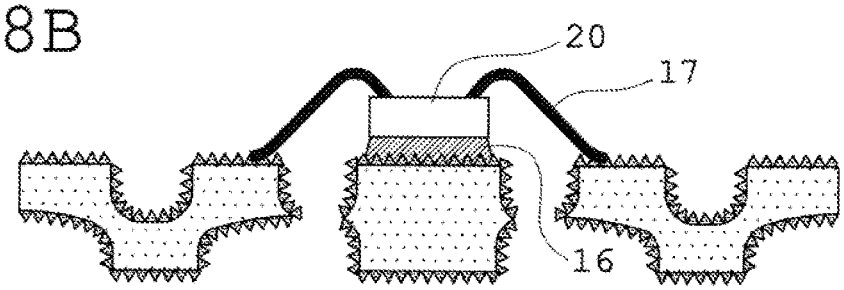

Then, a semiconductor element 20 is mounted and fixed on the pad portion 10c on the upper surface side of the lead frame 1-1' via a die bond 16, and electrodes of the semiconductor element 20 and the internal connection terminal portions 10a of the lead frame 1-1' are electrically connected via bonding wires 17 (See FIG. 8B).

Figure 8C:
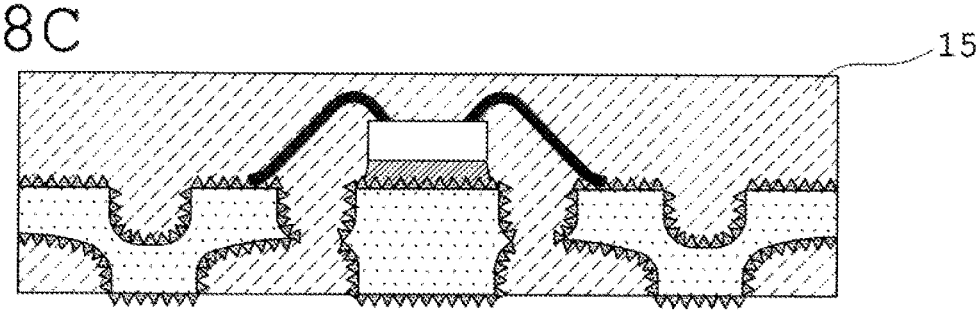

Then, a mold is used to seal, with a sealing resin 15, a surrounding space region except the external connection terminal portions 10b on the lower surface side of the lead frame 1-1' (See FIG. 8C).

Figure 8D:
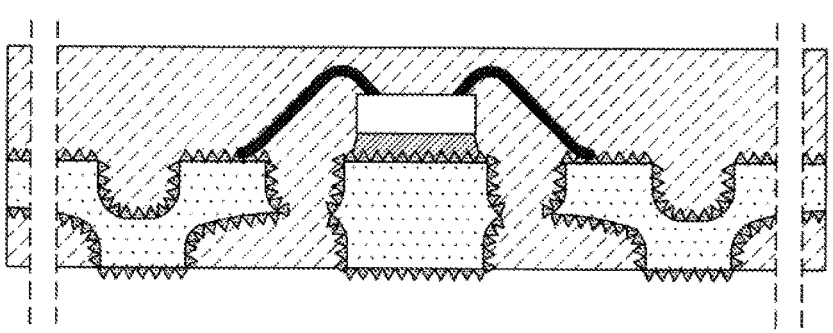

Lastly, semiconductor packages arrayed in multiple rows are singulated by dicing, pressing or the like (See FIG. 8D).

Figure 8E:
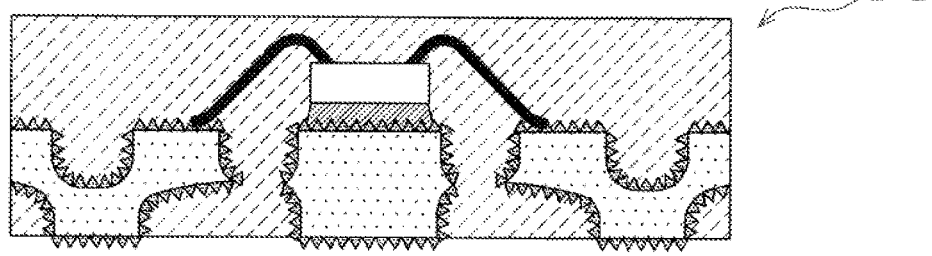

Thereby, a semiconductor package 2-1' using the lead frame 1-1' of this embodiment mode is obtained (See FIG. 8E).

Third Embodiment Mode

Figure 9A:
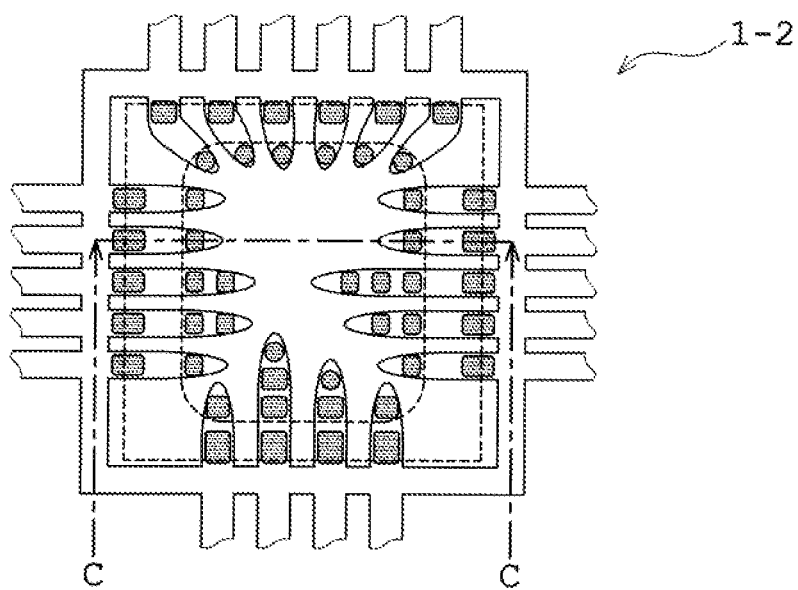
FIGS. 9A-9C are diagrams that show one example of lead frame according to a third embodiment mode of the present invention, where
Figure 9B:
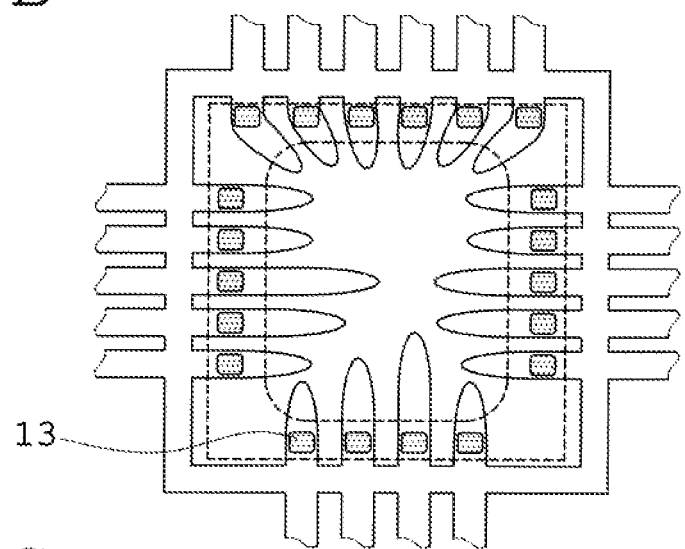
Figure 9C:
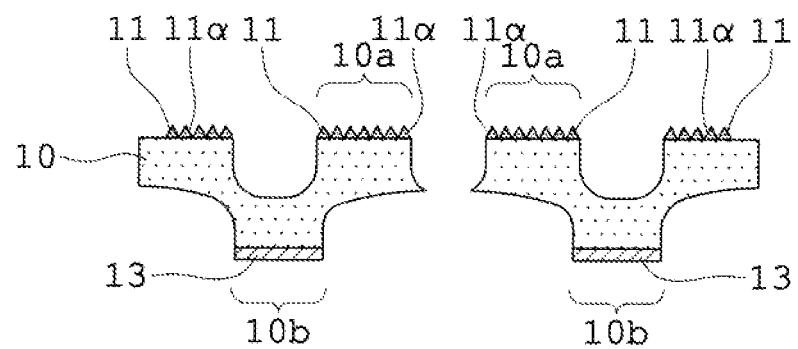
Figure 10:
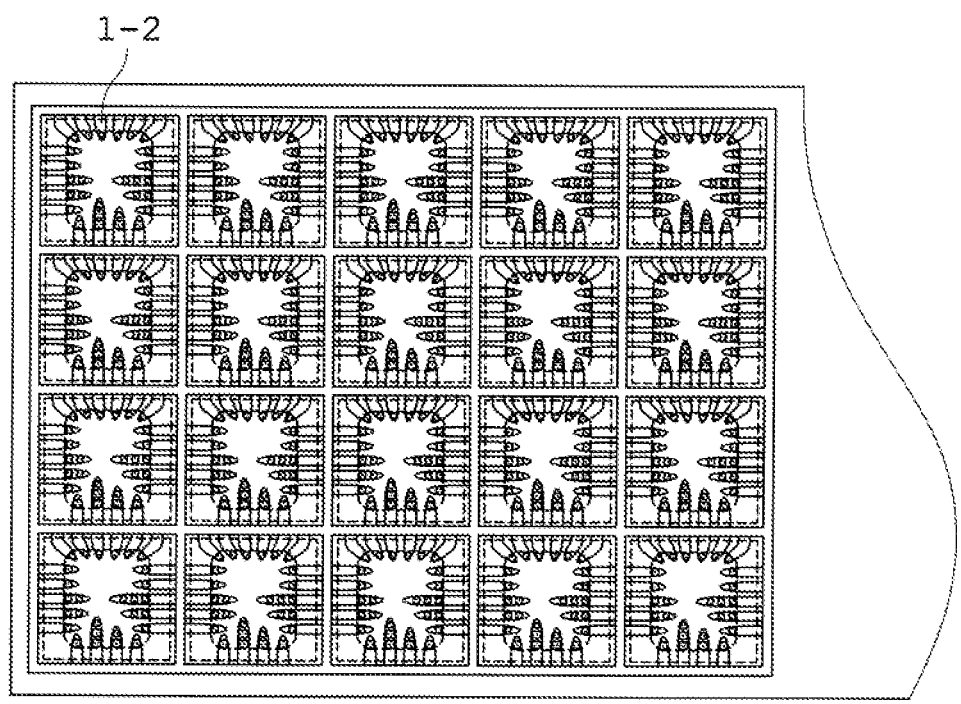
FIG. 10 is a plan view that shows one example of lead frames arrayed in multiple rows according to the third embodiment mode of the present invention.

FIGS. 9A-9C are diagrams that show one example of a lead frame according to a third embodiment mode of the present invention, where FIG. 9A is a top view, FIG. 9B is a bottom view and FIG. 9C is an explanatory diagram schematically showing the C-C cross section in FIG. 9A. FIG. 10 is a plan view that shows one example of lead frames arrayed in multiple rows according to the third embodiment mode of the present invention. FIGS. 11A-11M are explanatory diagrams that show one example of manufacturing procedure for a lead frame for mounting a semiconductor element thereon according to the third embodiment mode of the present invention. FIGS. 12A-12E are explanatory diagrams that show one example of manufacturing procedure for a semiconductor package using the lead frame for mounting a semiconductor element thereon according to the third embodiment mode of the present invention.

As shown in FIG. 9A, a lead frame 1-2 of this embodiment mode includes a plurality of terminals extending from four sides toward a site on which a semiconductor element is to be mounted. As shown in FIG. 9C, a roughened silver plating layer 11 covering only top faces of the lead frame base 10 made of a copper-based material and a reinforcing plating layer 11α covering, as an outermost plating layer, an outer surface of acicular projections in the roughened silver plating layer 11 are provided. In FIG. 9C, the reference numeral 10a denotes internal connection terminal portions to be electrically connected to the semiconductor element, the reference numeral 10b denotes external connection terminal portions, and the reference numeral 13 denotes a plating layer for external connection.

The configurations of the roughened silver plating layer 11, the reinforcing plating layer 11α and the base for the roughened silver plating layer 11 are substantially the same as in the lead frame 1-1 of the first embodiment mode.

The lead frame 1-2 of this embodiment mode is provided with the plating layer 13 for external connection composed of nickel, palladium and gold layers laminated in this order on bottom faces of the lead frame base 10.

The lead frame 1-2 of this embodiment mode is configured so that, as shown in FIG. 10, the individual lead frames 1-2 are arrayed in multiple rows.

Next, one example of manufacturing procedure for the lead frame 1-2 of this embodiment mode will be described in reference to FIGS. 11A-11M.

Figure 11A:
FIGS. 11A-11M are explanatory diagrams that show one example of manufacturing procedure for the lead frame for mounting a semiconductor element thereon according to the third embodiment mode of the present invention.

First, a metal plate 10 made of a copper-based material is prepared as a lead frame base (See FIG. 11A).

Figure 11B:
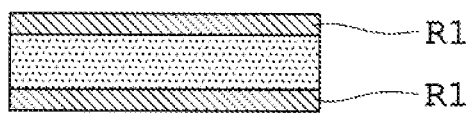

Then, first resist layers R1 are formed on both surfaces of the metal plate 10 (See FIG. 11B).

Figure 11C:
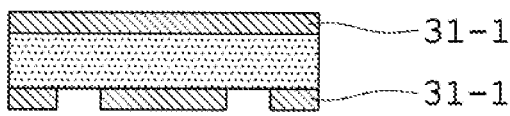

Then, the entire region of the first resist layer R1 on the upper surface side of the metal plate 10 is exposed and developed as well as the first resist layer R1 on the lower surface side of the metal plate 10 is exposed and developed upon use of a glass mask carrying a predetermined pattern corresponding to external connection terminal portions 10b, to form first plating resist masks 31-1 covering the entire region on the upper surface side of the metal plate 10 and having openings at sites corresponding to the external connection terminal portions 10b on the lower surface side of the metal plate 10 (See FIG. 11C).

Figure 11D:
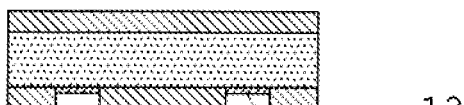
Figure 11E:
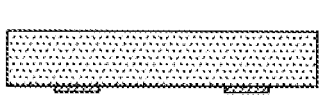

Then, upon use of the first plating resist masks 31-1, a nickel plating layer having a thickness of 0.3 to 3 µm, a palladium plating layer having a thickness of 0.005 to 0.1 µm, and a gold plating layer having a thickness of 0.0005 to 0.1 µm are laminated in this order on the lower surface of the metal plate 10 at the sites corresponding to the external connection terminal portions 10b, to form a plating layer 13 for external connection (See FIG. 11D).

Figure 11F:
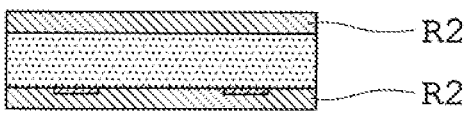

Then, the first plating resist masks 31-1 are removed (See FIG. 11E), and second resist layers R2 are formed on the both sides of the metal plate 10 (See FIG. 11F).

Figure 11G:
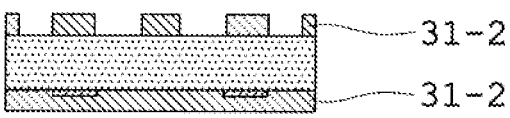

Then, the second resist layer R2 on the upper surface side of the metal plate 10 is exposed and developed upon use of a glass mask carrying a predetermined pattern dependent on the design of lead frame to be manufactured, as well as the entire region of the second resist layer R2 on the lower surface side of the metal plate 10 is exposed and developed, to form second plating resist masks 31-2 having openings at sites determined by the lead frame design on the upper surface side of the metal plate 10 and covering the entire region on the lower surface side of the metal plate 10 (See FIG. 11G).

Figure 11H:
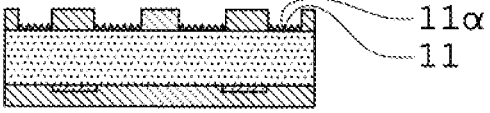
Figure 11I:
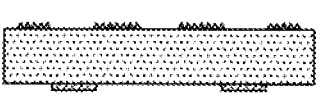

Then, upon use of the second plating resist masks 31-2, a roughened silver plating layer 11 having acicular projections is formed on the upper surface of the metal plate 10 at the sites determined by the lead frame design, and thereon a reinforcing plating layer 11a is formed, as an outermost plating layer, to cover the outer surface of the acicular projections in the roughened silver plating layer 11 (See FIG. 11H).

Figure 11J:
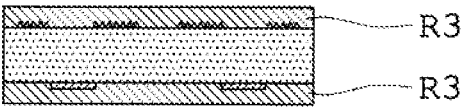

Then, the second plating resist masks 31-2 are removed (See FIG. 11I), and third resist layers R3 are formed on the both sides of the metal plate 10 (See FIG. 11J).

Figure 11K:
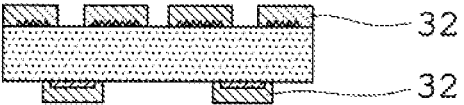

Then, exposure and development are performed upon use of glass masks carrying a pattern corresponding to a predetermined lead frame shape, to form etching resist masks 32 (See FIG. 11K).

Figure 11L:
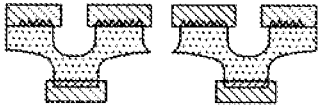

Then, etching is performed on the both sides, to form the predetermined lead frame shape (See FIG. 11L).

Figure 11M:
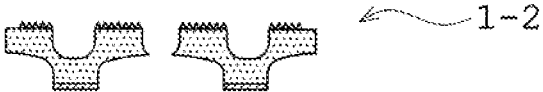

Then, the etching resist masks 32 are removed (See FIG. 11M).

Thereby the lead frame 1-2 of this embodiment mode is completed.

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, one example of manufacturing procedure for a semiconductor package using the lead frame 1-2 of this embodiment mode will be described in reference to FIGS. 12A-12E.

Figure 12A:
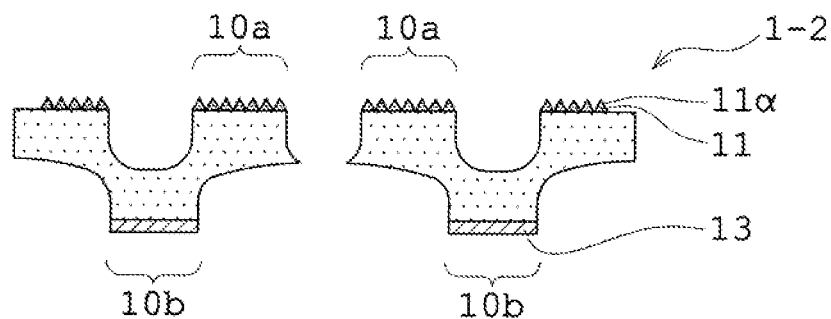
FIGS. 12A-12E are explanatory diagrams that show one example of manufacturing procedure for a semiconductor package using the lead frame for mounting a semiconductor element thereon according to the third embodiment mode of the present invention.

First, the lead frame 1-2 manufactured in accordance with the manufacturing procedure shown in FIGS. 11A-11M is prepared (See FIG. 12A).

Figure 12B:
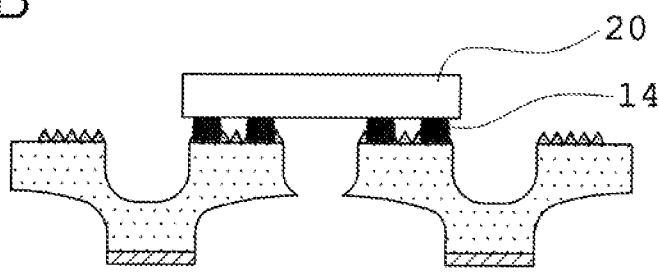
Figure 12C:
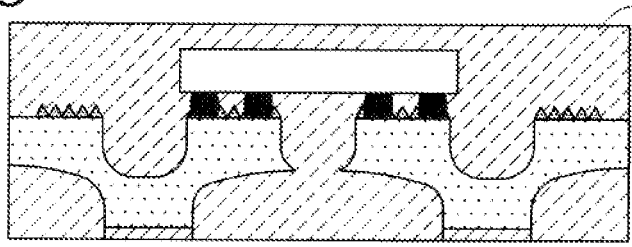
Figure 12D:
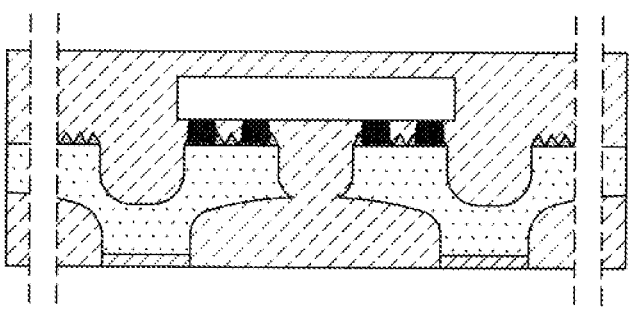

After that, mounting of a semiconductor element 20 via solder 14, resin sealing, and singulation of individual semiconductor packages are carried out substantially in the same manner as in the manufacturing procedure for a semiconductor package using the lead frame of the first embodiment mode (See FIG. 12B through FIG. 12D).

Figure 12E:
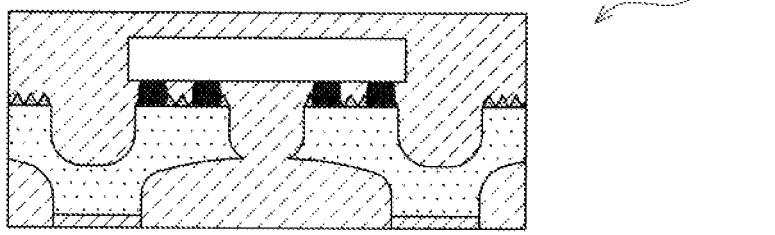

Thereby a semiconductor package 2-2 using the lead frame 1-2 of this embodiment mode is obtained (See FIG. 12E).

Fourth Embodiment Mode

Figure 13A:
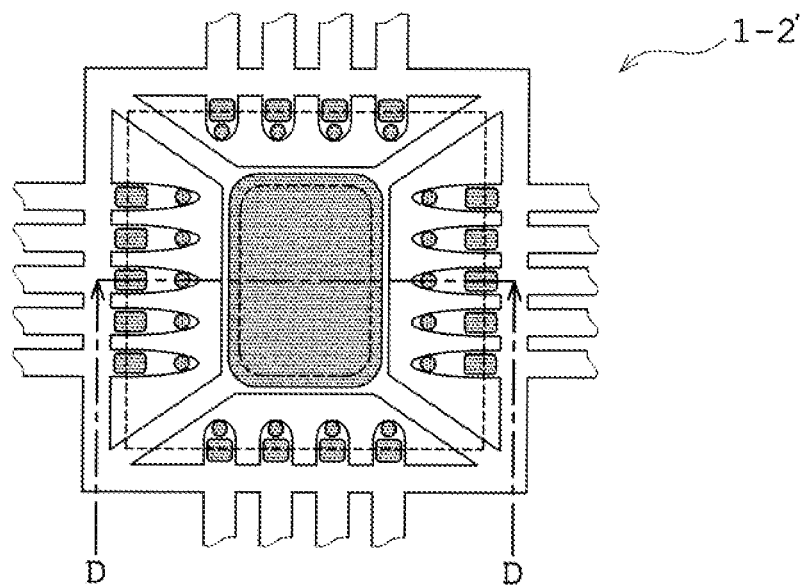
FIGS. 13A-13C are diagrams that show one example of lead frame according to a fourth embodiment mode of the present invention, where
Figure 13B:
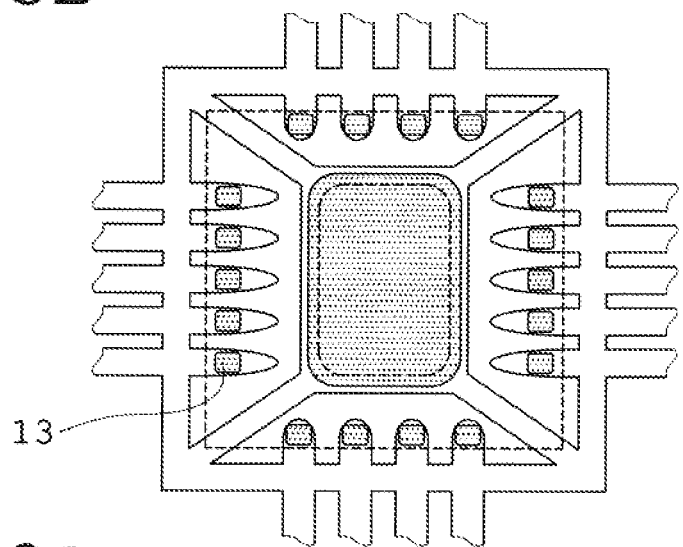
Figure 13C:
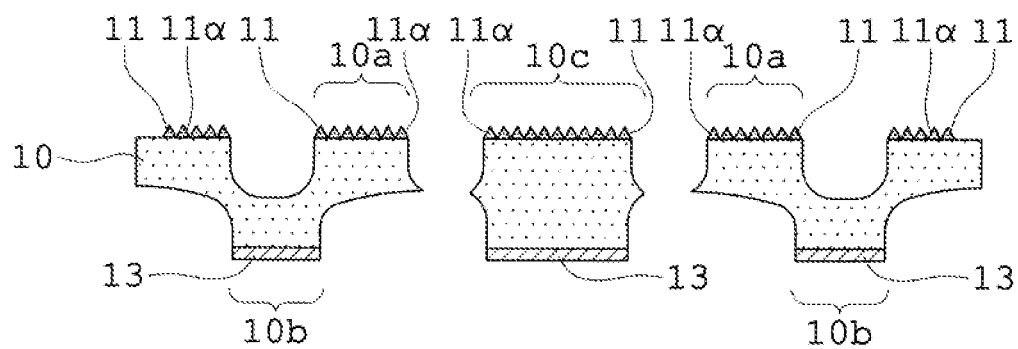
Figure 14:
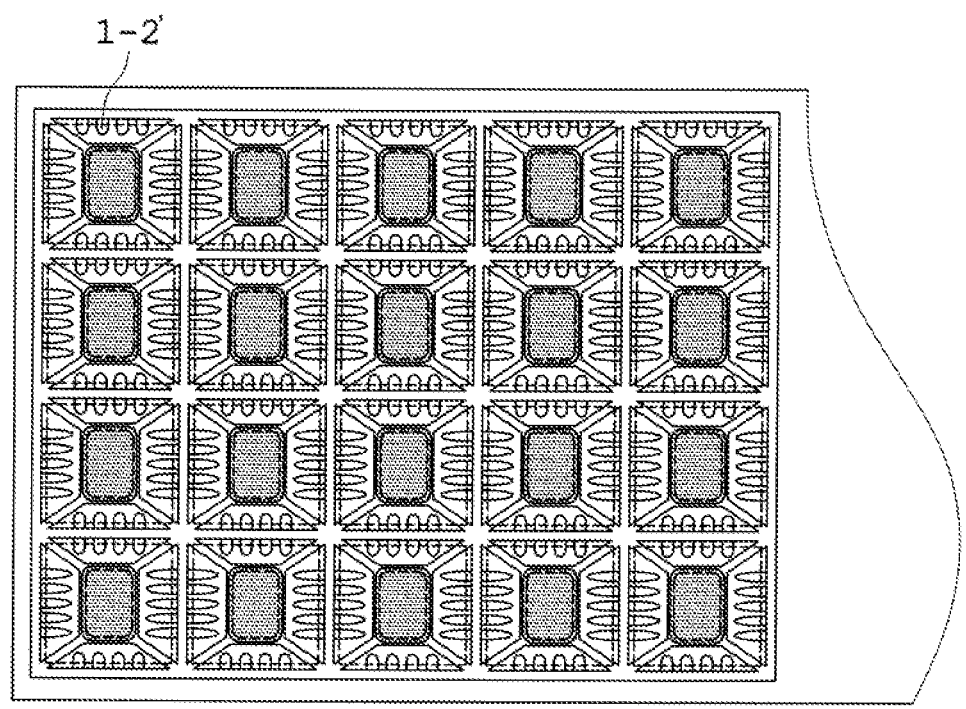
FIG. 14 is a plan view that shows one example of lead frames arrayed in multiple rows according to the fourth embodiment mode of the present invention.

FIGS. 13A-13C are diagrams that show one example of a lead frame according to a fourth embodiment mode of the present invention, where FIG. 13A is a top view, FIG. 13B is a bottom view and FIG. 13C is an explanatory diagram schematically showing the D-D cross section in FIG. 13A. FIG. 14 is a plan view that shows one example of lead frames arrayed in multiple rows according to the fourth embodiment mode of the present invention. FIGS. 15A-15M are explanatory diagrams that show one example of manufacturing procedure for a lead frame for mounting a semiconductor element thereon according to the fourth embodiment mode of the present invention. FIGS. 16A-16E are explanatory diagrams that show one example of manufacturing procedure for a semiconductor package using the lead frame for mounting a semiconductor element thereon according to the fourth embodiment mode of the present invention.

As shown in FIGS. 13A-13C, a lead frame 1-2' of this embodiment mode includes a pad portion 10c for mounting a semiconductor element thereon and a plurality of terminals extending from four sides toward the pad portion 10c. As shown in FIG. 13C, a roughened silver plating layer 11 covering only top faces of a lead frame base 10 made of a copper-based material and a reinforcing plating layer 11α covering, as an outermost plating layer, an outer surface of acicular projections in the roughened silver plating layer 11 are provided. In FIG. 13C, the reference numeral 10a denotes internal connection terminal portions to be electrically connected to the semiconductor element, the reference numeral 10b denotes external connection terminal portions, and the reference numeral 13 denotes a plating layer for external connection.

The configurations of the roughened silver plating layer 11, the reinforcing plating layer 11α and the base for the roughened silver plating layer 11 are substantially the same as in the lead frame 1-1' of the second embodiment mode.

The lead frame 1-2' of this embodiment mode is provided with the plating layer 13 for external connection composed of nickel, palladium and gold layers laminated in this order on bottom faces of the lead frame base 10.

The lead frame 1-2' of this embodiment mode is configured so that, as shown in FIG. 14, the individual lead frames 1-2' are arrayed in multiple rows.

Next, one example of manufacturing procedure for the lead frame 1-2' of this embodiment mode will be described in reference to FIGS. 15A-15M.

The manufacturing procedure for the lead frame 1-2' of this embodiment mode is substantially the same as the manufacturing procedure for the lead frame 1-2 of the third embodiment mode shown in FIGS. 11A-11F (See FIG. 15A through FIG. 15M).

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1' of the second embodiment mode.

Next, one example of manufacturing procedure for a semiconductor package using the lead frame 1-2' of this embodiment mode will be described in reference to FIGS. 16A-16E.

Figure 15A:
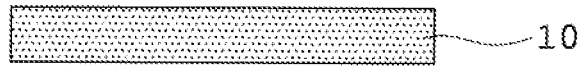
FIGS. 15A-15M are explanatory diagrams that show one example of manufacturing procedure for the lead frame for mounting a semiconductor element thereon according to the fourth embodiment mode of the present invention.
Figure 15B:
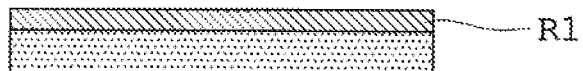
Figure 15C:
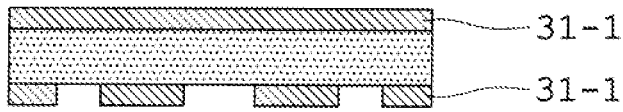
Figure 15D:
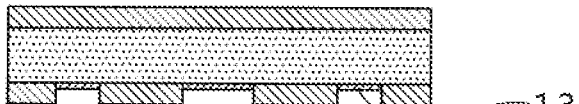
Figure 15E:
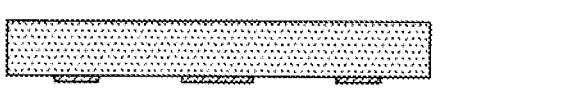
Figure 15F:
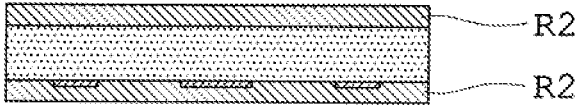
Figure 15G:
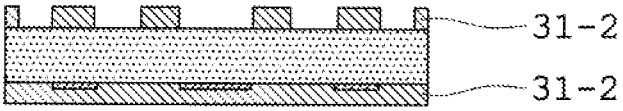
Figure 15H:
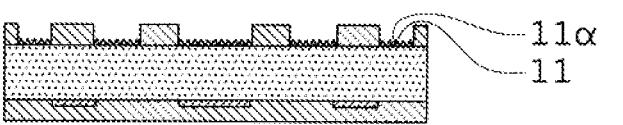
Figure 15I:
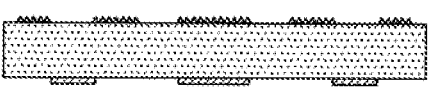
Figure 15J:
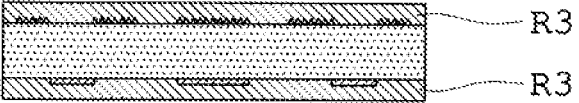
Figure 15K:
Figure 15L:
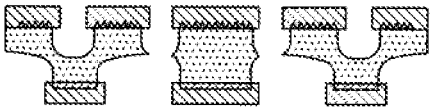
Figure 15M:
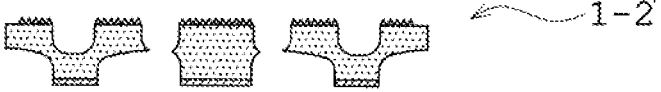
Figure 16A:
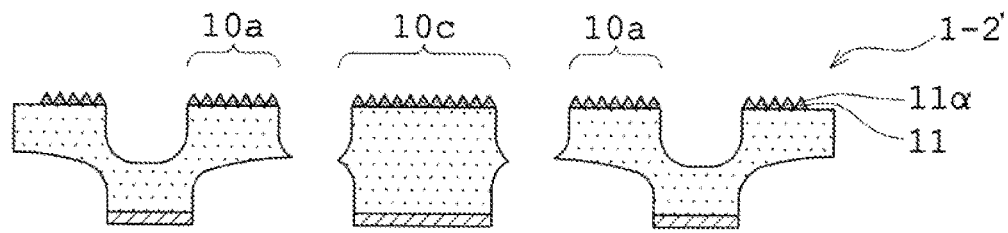
FIGS. 16A-16E are explanatory diagrams that show one example of manufacturing procedure for a semiconductor package using the lead frame for mounting a semiconductor element thereon according to the fourth embodiment mode of the present invention.

First, the lead frame 1-2' manufactured in accordance with the manufacturing procedure shown in FIGS. 15A-15M is prepared (See FIG. 16A).

Figure 16B:
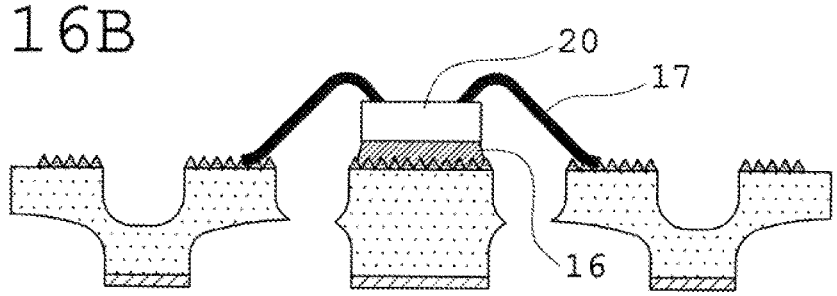
Figure 16C:
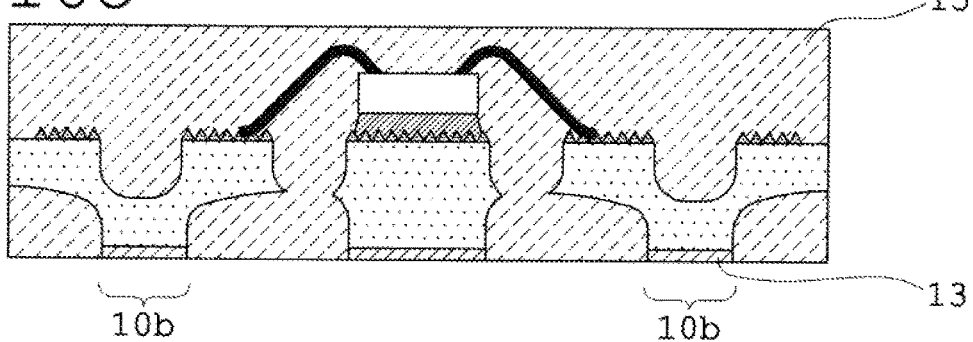
Figure 16D:
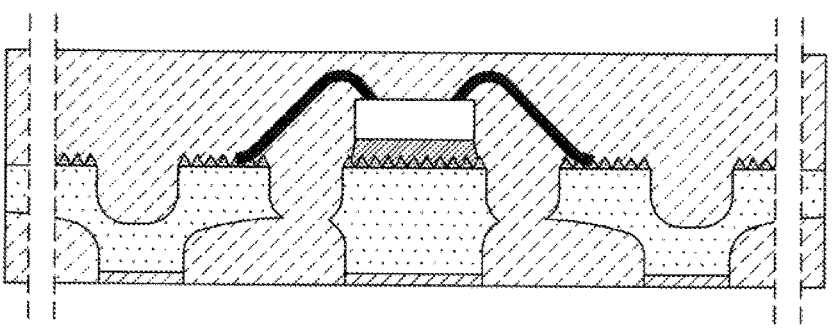

After that, mounting of a semiconductor element 20 via a die bond 16, wire bonding, resin sealing, and singulation of individual semiconductor packages are carried out substantially in the same manner as in the manufacturing procedure for a semiconductor package using the lead frame of the second embodiment mode (See FIG. 16B through FIG. 16D).

Figure 16E:
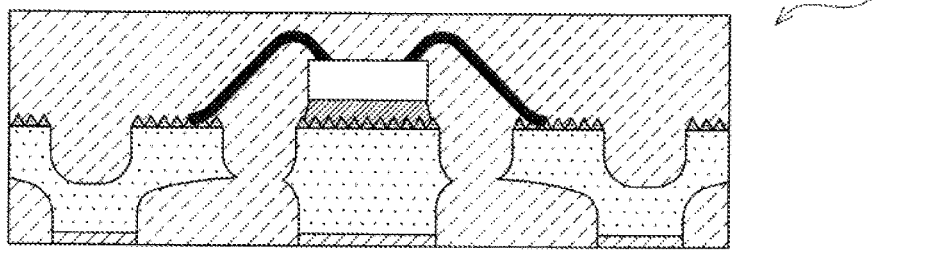

Thereby a semiconductor package 2-2' using the lead frame 1-2' of this embodiment mode is obtained (See FIG. 16E).

Fifth Embodiment Mode

Figure 17A:
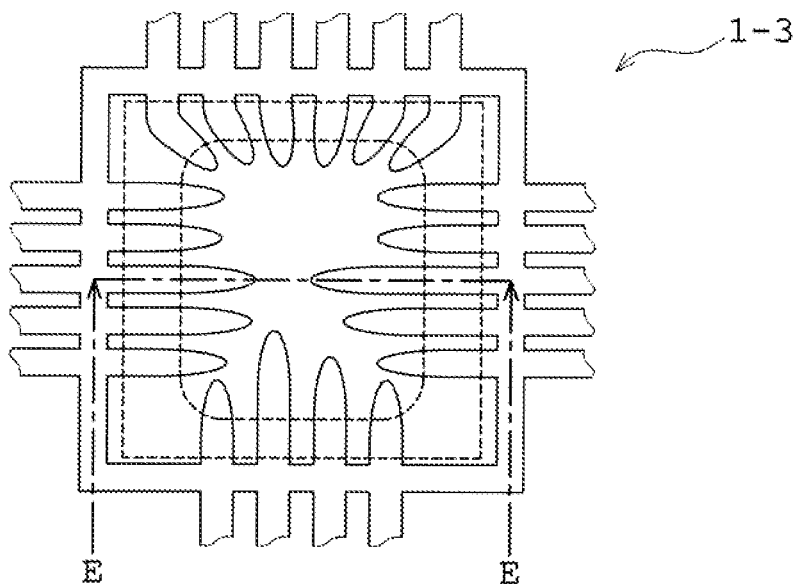
FIGS. 17A-17C are diagrams that show one example of lead frame according to a fifth embodiment mode of the present invention, where
Figure 17B:
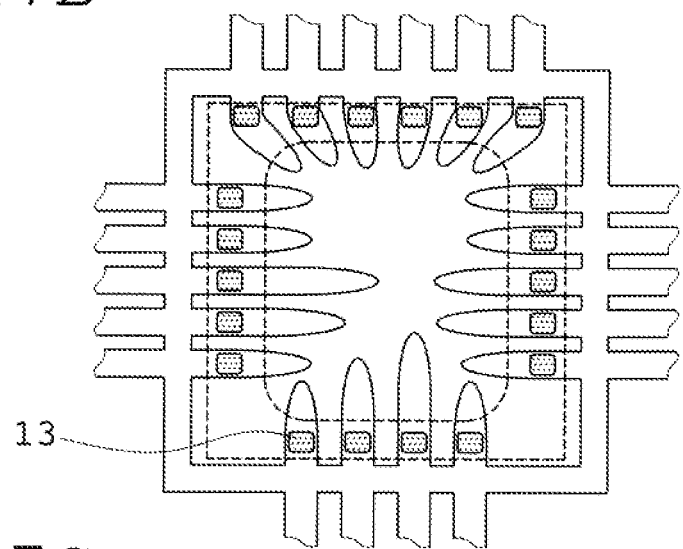
Figure 17C:
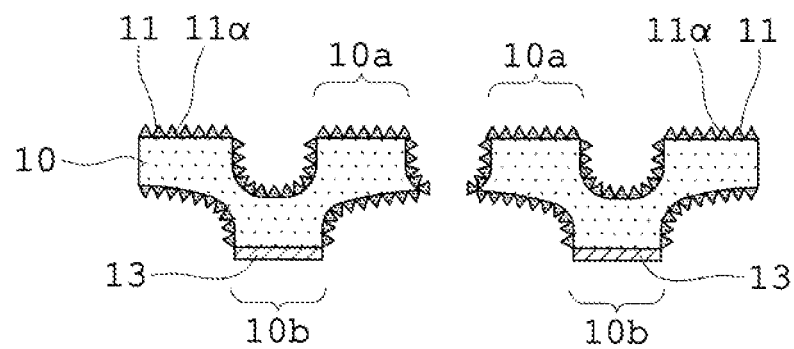
Figure 18:
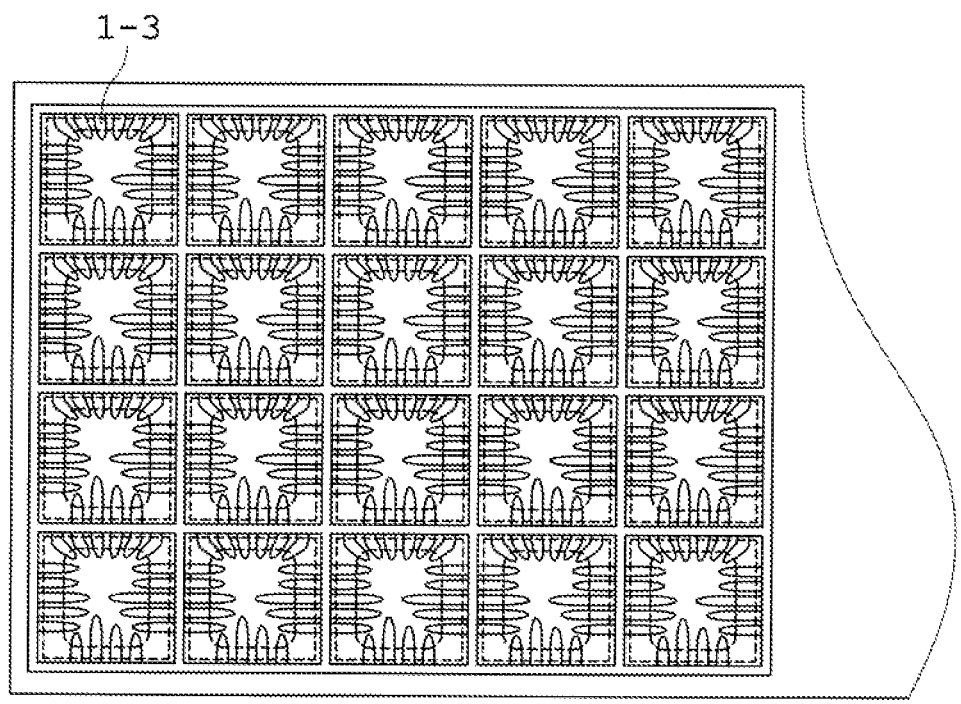
FIG. 18 is a plan view that shows one example of lead frames arrayed in multiple rows according to the fifth embodiment mode of the present invention.

FIGS. 17A-17C are diagrams that show one example of a lead frame according to a fifth embodiment mode of the present invention, where FIG. 17A is a top view, FIG. 17B is a bottom view and FIG. 17C is an explanatory diagram schematically showing the E-E cross section in FIG. 17A. FIG. 18 is a plan view that shows one example of lead frames arrayed in multiple rows according to the fifth embodiment mode of the present invention. FIGS. 19A-19K are explanatory diagrams that show one example of manufacturing procedure for a lead frame for mounting a semiconductor element thereon according to the fifth embodiment mode of the present invention. FIGS. 20A-20E are explanatory diagrams that show one example of manufacturing procedure for a semiconductor package using the lead frame for mounting a semiconductor element thereon according to the fifth embodiment mode of the present invention.

As shown in FIG. 17A, a lead frame 1-3 of this embodiment mode includes a plurality of terminals extending from four sides toward a site on which a semiconductor element is to be mounted. As shown in FIG. 17C, a roughened silver plating layer 11 covering (a) and (b) of a lead frame base 10 made of a copper-based material, where (a) is top faces and (b) is faces that form concavities or through holes between the top faces and bottom faces, and a reinforcing plating layer 11α covering, as an outermost plating layer, an outer surface of acicular projections in the roughened silver plating layer 11 are provided. In FIG. 17C, the reference numeral 10a denotes internal connection terminal portions to be electrically connected to the semiconductor element, the reference numeral 10b denotes external connection terminal portions, and the reference numeral 13 denotes a plating layer for external connection.

The configurations of the roughened silver plating layer 11, the reinforcing plating layer 11α and the base for the roughened silver plating layer 11 are substantially the same as in the lead frame 1-1 of the first embodiment mode.

The lead frame 1-3 of this embodiment mode is provided with the plating layer 13 for external connection composed of nickel, palladium and gold layers laminated in this order on the bottom faces of the lead frame base 10.

The lead frame 1-3 of this embodiment mode is configured so that, as shown in FIG. 18, the individual lead frames 1-3 are arrayed in multiple rows.

Next, one example of manufacturing procedure for the lead frame 1-3 of this embodiment mode will be described in reference to FIGS. 19A-19K.

Figure 19A:
FIGS. 19A-19K are explanatory diagrams that show one example of manufacturing procedure for the lead frame for mounting a semiconductor element thereon according to the fifth embodiment mode of the present invention.

First, a metal plate 10 made of a copper-based material is prepared as a lead frame base (See FIG. 19A).

Figure 19B:
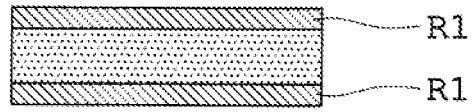

Then, first resist layers R1 are formed on both surfaces of the metal plate 10 (See FIG. 19B).

Figure 19C:
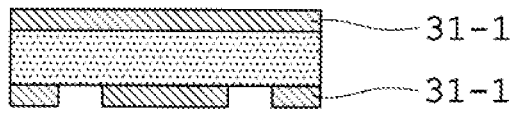

Then, the entire region of the first resist layer R1 on the upper surface side of the metal plate 10 is exposed and developed as well as the first resist layer R1 on the lower surface side of the metal plate 10 is exposed and developed upon use of a glass mask carrying a predetermined pattern corresponding to external connection terminal portions 10b, to form first plating resist masks 31-1 covering the entire region on the upper surface side of the metal plate 10 and having openings at sites corresponding to the external connection terminal portions 10b on the lower surface side of the metal plate 10 (See FIG. 19C).

Figure 19D:
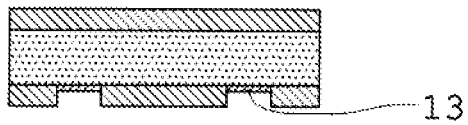
Figure 19E:

Then, upon use of the first plating resist masks 31-1, a nickel plating layer having a thickness of 0.3 to 3 μm, a palladium plating layer having a thickness of 0.005 to 0.1 μm, and a gold plating layer having a thickness of 0.0005 to 0.1 μm are laminated in this order on the lower surface of the metal plate 10 at the sites corresponding to the external connection terminal portions 10b, to form a plating layer 13 for external connection (See FIG. 19D).

Figure 19F:
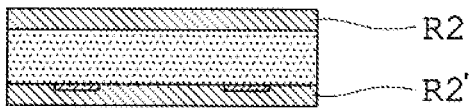

Then, the first plating resist masks 31-1 are removed (See FIG. 19E), a second resist layer R2 having a fast peelability is formed on the upper side of the metal plate 10, and a second resist layer R2' having a slow peelability as taking a pealing time of 5 minutes or so is formed on the lower side of the metal plate 10 (See FIG. 19F).

Figure 19G:
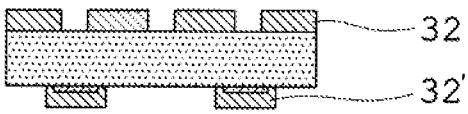

Then, exposure and development are performed upon use of glass masks carrying a pattern corresponding to a predetermined lead frame shape, to form etching resist masks 32 and 32' (See FIG. 19G).

Figure 19H:
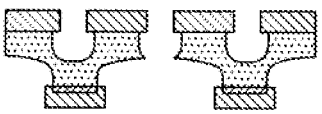
Figure 19I:
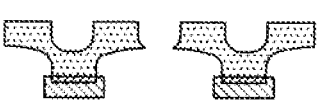

Then, etching is performed on the both sides, to form the predetermined lead frame shape (See FIG. 19H).

Figure 19J:

Then, the etching resist mask 32 on the upper surface side of the metal plate 10 is removed while the etching resist mask 32' on the lower surface side of the metal plate 10 is left without being removed (See FIG. 19I) as a second plating resist mask, upon use of which then a silver plating layer 11 having acicular projections is formed on (a) and (b) of the metal plate 10, where (a) is top faces and (b) is faces that form concavities or through holes between the top faces and the bottom faces, and thereon a reinforcing plating layer 11α is formed, as an outermost plating layer, to cover an outer surface of the acicular projections in the roughened silver plating layer 11 (See FIG. 19J).

Figure 19K:
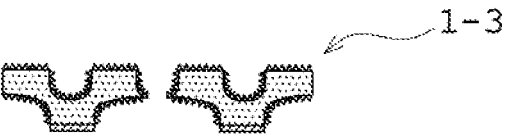

Then, the resist mask 32' on the lower surface side of the metal plate 10 is removed (See FIG. 19K).

Thereby, the lead frame 1-3 of this embodiment mode is completed.

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode Next, one example of manufacturing procedure for a semiconductor package using the lead frame 1-3 of this embodiment mode will be described in reference to FIGS. 20A-20E.

Figure 20A:
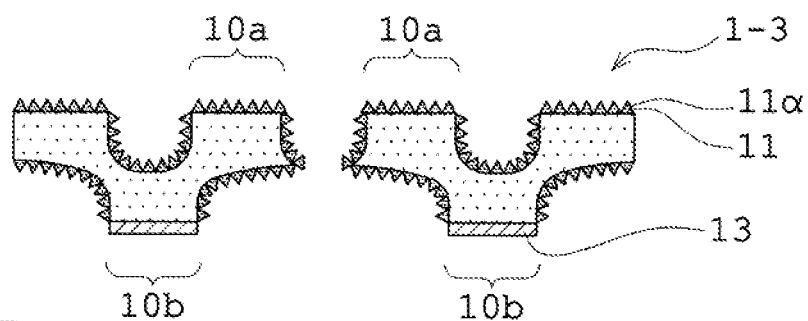
FIGS. 20A-20E are explanatory diagrams that show one example of manufacturing procedure for a semiconductor package using the lead frame for mounting a semiconductor element thereon according to the fifth embodiment mode of the present invention.

First, the lead frame 1-3 manufactured in accordance with the manufacturing procedure shown in FIGS. 19A-19M is prepared (See FIG. 20A).

Figure 20B:
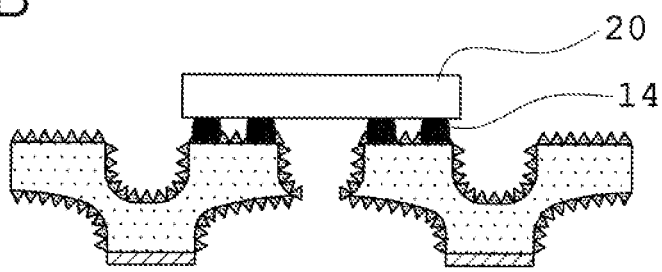
Figure 20C:
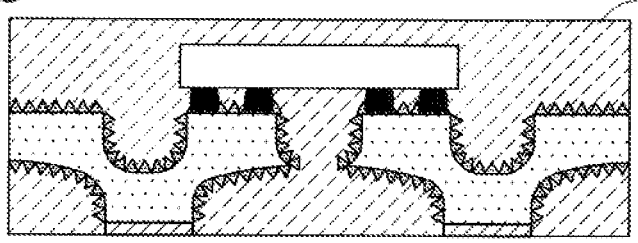
Figure 20D:
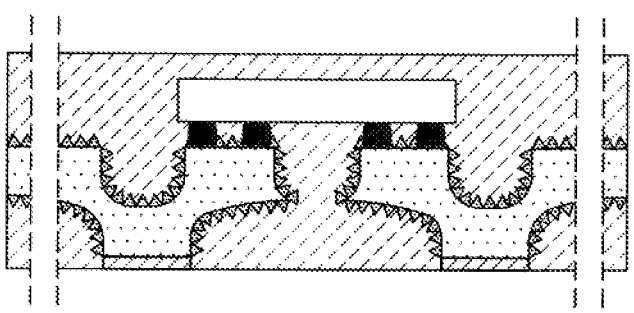

After that, mounting of a semiconductor element 20 via solder 14, resin sealing, and singulation of individual semiconductor packages are carried out substantially in the same manner as in the manufacturing procedure for a semiconductor package using the lead frame of the first embodiment mode (See FIG. 20B through FIG. 20D).

Figure 20E:
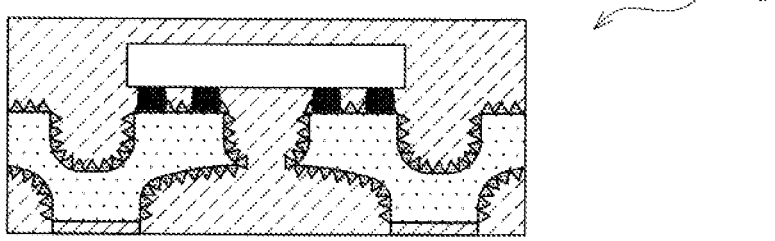

Thereby a semiconductor package 2-3 using the lead frame 1-3 of this embodiment mode is obtained (See FIG. 20E).

Figure 21A:
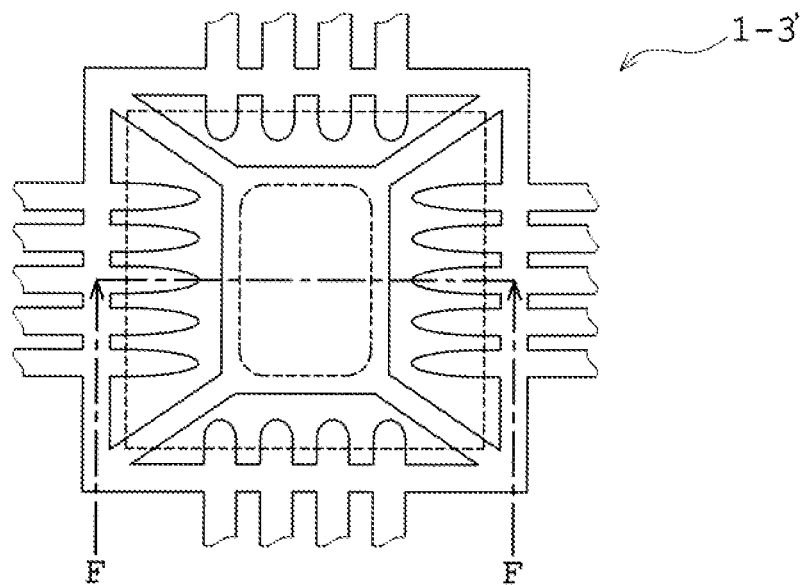
FIGS. 21A-21C are diagrams that show one example of lead frame according to a sixth embodiment mode of the present invention, where
Figure 21B:
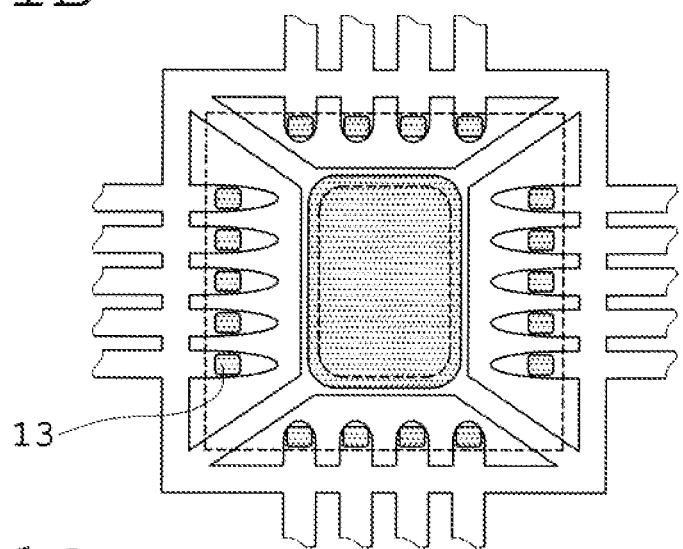
Figure 21C:
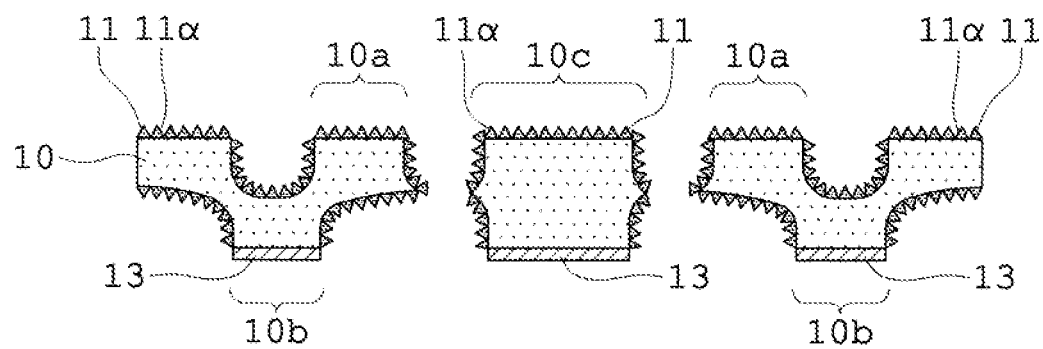
Figure 22:
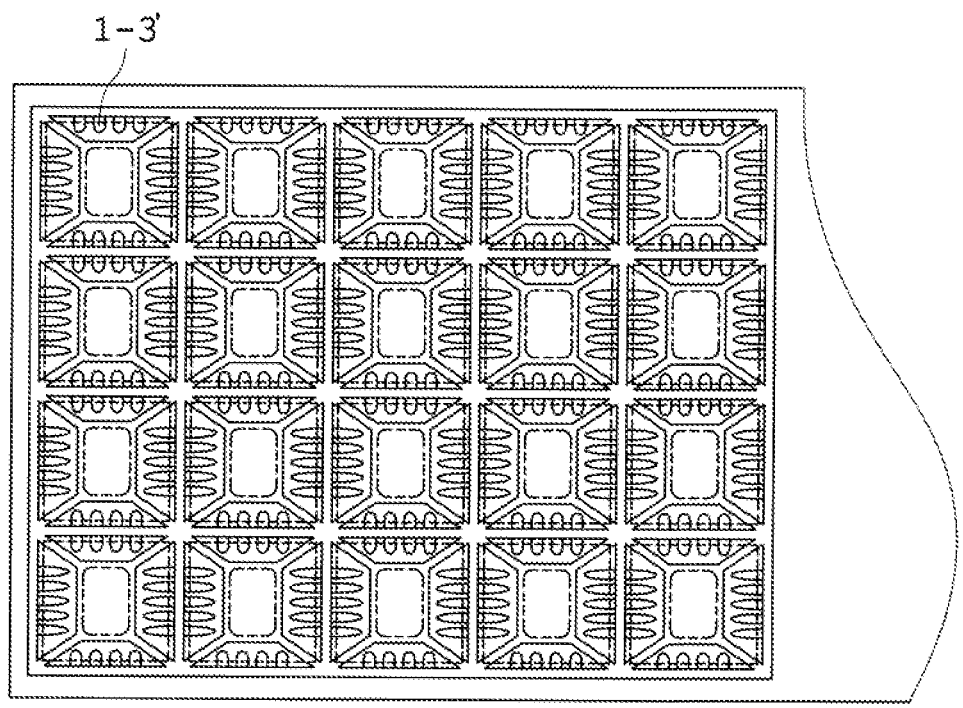
FIG. 22 is a plan view that shows one example of lead frames arrayed in multiple rows according to the sixth embodiment mode of the present invention.

FIGS. 21A-21C are diagrams that show one example of a lead frame according to a sixth embodiment mode of the present invention, where FIG. 21A is a top view, FIG. 21B is a bottom view and FIG. 21C is an explanatory diagram schematically showing the F-F cross section in FIG. 21A. FIG. 22 is a plan view that shows one example of lead frames arrayed in multiple rows according to the sixth embodiment mode of the present invention. FIGS. 23A-23K are explanatory diagrams that show one example of manufacturing procedure for a lead frame for mounting a semiconductor element thereon according to the sixth embodiment mode of the present invention. FIGS. 24A-24E are explanatory diagrams that show one example of manufacturing procedure for a semiconductor package using the lead frame for mounting a semiconductor element thereon according to the sixth embodiment mode of the present invention.

As shown in FIGS. 21A-21C, a lead frame 1-3' of this embodiment mode includes a pad portion 10c for mounting a semiconductor element thereon and a plurality of terminals extending from four sides toward the pad portion 10c. As shown in FIG. 21C, a roughened silver plating layer 11 covering (a) and (b) of a lead frame base 10 made of a copper-based material, where (a) is top faces and (b) is faces that form concavities or through holes between the top faces and bottom faces, and a reinforcing plating layer 11α covering, as an outermost surface, an outer surface of acicular projections in the roughened silver plating layer 11. In FIG. 21C, the reference numeral 10a denotes internal connection terminal portions to be electrically connected to the semiconductor element, the reference numeral 10b denotes external connection terminal portions, and the reference numeral 13 denotes a plating layer for external connection.

The configurations of the roughened silver plating layer 11, the reinforcing plating layer 11α and the base for the roughened silver plating layer 11 are substantially the same as in the lead frame 1-1 of the first embodiment mode.

The lead frame 1-3' of this embodiment mode is provided with the plating layer 13 for external connection composed of nickel, palladium and gold layers laminated in this order on the bottom faces of the lead frame base 10.

The lead frame 1-3 of this embodiment mode is configured so that, as shown in FIG. 22, the individual lead frames 1-3' are arrayed in multiple rows.

Next, one example of manufacturing procedure for the lead frame 1-3' of this embodiment mode will be described in reference to FIGS. 23A-23K.

The manufacturing procedure for the lead frame 1-3' of this embodiment mode is substantially the same as the manufacturing procedure for the lead frame 1-3 of the fifth embodiment mode shown in FIGS. 19A-19F (See FIG. 23A through FIG. 23M).

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, one example of manufacturing procedure for a semiconductor package using the lead frame 1-3' of this embodiment mode will be described in reference to FIGS. 24A-24E.

Figure 23A:
FIGS. 23A-23K are explanatory diagrams that show one example of manufacturing procedure for the lead frame for mounting a semiconductor element thereon according to the sixth embodiment mode of the present invention.
Figure 23B:
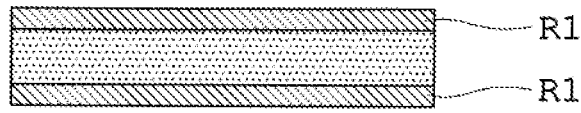
Figure 23C:
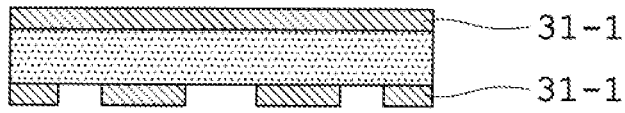
Figure 23D:
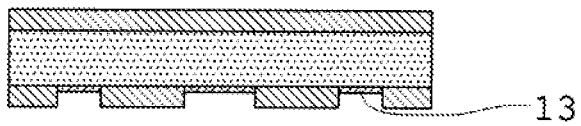
Figure 23E:
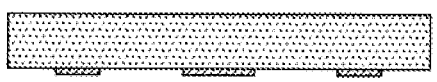
Figure 23F:
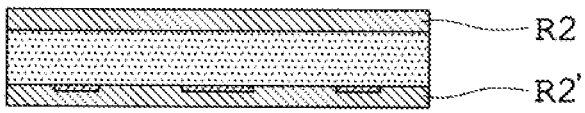
Figure 23G:
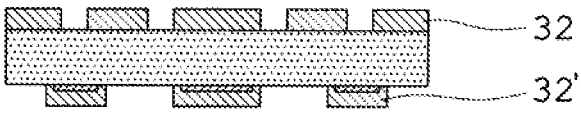
Figure 23H:
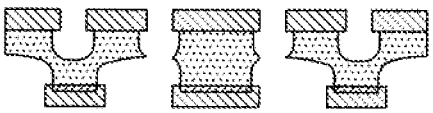
Figure 23I:
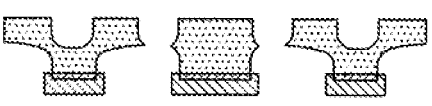
Figure 23J:
Figure 23K:
Figure 24A:
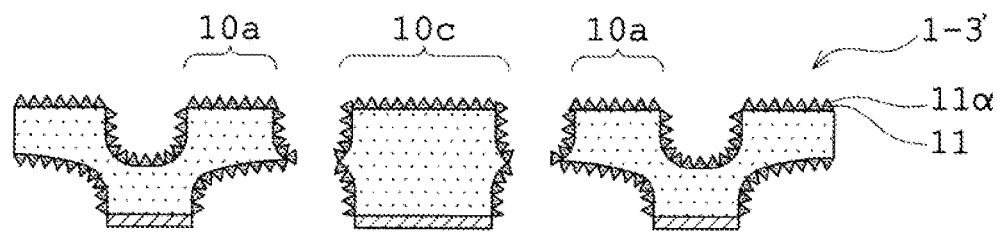
FIGS. 24A-24E are explanatory diagrams that show one example of manufacturing procedure for a semiconductor package using the lead frame for mounting a semiconductor element thereon according to the sixth embodiment mode of the present invention.

First, the lead frame 1-3' manufactured in accordance with the manufacturing procedure shown in FIGS. 23A-23M is prepared (See FIG. 24A).

Figure 24B:
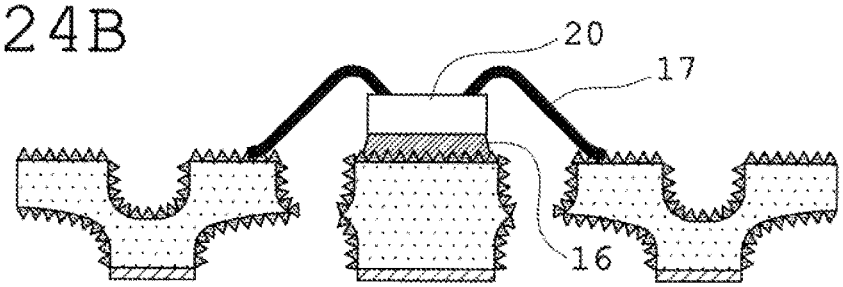
Figure 24C:
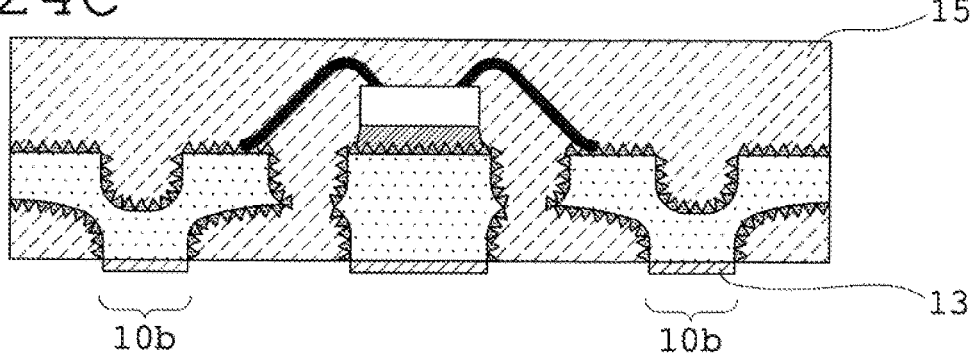
Figure 24D:
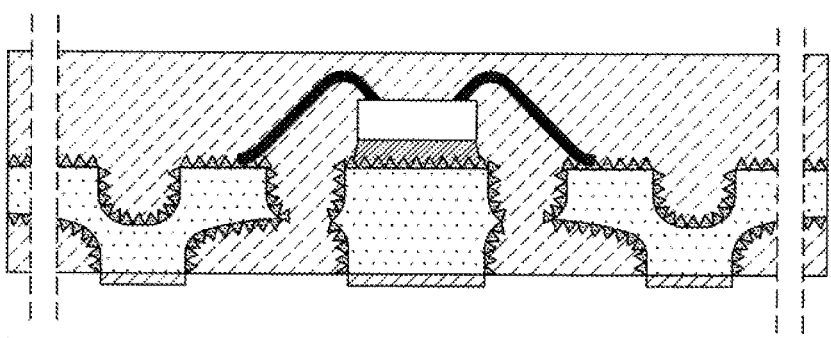

After that, mounting of a semiconductor element 20 via a die bond 16, wire bonding, resin sealing, and singulation of individual semiconductor packages are carried out substantially in the same manner as in the manufacturing procedure for a semiconductor package using the lead frame of the second embodiment mode (See FIG. 24B through FIG. 24D).

Figure 24E:
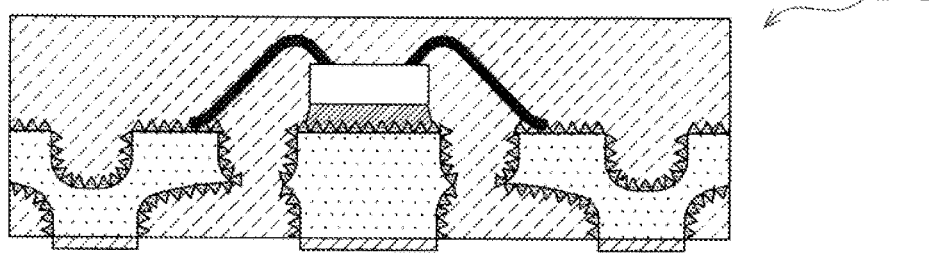

Thereby a semiconductor package 2-3' using the lead frame 1-3' of this embodiment mode is obtained (See FIG. 24E).

Seventh Embodiment Mode

Figure 25A:
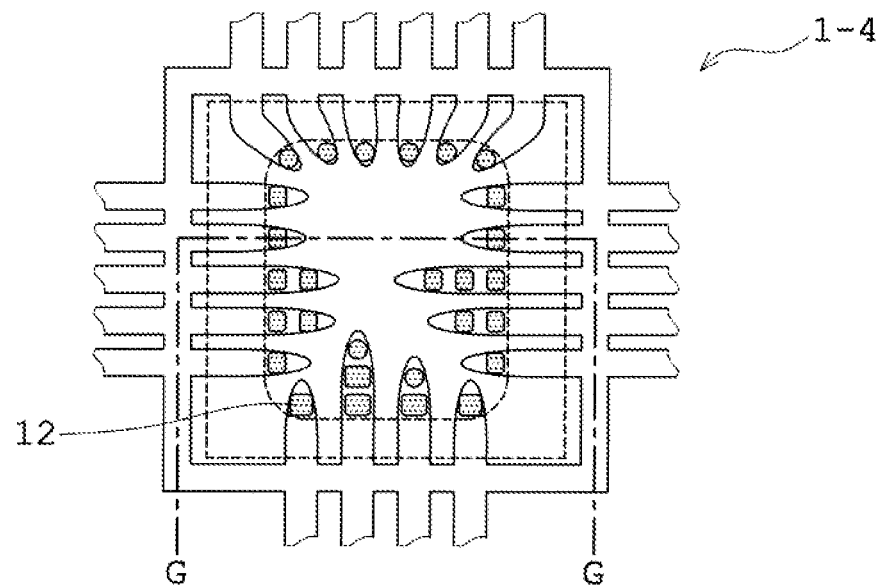
FIGS. 25A-25C are diagrams that show one example of lead frame according to a seventh embodiment mode of the present invention, where
Figure 25B:
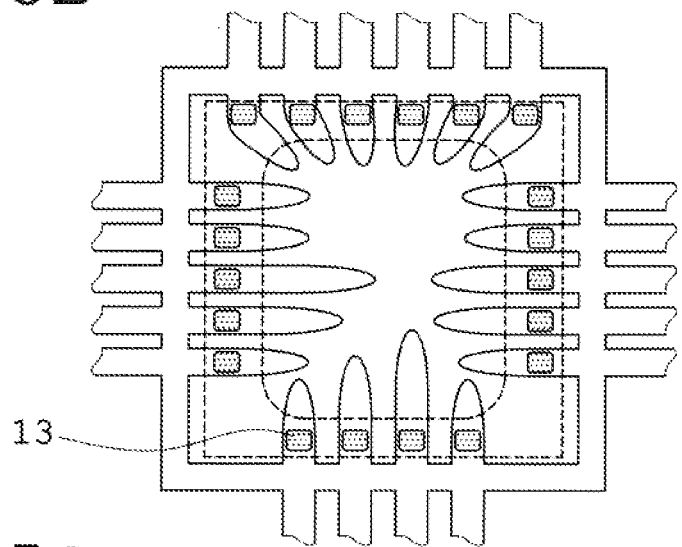
Figure 25C:
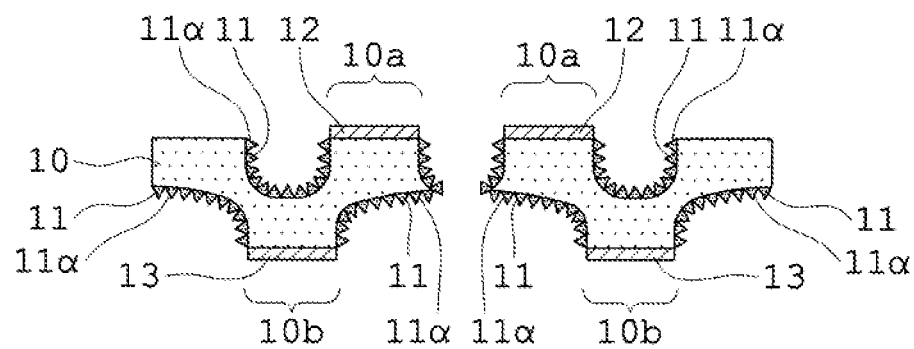
Figure 26:
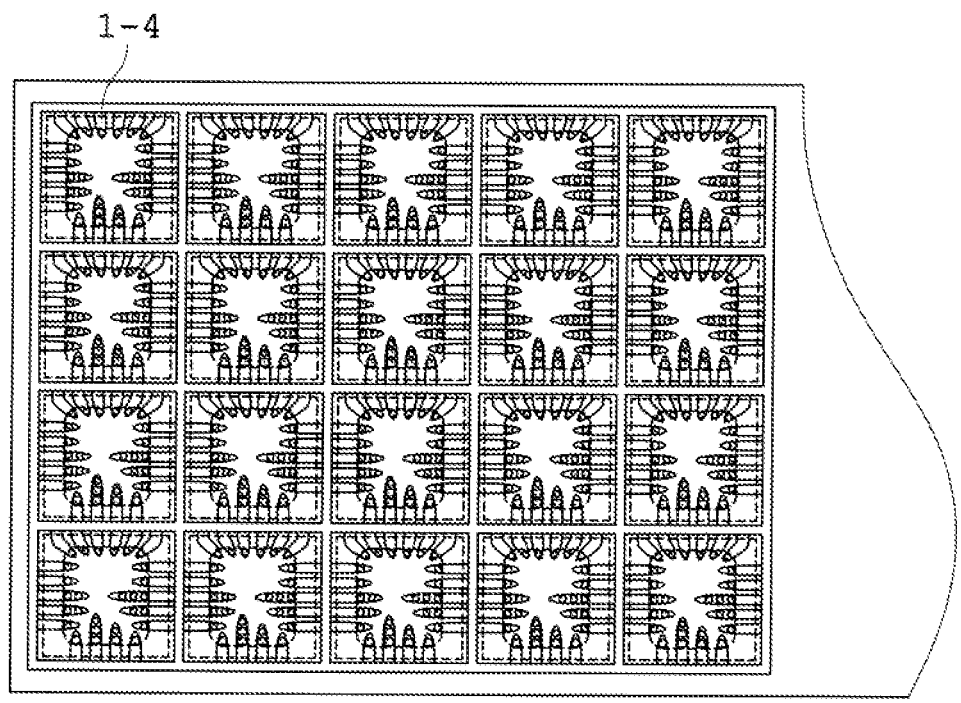
FIG. 26 is a plan view that shows one example of lead frames arrayed in multiple rows according to the seventh embodiment mode of the present invention.

FIGS. 25A-25C are diagrams that show one example of a lead frame according to a seventh embodiment mode of the present invention, where FIG. 25A is a top view, FIG. 25B is a bottom view and FIG. 25C is an explanatory diagram schematically showing the G-G cross section in FIG. 25A. FIG. 26 is a plan view that shows one example of lead frames arrayed in multiple rows according to the seventh embodiment mode of the present invention. FIGS. 27A-27H to FIGS. 27I-27J and FIGS. 27A-27H to FIGS. 27H2-27J' are explanatory diagrams that show one example and another example of manufacturing procedure for a lead frame for mounting a semiconductor element thereon according to the seventh embodiment mode of the present invention. FIGS. 28A-28E and FIGS. 28A'-28E' are explanatory diagrams that show one example and another example of manufacturing procedure for a semiconductor package using the lead frame for mounting a semiconductor element thereon according to the seventh embodiment mode of the present invention.

As shown in FIG. 25A, a lead frame 1-4 of this embodiment mode includes a plurality of terminals extending from four sides toward a site on which a semiconductor element is to be mounted. As shown in FIG. 25C, a roughened silver plating layer 11 covering faces of a lead frame base 10 that form concavities or through holes between top faces and bottom faces of the lead frame base 10 made of a copper-based material and a reinforcing plating layer 11α covering, as an outermost plating layer, an outer surface of acicular projections in the roughened silver plating layer 11 are provided. In FIG. 25C, the reference numeral 10a denotes internal connection terminal portions to be electrically connected to the semiconductor element, the reference numeral 10b denotes external connection terminal portions, the reference numeral 12 denotes a plating layer for internal connection, and the reference numeral 13 denotes a plating layer for external connection.

The configurations of the roughened silver plating layer 11, the reinforcing plating layer 11α and the base for the roughened silver plating layer 11 are substantially the same as in the lead frame 1-1 of the first embodiment mode.

Also, in the lead frame 1-4 of this embodiment mode, the lead frame base 10 is provided with a plating layer 12 for internal connection at sites corresponding to the internal connection terminal portions 10a on the top faces and a plating layer 13 for external connection on the bottom faces.

Each of the plating layer 12 for internal connection and the plating layer 13 for external connection is composed of nickel, palladium and gold layers laminated in this order.

The lead frame 1-4 of this embodiment mode is configured so that, as shown in FIG. 26, the individual lead frames 1 are arrayed in multiple rows.

Next, one example and another example of manufacturing procedure for the lead frame 1 of this embodiment mode will be described in reference to FIGS. 27A-27H to FIGS. 27I-27J and FIGS. 27A-27H to FIGS. 27H2-27J'.

Figure 27A:
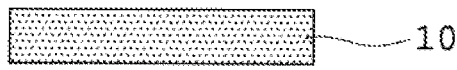

First, a metal plate 10 made of a copper-based material is prepared as a lead frame base (See FIG. 27A).

Figure 27B:
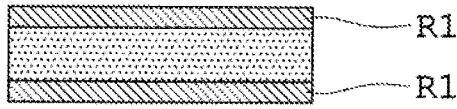

Then, first resist layers R1 are formed on both surfaces of the metal plate 10 (See FIG. 27B).

Figure 27C:

Then, the first resist layer R1 on the upper surface side of the metal plate 10 is exposed and developed upon use of a glass mask carrying a predetermined pattern corresponding to internal connection terminal portions 10a as well as the first resist layer R1 on the lower surface side of the metal plate 10 is exposed and developed upon use of a glass mask carrying a predetermined pattern corresponding to external connection terminal portions 10b, to form first plating resist masks 31-1 having openings at sites corresponding to the internal connection terminal portions 10a on the upper surface side of the metal plate 10 and openings at sites corresponding to the external connection terminal portions 10b on the lower surface side of the metal plate 10, respectively (See FIG. 27C).

Figure 27D:
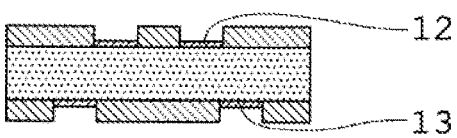
Figure 27E:
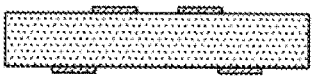

Then, upon use of the first plating resist masks 31-1, a nickel plating layer having a thickness of 0.3 to 3 μm, a palladium plating layer having a thickness of 0.005 to 0.1 μm, and a gold plating layer having a thickness of 0.0005 to 0.1 μm are made to laminate the metal plate 10 in this order at the sites corresponding to the internal connection terminal portions 10a on the upper surface side and at the sites corresponding to the external connection terminal portions 10b on the lower surface side, to form a plating layer 12 for internal connection and a plating layer 13 for external connection (See FIG. 27D).

Figure 27F:
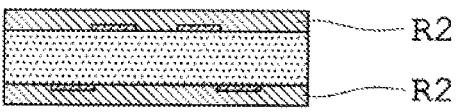

Then, the first plating resist masks 31-1 are removed (See FIG. 27E), and second resist layers R2 are formed on the both sides of the metal plate 10 (See FIG. 27F).

Figure 27G:

Then, exposure and development are performed upon use of glass masks carrying a pattern corresponding to a predetermined lead frame shape, to form etching resist masks 32 (See FIG. 27G).

Figure 27H:
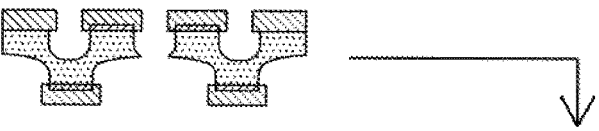

Then, etching is performed on the both sides, to form the predetermined lead frame shape (See FIG. 27H).

Figure 27I:
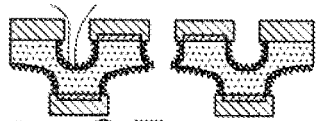
Figure 27I:
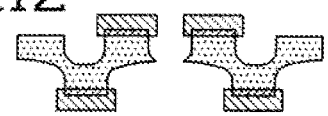

Then, upon use of the etching resist masks 32 on the both sides of the metal plate 10 as second plating resist masks, a silver plating layer 11 having acicular projections is formed on faces of the metal plate 10 that form concavities or through holes between top faces and bottom faces of the metal plate 10, and thereon a reinforcing plating layer 11α is formed, as an outermost plating layer, to cover the outer surface of acicular projections in the roughened silver plating layer 11 (See FIG. 27I).

Figure 27J:
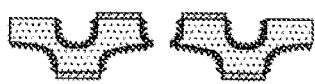
Figure 27J:
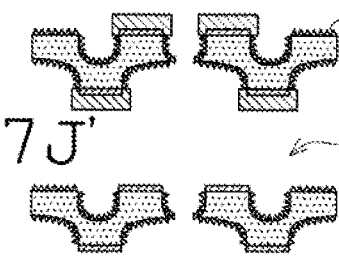

Then, the resist masks 32 are removed (See FIG. 27J).

Thereby, the lead frame 1-4 of this embodiment mode is completed.

In the lead frame 1-4 manufactured in accordance with the procedure described above and shown in FIGS. 27A-27J, the roughened silver plating layer 11 having acicular projections is formed to cover only the faces that form concavities or through holes between the top and bottom faces of the lead frame base. According to the lead frame 1-4 of this embodiment mode, however, the roughened silver plating layer 11 may be formed to additionally cover sites on the top faces of the lead frame base 10 except the internal connection terminal portions 10a.

Such a type of lead frame 1 can be manufactured in the following procedure.

The steps from preparation of a metal plate 10 (See FIG. 27A) up to formation of second resist layers R2 on both sides of the metal plate 10 (See FIG. 27F) are the same as the above-described manufacturing procedure.

Then, upon use of an upper-side glass mask that carries a pattern in which light shield material has a higher concentration at portions corresponding to sites other than the internal connection terminal portions 10a on the top faces of the lead frame base 10 than at portions corresponding to the internal connection terminal portions 10a on the top faces of the lead frame base 10 and upon use of a lower-side glass mask that carries a pattern in which light shield material has substantially as high a concentration at portions corresponding to the external connection terminal portions 10b as at the portions on the upper-side glass mask corresponding to the internal connection terminal portions 10a on the top faces of the lead frame base 10, exposure and development are performed, to form etching resist masks 32 (See FIG. 27G). In this situation, the etching resist mask 32 formed on the upper surface side of the metal plate 10 is such that the portions corresponding to the sites other than the internal connection terminal portions 10a on the top faces of the lead frame base 10 have been subjected smaller amount of exposure than the portions corresponding to the internal connection terminal portions 10a, and thus present faster peelability in the resist stripping solution.

Then, the both sides are etched to form a predetermined lead frame shape (See FIG. 27H).

Then, of the etching resist masks 32 on the both sides of the metal plate 10, the portions of the upper-side etching resist mask 32 corresponding to the sites other than the internal connection terminal portions 10a on the top faces of the lead frame base 10 are removed while the portions of the upper-side etching resist mask 32 corresponding to the internal connection terminal portions 10a and the lower-side etching resist mask 32 are left without being removed (See FIG. 27H2).

Then, upon use of the etching resist masks 32 on the both sides of the metal plate 10 as second plating resist masks, a silver plating layer 11 having acicular projections is formed on the sites other than the internal connection terminal portions 10a on the top faces of the lead frame base 10 and on the faces that form concavities or through holes between the top faces and the bottom faces of the lead frame base 10, and thereon a reinforcing plating layer 11α is formed, as an outermost plating layer, to cover the outer surface of the acicular projections in the roughened silver plating layer 11 (See FIG. 27I').

Then, the resist masks 32 are removed (See FIG. 27J').

Thereby, a lead frame 1-4 of another example of this embodiment mode is completed as having the roughened silver plating layer 11 with acicular projections formed not only on the faces that form concavities or through holes between the top faces and bottom faces of the lead frame base 10 but also on the top faces of the lead frame base 10 except at the internal connection terminal portions 10*a*.

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, one example of manufacturing procedure for a semiconductor package using the lead frame 1-4 of this embodiment mode will be described in reference to FIGS. 28A-28E.

Figure 28A:
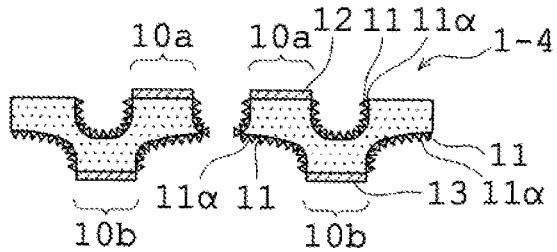
FIGS. 28A-28E and FIGS. 28A'-28E' are explanatory diagrams that show one example and another example of manufacturing procedure for a semiconductor package using the lead frame for mounting a semiconductor element thereon according to the seventh embodiment mode of the present invention.
Figure 28A:
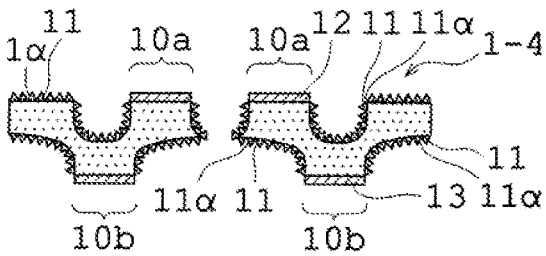

First, the lead frame 1-4 manufactured in accordance with the manufacturing procedure shown in FIGS. 27A-27J is prepared (See FIG. 28A).

Figure 28B:
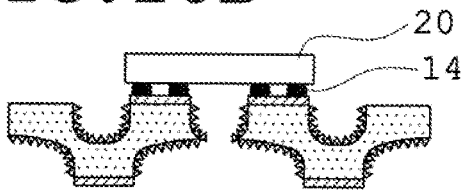
Figure 28B:
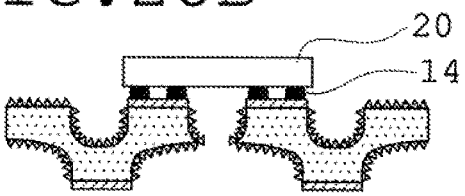
Figure 28C:
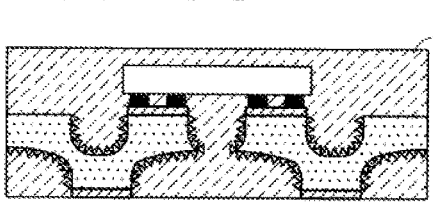
Figure 28C:
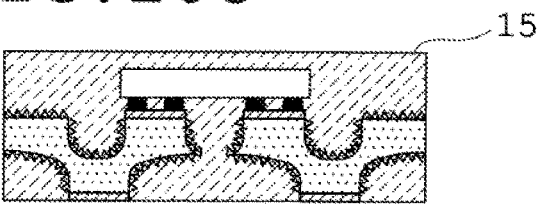
Figure 28D:
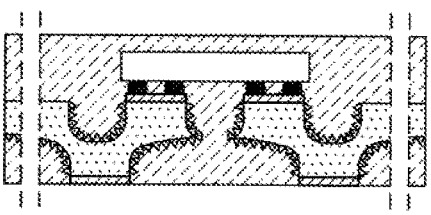
Figure 28D:
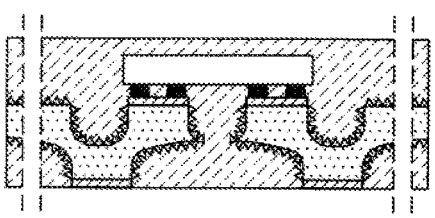

After that, mounting of a semiconductor element 20 via solder 14, resin sealing, and singulation of individual semiconductor packages are carried out substantially in the same manner as in the manufacturing procedure for a semiconductor package using the lead frame of the first embodiment mode (See FIG. 28B through FIG. 28D).

Figure 28E:
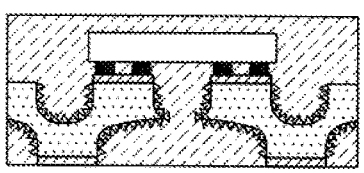
Figure 28E:
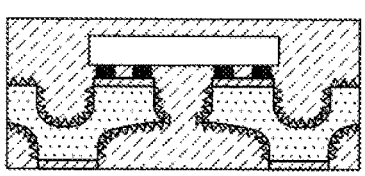

Thereby, a semiconductor package 2-4 using the lead frame 1-4 of this embodiment mode is obtained (See FIG. 28E).

A semiconductor package 2-4 using the lead frame 1-4 of another example of this embodiment mode manufactured in accordance with the procedure shown in FIG. 27A through FIG. 27H, FIG. 27H2, FIG. 27I' and FIG. 27J' can be obtained by substantially the same procedure as described above (See FIGS. 28A' to 28E').

Eighth Embodiment Mode

Figure 29A:
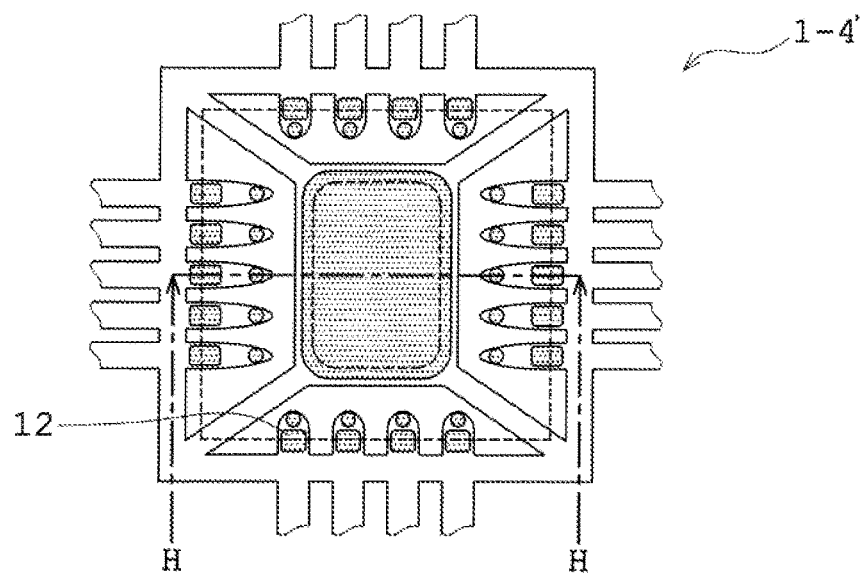
FIGS. 29A-29C are diagrams that show one example of a lead frame according to an eighth embodiment mode of the present invention, where
Figure 29B:
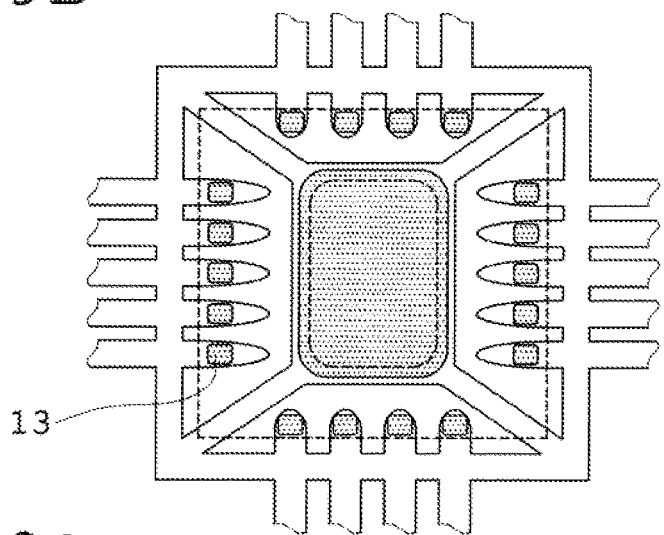
Figure 29C:
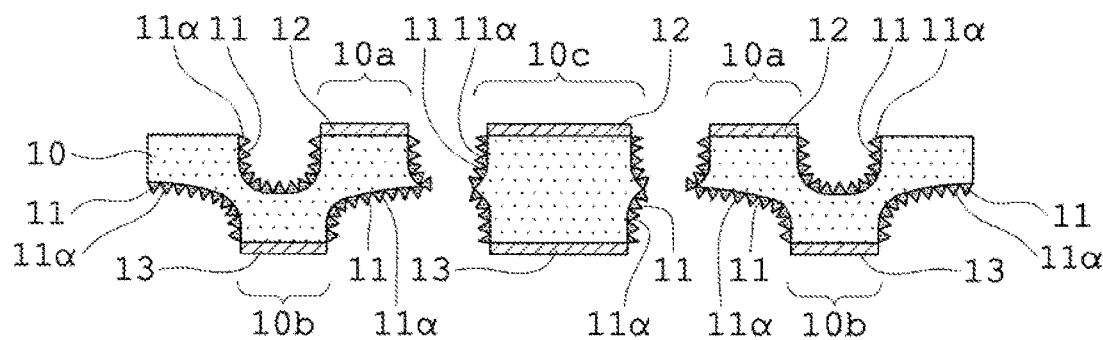
Figure 30:
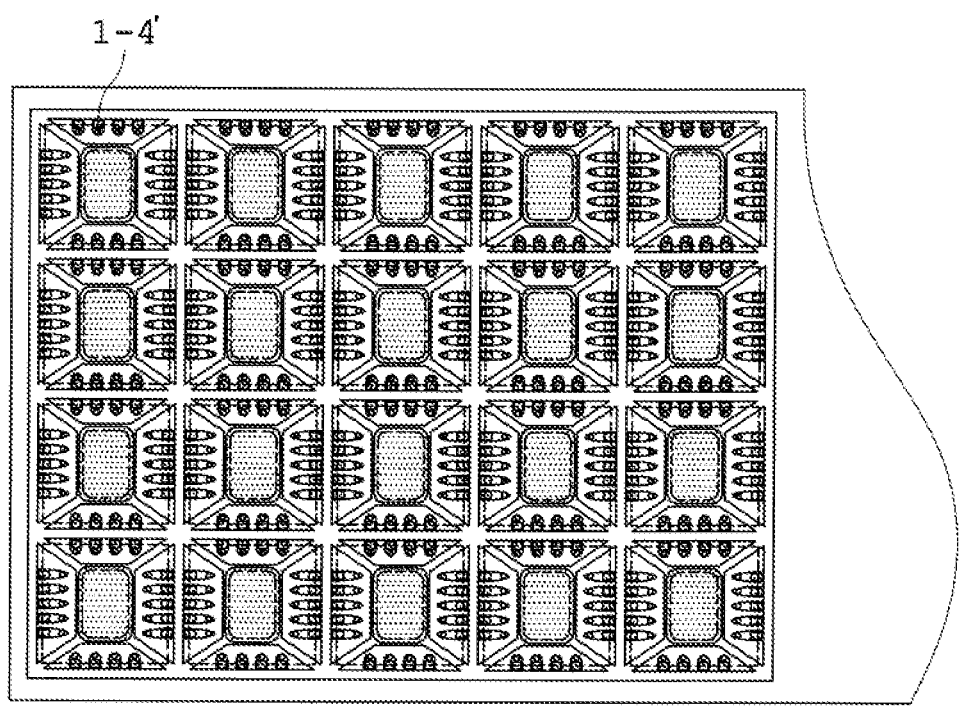
FIG. 30 is a plan view that shows one example of lead frames arrayed in multiple rows according to the eighth embodiment mode of the present invention.

FIGS. 29A-29C are diagrams that show one example of a lead frame according to an eighth embodiment mode of the present invention, where FIG. 29A is a top view, FIG. 29B is a bottom view and FIG. 29C is an explanatory diagram schematically showing the H-H cross section in FIG. 29A. FIG. 30 is a plan view that shows one example of lead frames arrayed in multiple rows according to the eighth embodiment mode of the present invention. FIGS. 31A-31H to FIGS. 31I-31J and FIGS. 31A-31H to FIGS. 31H2-31J' are explanatory diagrams that show one example and another example of manufacturing procedure for a lead frame for mounting a semiconductor element thereon according to the eighth embodiment mode of the present invention. FIGS. 32A-32E and FIGS. 32A'-32E' are explanatory diagrams that show one example of manufacturing procedure for a semiconductor package using the lead frame for mounting a semiconductor element thereon according to the eighth embodiment mode of the present invention.

As shown in FIGS. 29A-29C, a lead frame 1-4' of this embodiment mode includes a pad portion 10*c* for mounting a semiconductor element thereon and a plurality of terminals extending from four sides toward the pad portion 10*c*. As shown in FIG. 29C, a roughened silver plating layer 11 covering faces of the lead frame base 10 that form concavities or through holes between top faces and bottom faces of a lead frame base 10 made of a copper-based material and a reinforcing plating layer 10α covering, as an outermost plating layer, an outer surface of acicular projections in the roughened silver plating layer 11 are provided. In FIG. 29C, the reference numeral 10*a* denotes internal connection terminal portions to be electrically connected to the semiconductor element, the reference numeral 10*b* denotes external connection terminal portions, the reference numeral 12 denotes a plating layer for internal connection, and the reference numeral 13 denotes a plating layer for external connection.

The configurations of the roughened silver plating layer 11, the reinforcing plating layer 11α and the base for the roughened silver plating layer 11 are substantially the same as in the lead frame 1-1 of the first embodiment mode.

Also, in the lead frame 1-4' of this embodiment mode, the lead frame base 10 is provided with a plating layer 12 for internal connection at sites corresponding to the internal connection terminal portions 10*a* on the top faces and a plating layer 13 for external connection on the bottom faces.

Each of the plating layer 12 for internal connection and the plating layer 13 for external connection is composed of nickel, palladium and gold layers laminated in this order.

The lead frame 1-4' of this embodiment mode is configured so that, as shown in FIG. 30, the individual lead frames 1-4' are arrayed in multiple rows.

Next, one example of manufacturing procedure for the lead frame 1-4' of this embodiment mode will be described.

Figure 31A:
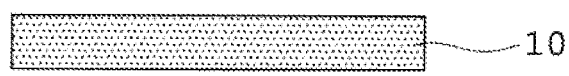
Figure 31B:
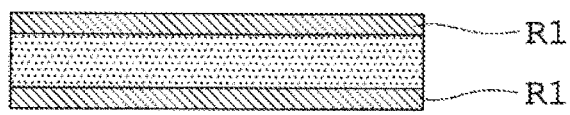
Figure 31C:
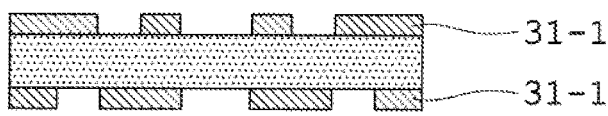
Figure 31D:
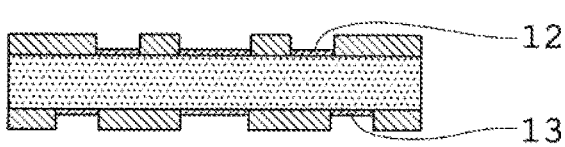
Figure 31E:
Figure 31F:
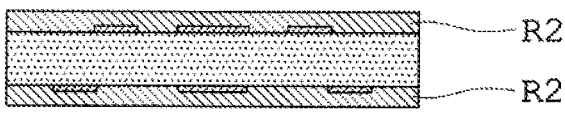
Figure 31G:
Figure 31H:
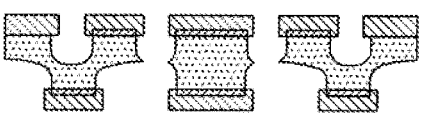
Figure 31J:

The manufacturing procedure for the lead frame 1-4' of this embodiment mode is substantially the same as the manufacturing procedure for the lead frame 1-4 of the seventh embodiment mode shown in FIGS. 27A-27H to FIGS. 27I-27J, and FIGS. 27A-27H to FIGS. 27H2-27J' (See FIG. 31A through FIG. 31I, See FIG. 31A through FIG. 31H, FIG. 31H2, FIG. 31I', and FIG. 31J').

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, one example of manufacturing procedure for a semiconductor package using the lead frame 1-4' of this embodiment mode will be described in reference to FIGS. 32A-32E.

Figure 32A:
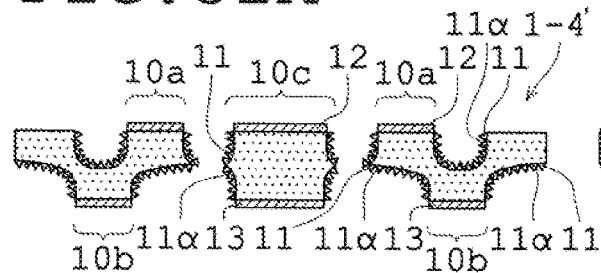
FIGS. 32A-32E and FIGS. 32A'-32E' are explanatory diagrams that show one example and another example of manufacturing procedure for a semiconductor package using the lead frame for mounting a semiconductor element thereon according to the eighth embodiment mode of the present invention.
Figure 32A:
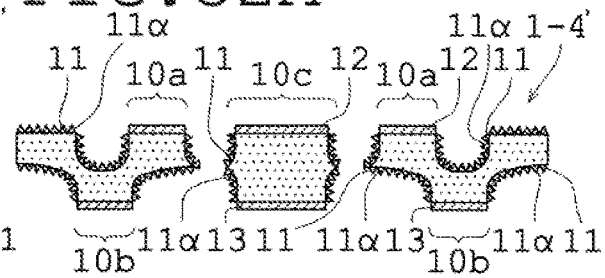

First, the lead frame 1-4' manufactured in accordance with the manufacturing procedure shown in FIGS. 31A-31J is prepared (See FIG. 32A).

Figure 32B:
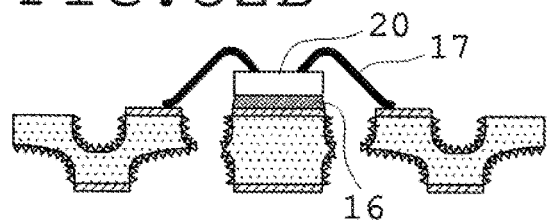
Figure 32B:
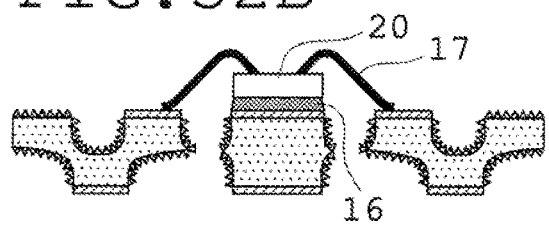
Figure 32C:
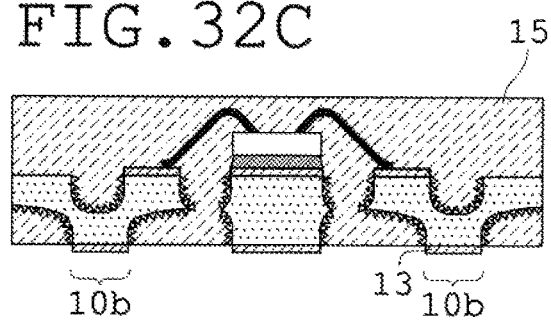
Figure 32C:
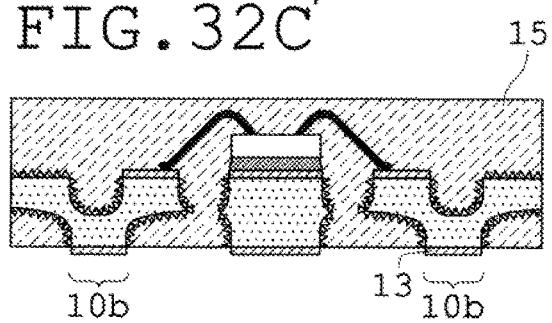
Figure 32D:
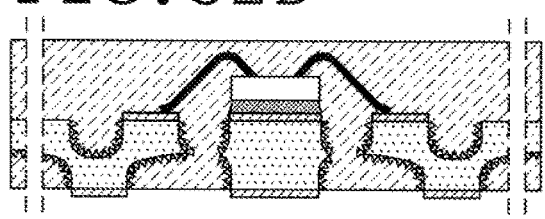
Figure 32D:
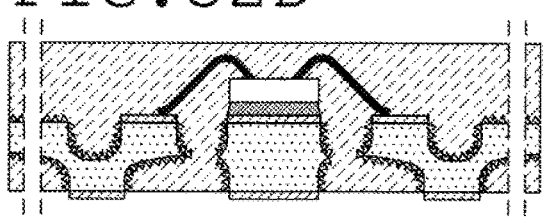

After that, mounting of a semiconductor element 20 via a die bond 16, wire bonding, resin sealing, and singulation of individual semiconductor packages are carried out substantially in the same manner as in the manufacturing procedure for a semiconductor package using the lead frame of the second embodiment mode (See FIG. 32B through FIG. 32D).

Figure 32E:
Figure 32E:
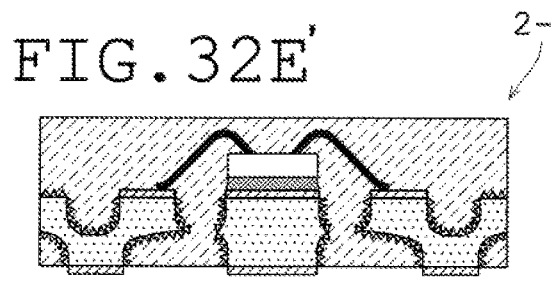

Thereby a semiconductor package 2-4' using the lead frame 1-4' of this embodiment mode is obtained (See FIG. 32E).

A semiconductor package 2-4' using a lead frame 1-4' of another example of this embodiment mode manufactured in accordance with the procedure shown in FIG. 31A through FIG. 31H, FIG. 31H2, FIG. 31I' and FIG. 31J' can be obtained by substantially the same procedure as described above (See FIG. 32A' through FIG. 32E').

Ninth Embodiment Mode

Figure 33A:
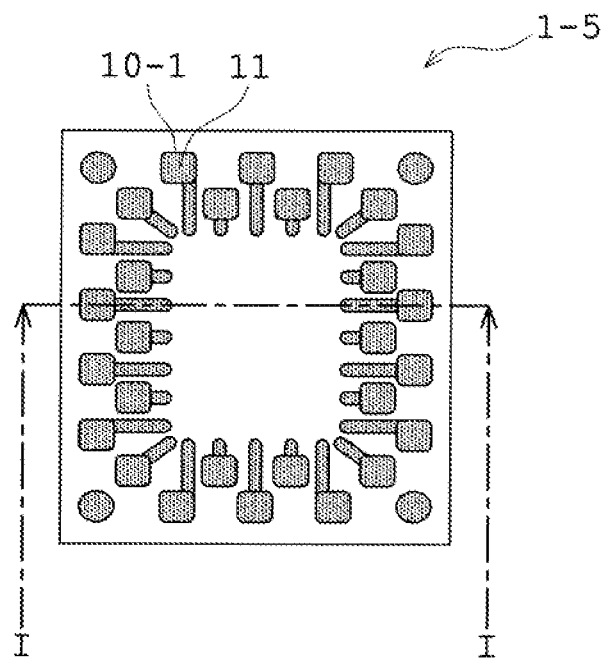
FIGS. 33A-33C are diagrams that show one example of substrate for mounting a semiconductor element thereon according to a ninth embodiment mode of the present invention, where
Figure 33B:
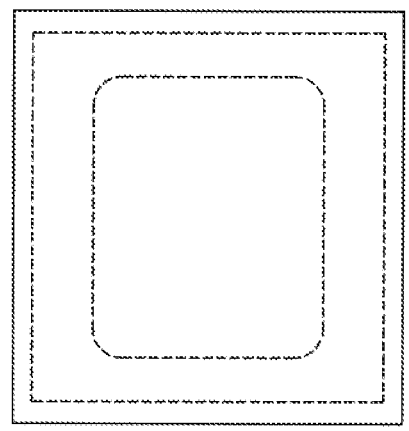
Figure 33C:
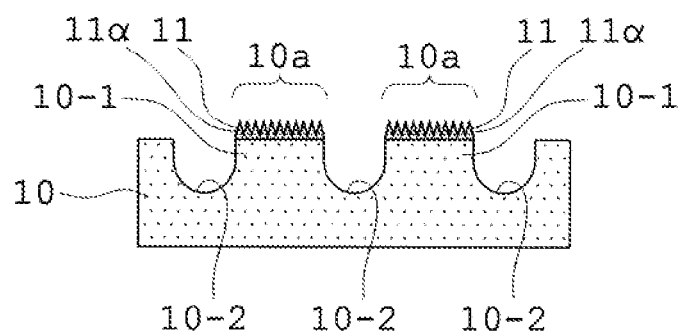
Figure 34:
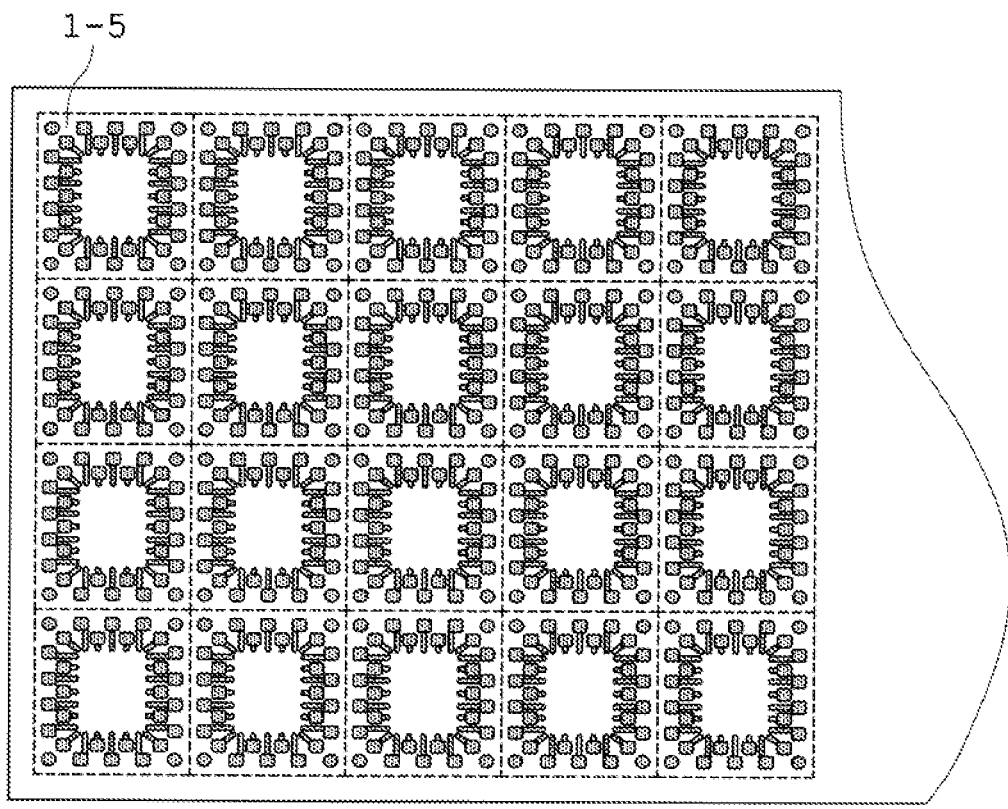
FIG. 34 is a plan view that shows one example of substrates for mounting semiconductor elements thereon arrayed in multiple rows according to the ninth embodiment mode of the present invention.

FIGS. 33A-33C are diagrams that show one example of substrate for mounting a semiconductor element thereon according to a ninth embodiment mode of the present invention, where FIG. 33A is a top view, FIG. 33B is a bottom view and FIG. 33C is an explanatory diagram schematically showing the I-I cross section in FIG. 33A. FIG. 34 is a plan view that shows one example of substrates for mounting semiconductor elements thereon arrayed in multiple rows according to the ninth embodiment mode of the present invention. FIGS. 35A-35I are explanatory diagrams that show one example of manufacturing procedure for the substrate for mounting a semiconductor element thereon according to the ninth embodiment mode of the present invention. FIGS. 36A-36F are explanatory diagrams that show one example of manufacturing procedure for a semiconductor package using the substrate for mounting a semiconductor element thereon according to the ninth embodiment mode of the present invention.

As shown in FIG. 33A, a substrate 1-5 for mounting a semiconductor element thereon of this embodiment mode is provided with a plurality of columnar terminal portions 10-1 extending from four sides toward a site on which a semiconductor element is to be mounted, and, as shown in FIG. 33C, a roughened silver plating layer 11 covering top faces of the columnar terminal portions 10-1 and a reinforcing plating layer 11α covering, as an outermost plating layer, an outer surface of acicular projections in the roughened silver plating layer 11 are provided. The columnar terminal portions 10-1 are defined by concavities 10-2 provided on the upper surface of a metal plate 10 formed of a copper-based material. In FIG. 33C, the reference numeral 10a denotes internal connection terminal portions to be electrically connected with the semiconductor element.

The configurations of the roughened silver plating layer 11, the reinforcing plating layer 11α and the base for the roughened silver plating layer 11 are substantially the same as in the lead frame 1-1 of the first embodiment mode.

The substrate 1-5 for mounting a semiconductor element thereon of this embodiment mode is configured so that, as shown in FIG. 34, the individual substrates 1-5 for mounting semiconductor elements thereon are arrayed in multiple rows.

Next, an example of manufacturing procedure for the substrate 1-5 for mounting a semiconductor element thereon of this embodiment mode will be described in reference to FIGS. 35A-35I.

Figure 35A:
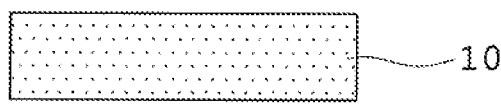
FIGS. 35A-35I are explanatory diagrams that show one example of manufacturing procedure for the substrate for mounting a semiconductor element thereon according to the ninth embodiment mode of the present invention.

First, a metal plate 10 made of a copper-based material is prepared as a base of the substrate for mounting a semiconductor element (See FIG. 35A).

Figure 35B:
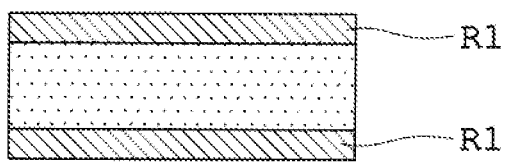

Then, first resist layers R1 are formed on both surfaces of the metal plate 10 (See FIG. 35B).

Figure 35C:
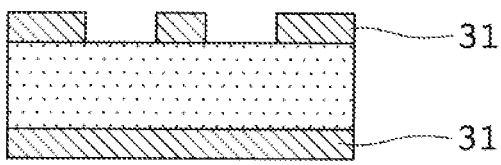

Then, the first resist layer R1 on the upper surface side of the metal plate 10 is exposed and developed upon use of a glass mask carrying a predetermined pattern corresponding to columnar terminal portions 10-1 as well as the entire region of the first resist layer R1 on the lower surface side of the metal plate 10 is exposed and developed, to form plating resist masks 31 having openings at sites corresponding to the columnar terminal portions 10-1 on the upper surface side of the metal plate 10 and covering the entire region on the lower surface side of the metal plate 10 (See FIG. 35C).

Figure 35D:
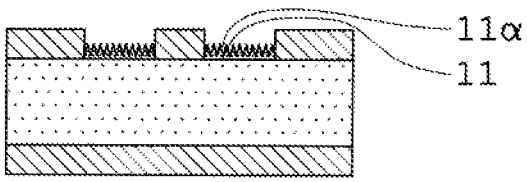
Figure 35E:
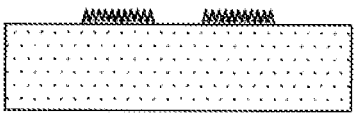

Then, upon use of the plating resist masks 31, a roughened silver plating layer 11 having acicular projections is formed on the upper surface of the metal plate 10 at the sites corresponding to the columnar terminal portions, and thereon a reinforcing plating layer 11α is formed, as an outermost plating layer, to cover an outer surface of the acicular projections in the roughened silver plating layer 11 (See FIG. 35D).

Figure 35F:
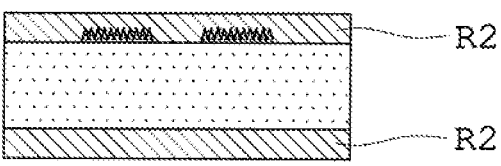

Then, the plating resist masks 31 are removed (See FIG. 35E) and second resist layers R2 are formed on the both sides of the metal plate 10 (See FIG. 35F).

Figure 35G:
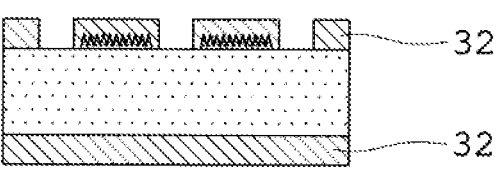

Then, the second resist layer R2 on the upper surface side of the metal plate 10 is exposed and developed upon use of a glass mask carrying a predetermined pattern corresponding to columnar terminal portions 10-1 as well as the entire region of the second resist layer R2 on the lower surface side of the metal plate 10 is exposed and developed, to form etching resist masks 32 covering the columnar terminal portions 10-1 and having openings at sites corresponding to concavities 10-2 on the upper surface side of the metal plate 10 and covering the entire region on the lower surface side of the metal plate 10 (See FIG. 35G).

Figure 35H:
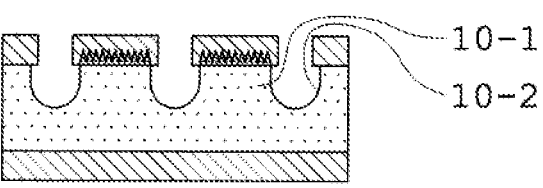

Then, half-etching is performed on the upper surface, to form the columnar terminal portions 10-1 and the concavities 10-2 (See FIG. 35H).

Figure 35I:
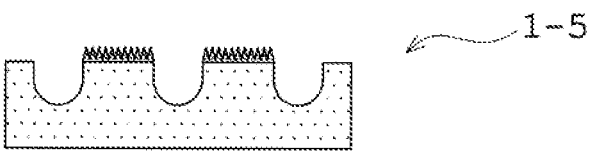

Then, the etching resist masks 32 are removed (See FIG. 35I).

Thereby, the substrate 1-5 for mounting a semiconductor element thereon of this embodiment mode is completed.

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, an example of manufacturing procedure for a semiconductor package using the substrate 1 for mounting a semiconductor element thereon of this embodiment mode will be described in reference to FIGS. 36A-36F.

Figure 36A:
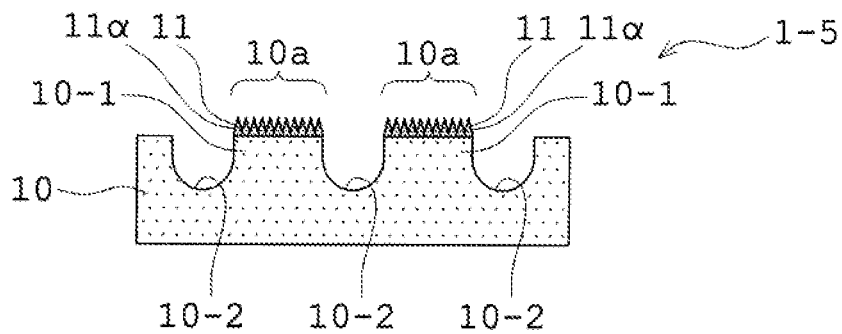
FIGS. 36A-36F are explanatory diagrams that show one example of manufacturing procedure for a semiconductor package using the substrate for mounting a semiconductor element thereon according to the ninth embodiment mode of the present invention.

First, the substrate 1 for mounting a semiconductor element thereon manufactured in accordance with the manufacturing procedure shown in FIGS. 35A-35I is prepared (See FIG. 36A).

Figure 36B:
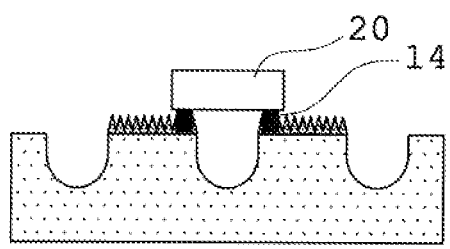

Then, solder 14 is printed on the site for mounting a semiconductor element thereon in the internal connection terminal portions 10a on the top faces of the columnar terminal portions 10-1 of the substrate 1-5 for mounting a semiconductor element thereon, and a semiconductor element 20 is mounted thereon and fixed, so that electrodes of the semiconductor element 20 and the internal connection terminal portions 10a of the substrate 1-5 for mounting a semiconductor element thereon are electrically connected (See FIG. 36B).

Figure 36C:
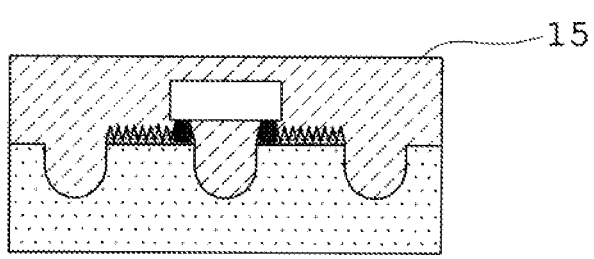

Then, a mold is used to seal, with a sealing resin 15, a surrounding space region on the upper surface side of the substrate 1-5 for mounting a semiconductor element thereon (See FIG. 36C).

Figure 36D:
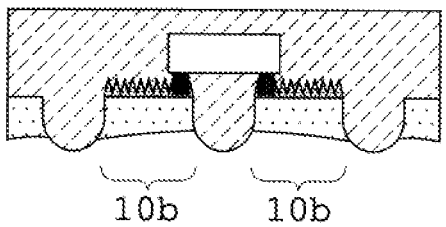

Then, half-etching is performed on the lower surface side of the metal plate 10, to isolate the columnar terminal portions 10-1 (See FIG. 36D).

Figure 36E:
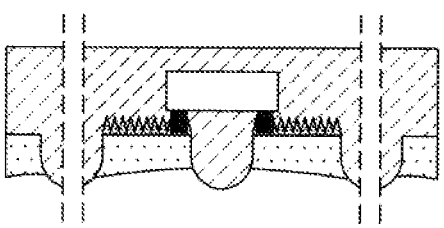

Lastly, semiconductor packages arrayed in multiple rows are singulated by dicing, pressing or the like (See FIG. 36E).

Figure 36F:
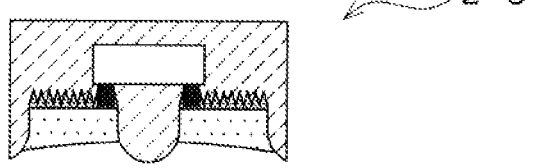

Thereby, a semiconductor package 2-5 using the substrate 1-5 for mounting a semiconductor element thereon of this embodiment mode is obtained (See FIG. 36F).

Tenth Embodiment Mode

Figure 37A:
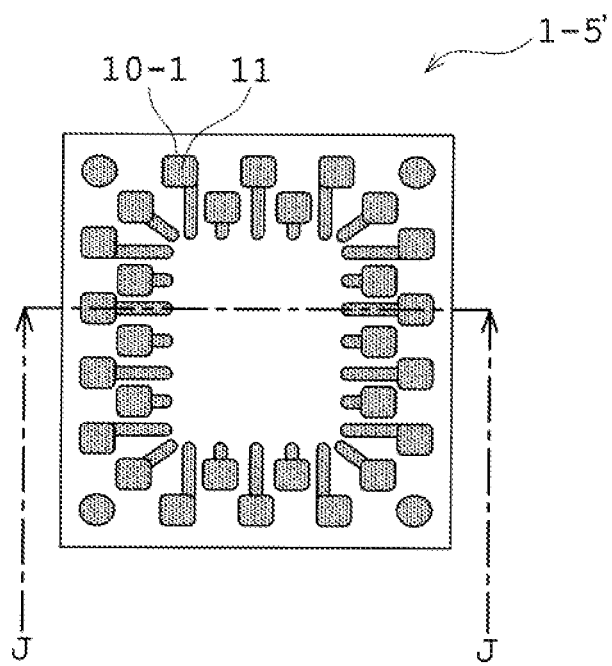
FIGS. 37A-37C are diagrams that show one example of substrate for mounting a semiconductor element thereon according to a tenth embodiment mode of the present invention, where
Figure 37B:
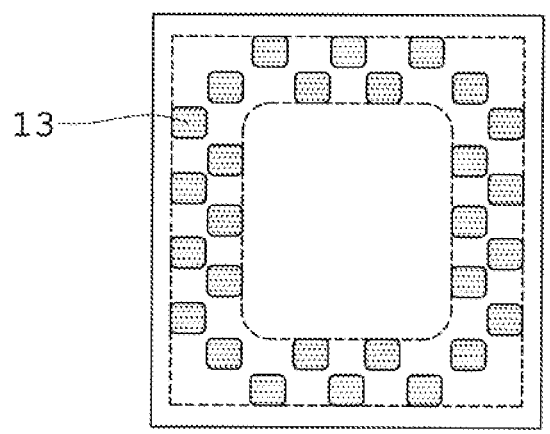
Figure 37C:
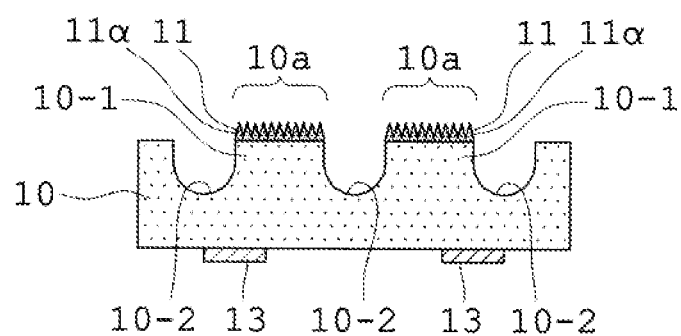

FIGS. 37A-37C are diagrams that show one example of substrate for mounting a semiconductor element thereon according to a tenth embodiment mode of the present invention, where FIG. 37A is a top view, FIG. 37B is a bottom view and FIG. 37C is an explanatory diagram schematically showing the J-J cross section in FIG. 37A. FIGS. 38A-38M are explanatory diagrams that show one example of manufacturing procedure for the substrate for mounting a semiconductor element thereon according to the tenth embodiment mode of the present invention. FIGS. 39A-39F are explanatory diagrams that show one example of manufacturing procedure for a semiconductor package using the substrate for mounting a semiconductor element thereon according to the second embodiment mode of the tenth invention.

As shown in FIG. 37B and FIG. 37C, in a substrate 1-5' for mounting a semiconductor element thereon according this embodiment mode, at positions corresponding to external connection terminal portions 10b on the lower surface of a metal plate 10, a plating layer 13 for external connection is formed. The remaining configurations are substantially the same as in the substrate 1-5 for mounting a semiconductor element thereon of the ninth embodiment mode shown in FIGS. 33A-33C.

Next, an example of manufacturing procedure for the substrate 1-5' for mounting a semiconductor element thereon of this embodiment mode will be described in reference to FIGS. 38A-38M.

Figure 38A:
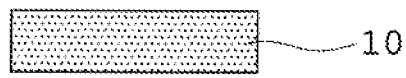
FIGS. 38A-38M are explanatory diagrams that show one example of manufacturing procedure for the substrate for mounting a semiconductor element thereon according to the tenth embodiment mode of the present invention.

First, a metal plate 10 made of a copper-based material is prepared as a base of the substrate for mounting a semiconductor element (See FIG. 38A).

Figure 38B:
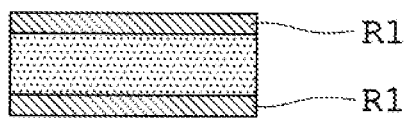

Then, first resist layers R1 are formed on both surfaces of the metal plate 10 (See FIG. 38B).

Figure 38C:
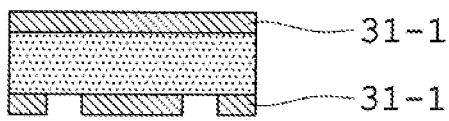

Then, the entire region of the first resist layer R1 on the upper surface side of the metal plate 10 is exposed and developed as well as the first resist layer R1 on the lower surface side of the metal plate 10 is exposed and developed upon use of a glass mask carrying a predetermined pattern corresponding to external connection terminal portions 10b, to form first plating resist masks 31-1 covering the entire region on the upper surface side of the metal plate 10 and having openings at sites corresponding to the external connection terminal portions 10b on the lower surface side of the metal plate 10 (See FIG. 38C).

Figure 38D:
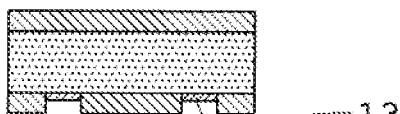
Figure 38E:
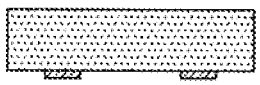

Then, upon use of the first plating resist masks 31-1, a nickel plating layer having a thickness of 0.3 to 3 μm, a palladium plating layer having a thickness of 0.005 to 0.1 μm, and a gold plating layer having a thickness of 0.0005 to 0.1 μm are laminated in this order on the lower surface of the metal plate 10 at the sites corresponding to the external connection terminal portions 10b, to form a plating layer 13 for external connection (See FIG. 38D).

Figure 38F:
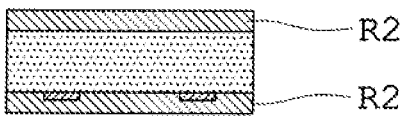

Then, the first plating resist masks 31-1 are removed (See FIG. 38E), and second resist layers R2 are formed on the both sides of the metal plate 10 (See FIG. 38F).

Figure 38G:
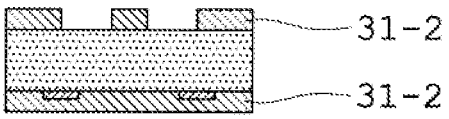

Then, the second resist layer R2 on the upper surface side of the metal plate 10 is exposed and developed upon use of a glass mask carrying a predetermined pattern corresponding to internal connection terminal portions 10a as well as the entire region of the second resist layer R2 on the lower surface side of the metal plate 10 is exposed and developed, to form second plating resist masks 31-2 having openings at sites corresponding to the internal connection terminal portions 10a on the upper surface side of the metal plate 10 and covering the entire region on the lower surface side of the metal plate 10 (See FIG. 38G).

Figure 38H:
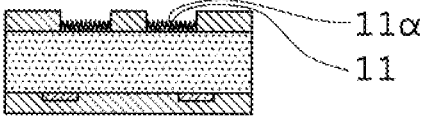
Figure 38I:
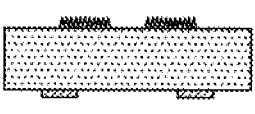

Then, upon use of the second plating resist masks 31-2, a roughened silver plating layer 11 having acicular projections is formed on the upper surface of the metal plate 10 at the sites corresponding to the internal connection terminal portions 10a, and thereon a reinforcing plating layer 11α is formed, as an outermost plating layer, to cover an outer surface of the acicular projections in the roughened silver plating layer 11 (See FIG. 38H).

Figure 38J:
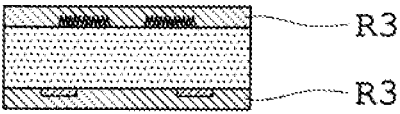

Then, the second plating resist masks 31-2 are removed (See FIG. 38I), and third resist layers R3 are formed on the both sides of the metal plate 10 (See FIG. 38J).

Figure 38K:
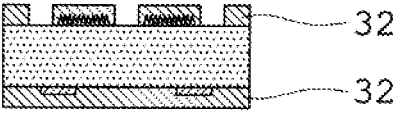

Then, the third resist layer R3 on the upper surface side of the metal plate 10 is exposed and developed upon use of a glass mask carrying a predetermined pattern corresponding to columnar terminal portions 10-1 as well as the entire region of the third resist layer R3 on the lower surface side of the metal plate 10 is exposed and developed, to form etching resist masks 32 covering the columnar terminal portions 10-1 and having openings at sites corresponding to concavities 10-2 on the upper surface side of the metal plate 10 and covering the entire region on the lower surface side of the metal plate 10 (See FIG. 38K).

Figure 38L:
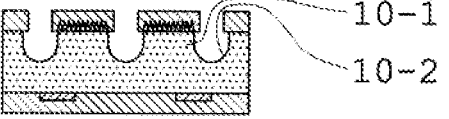

Then, half-etching is performed on the upper surface, to form the columnar terminal portions 10-1 and the concavities 10-2 (See FIG. 38L).

Figure 38M:

Then, the etching resist masks 32 are removed (See FIG. 38M).

Thereby, the substrate 1-5' for mounting a semiconductor element thereon of the tenth embodiment mode is completed.

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, an example of manufacturing procedure for a semiconductor package using the substrate 1-5' for mounting a semiconductor element thereon of the tenth embodiment mode will be described in reference to FIGS. 39A-39F.

First, from preparation of the substrate 1-5' for mounting a semiconductor element thereon (See FIG. 39A), mounting of the semiconductor element 20 (See FIG. 39B) through formation of sealing resin upon use of a mold (See FIG. 39C), the manufacturing procedure is substantially the same as that for a semiconductor package using the substrate 1-5 for mounting a semiconductor element thereon of the ninth embodiment mode (See FIGS. 34A-34C).

Figure 39A:
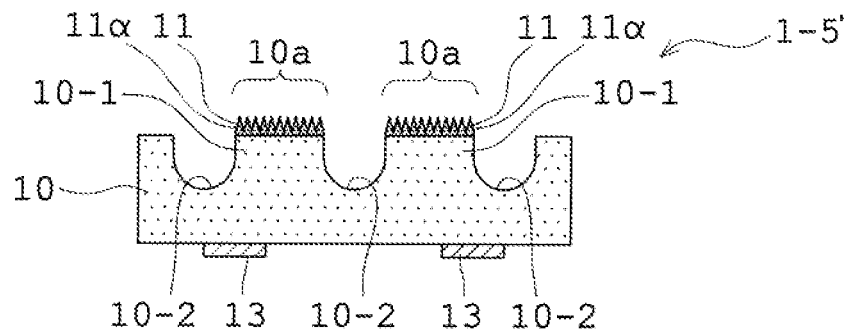
FIGS. 39A-39F are explanatory diagrams that show one example of manufacturing procedure for a semiconductor package using the substrate for mounting a semiconductor element thereon according to the tenth embodiment mode of the present invention.
Figure 39B:
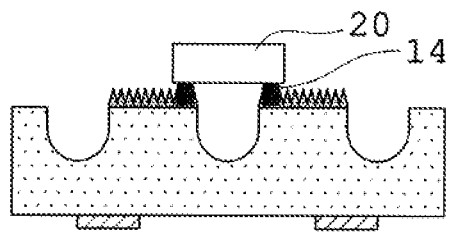
Figure 39C:
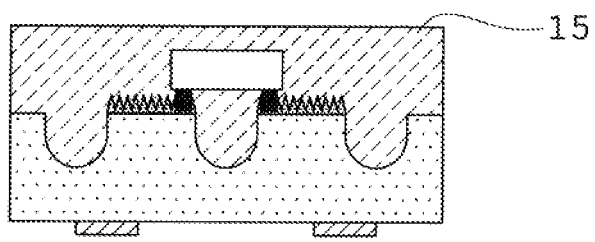
Figure 39D:
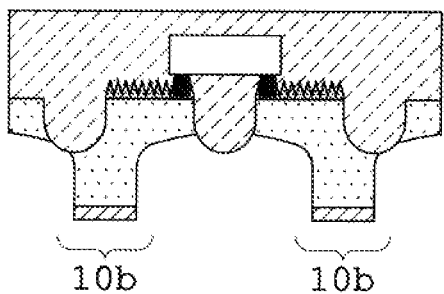

Then, half-etching is performed on the lower surface side upon use of the plating layer 13 for external connection as an etching mask, to form the external connection terminal portions 10b (See FIG. 39D).

Figure 39E:
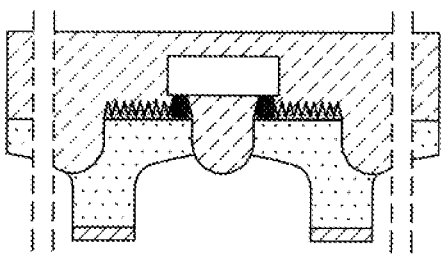

Lastly, semiconductor packages arrayed in multiple rows are singulated by dicing, pressing or the like (See FIG. 39E).

Figure 39F:
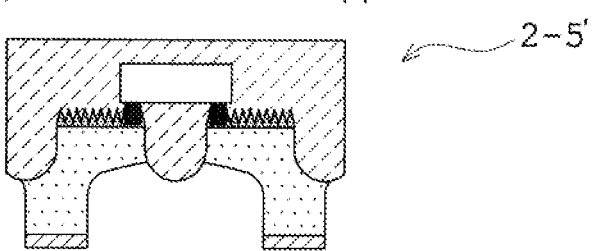

Thereby, a semiconductor package 2-5' using the substrate 1-5' for mounting a semiconductor element thereon of this embodiment mode is obtained (See FIG. 39F).

Eleventh Embodiment Mode

Figure 40A:
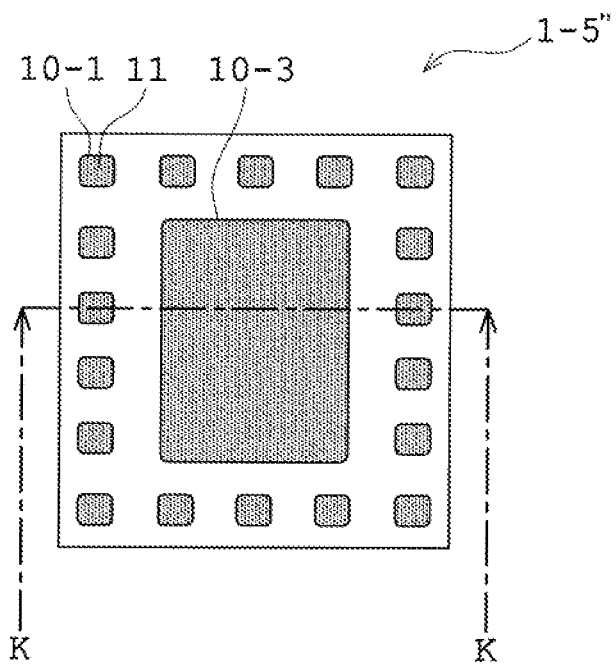
FIGS. 40A-40C are diagrams that show one example of substrate for mounting a semiconductor element thereon according to a eleventh embodiment mode of the present invention, where
Figure 40B:
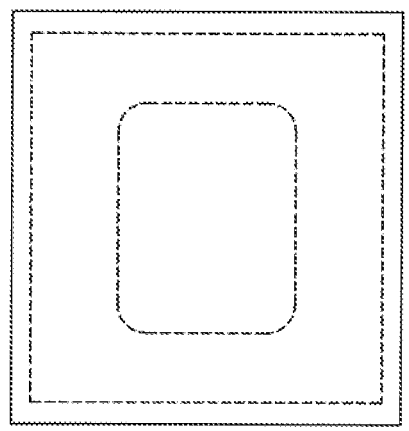
Figure 40C:
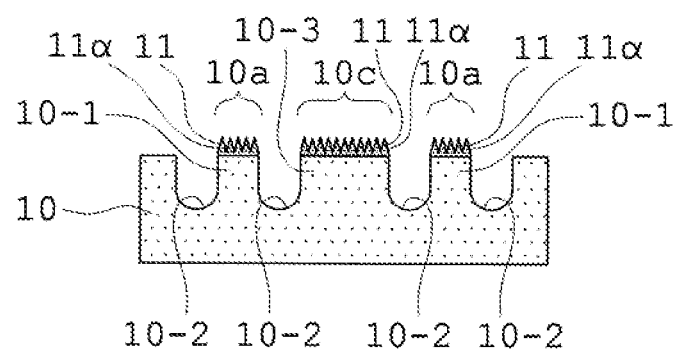
Figure 41:
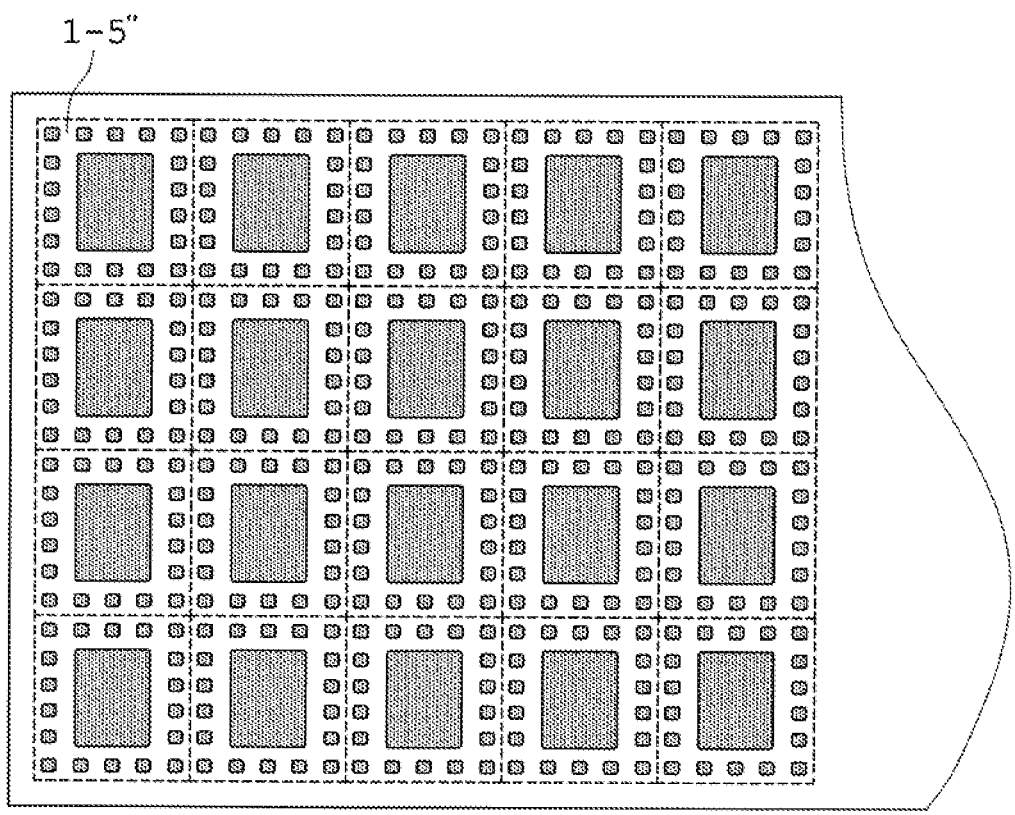
FIG. 41 is a plan view that shows one example of substrates for mounting semiconductor elements thereon arrayed in multiple rows according to the eleventh embodiment mode of the present invention.
Figure 42A:
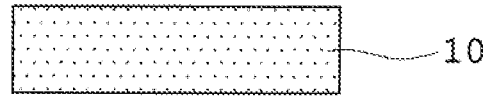
FIGS. 42A-42I are explanatory diagrams that show one example of manufacturing procedure for the substrate for mounting a semiconductor element thereon according to the eleventh embodiment mode of the present invention.
Figure 42B:
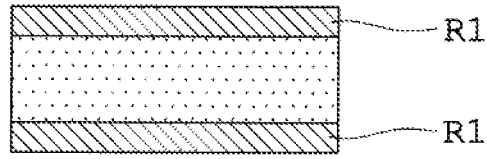
Figure 42C:
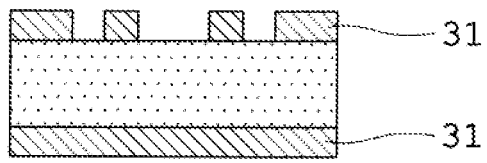
Figure 42D:
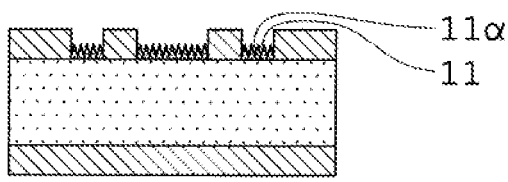
Figure 42E:
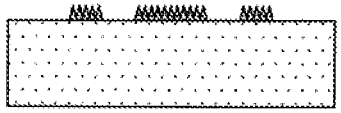
Figure 42F:
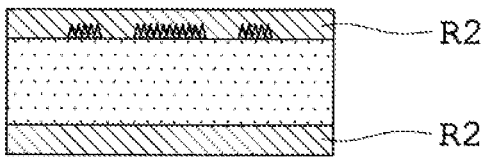
Figure 42G:
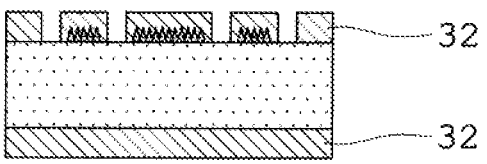
Figure 42H:
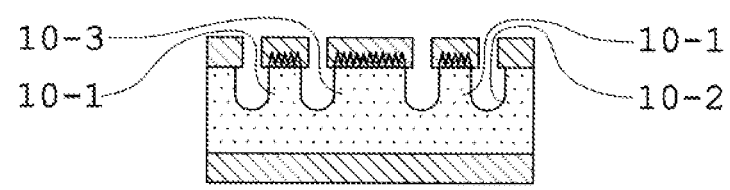
Figure 42I:
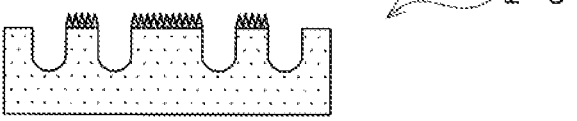
Figure 49A:
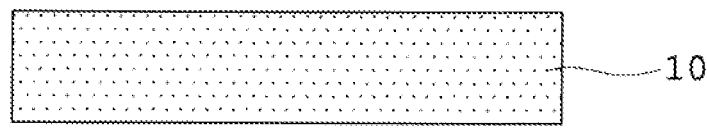
FIGS. 49A-49E are explanatory diagrams that show one example of manufacturing procedure for the substrate for mounting a semiconductor element thereon according to the thirteenth embodiment mode of the present invention.
Figure 49B:
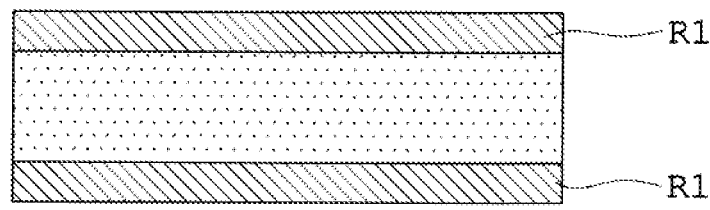
Figure 49C:
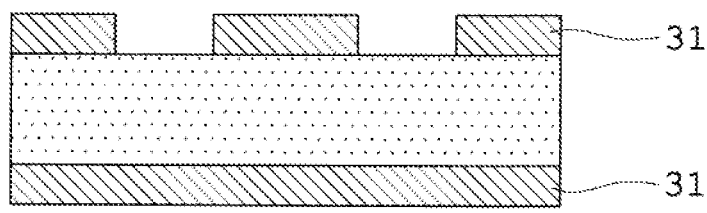

FIGS. 40A-40C are diagrams that show one example of substrate for mounting a semiconductor element thereon according to an eleventh embodiment mode of the present invention, where FIG. 40A is a top view, FIG. 40B is a bottom view and FIG. 49C is an explanatory diagram schematically showing the K-K cross section in FIG. 40A. FIG. 41 is a plan view that shows one example of substrates for mounting semiconductor elements thereon arrayed in multiple rows according to the eleventh embodiment mode of the present invention. FIGS. 42A-42I are explanatory diagrams that show one example of manufacturing procedure for the substrate for mounting a semiconductor element thereon according to the eleventh embodiment mode of the present invention. FIGS. 43A-43F are explanatory diagrams that show one example of manufacturing procedure for a semiconductor package using the substrate for mounting a semiconductor element thereon according to the eleventh embodiment mode of the present invention.

A substrate 1-5" for mounting a semiconductor element thereon of this embodiment mode is provided with a columnar terminal portion 10-3 with a large area arranged at the center position and a plurality of columnar terminal portions 10-1 with small areas arrayed along four sides around the columnar terminal portion 10-3 as shown in FIG. 40A, and is provided with a roughened silver plating layer 11 on top faces of the columnar terminal portions 10-1 and 10-3, as well as with a reinforcing plating layer 11α covering, as an outermost plating layer, an outer surface of acicular projections in the roughened silver plating layer 11, as shown in FIG. 40C. The columnar terminal portion 10-3 is configured, at the top face thereof, as a pad portion 10c on which a semiconductor element is to be mounted, and the columnar terminal portions 10-1 are configured, at the top faces thereof, as internal connection terminal portions 10a to be electrically connected with a semiconductor element via bonding wires.

The configurations of the roughened silver plating layer 11, the reinforcing plating layer 11α and the base for the roughened silver plating layer 11 are substantially the same as in the lead frame 1-1 of the first embodiment mode.

The substrate 1-5" for mounting a semiconductor element thereon of this embodiment mode is configured so that, as shown in FIG. 41, the individual substrates 1-5" for mounting semiconductor elements thereon are arrayed in multiple rows.

Next, an example of manufacturing procedure for the substrate 1-5" for mounting a semiconductor element thereon of this embodiment mode will be described in reference to FIGS. 42A-42I.

The manufacturing procedure for the substrate 1-5" for mounting a semiconductor element thereon of this embodiment mode is substantially the same as the manufacturing procedure for the substrate 1-5 for mounting a semiconductor element thereon of the ninth embodiment mode shown in FIGS. 42A-42I.

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, an example of manufacturing procedure for a semiconductor package using the substrate 1-5" for mounting a semiconductor element thereon of this embodiment mode will be described in reference to FIGS. 43A-43F.

Figure 43A:
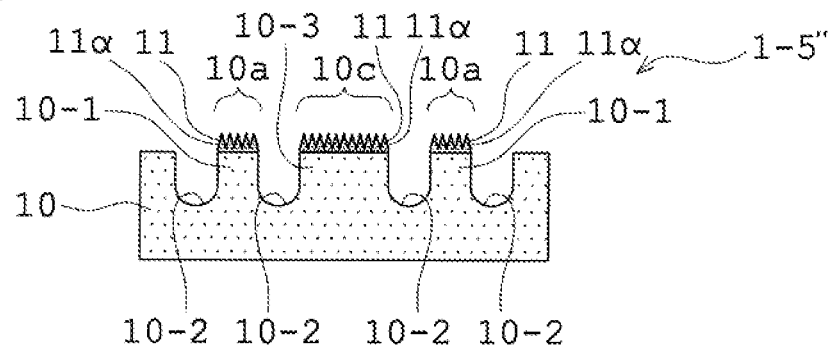
FIGS. 43A-43F are explanatory diagrams that show one example of manufacturing procedure for a semiconductor package using the substrate for mounting a semiconductor element thereon according to the eleventh embodiment mode of the present invention.

First, the substrate 1-5" for mounting a semiconductor element thereon manufactured in accordance with the manufacturing procedure shown in FIGS. 42A-42I is prepared (See FIG. 43A).

Figure 43B:
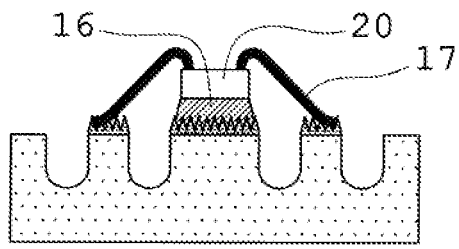

Then, a semiconductor element 20 is mounted and fixed on the pad portion 10c of the columnar terminal portion 10-3 on the upper surface side of the substrate 1-5" for mounting a semiconductor element thereon via die bond 16, and electrodes of the semiconductor element 20 and the internal connection terminal portions 10a of the columnar terminal portions 10-1 are electrically connected via bonding wires 17 (See FIG. 43B).

Figure 43C:
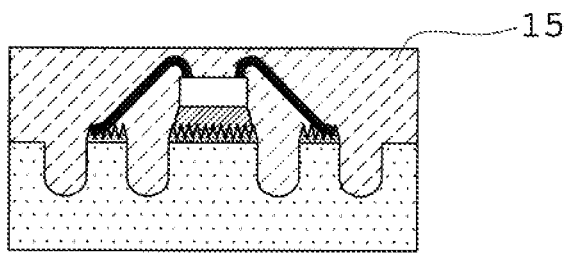

Then, a mold is used to seal, with a sealing resin 15, a surrounding space region on the upper surface side of the substrate 1-5" for mounting a semiconductor element thereon (See FIG. 43C).

Figure 43D:
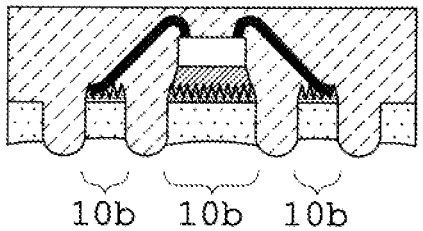

Then, half-etching is performed on the lower surface side of the metal plate 10, to isolate the columnar terminal portions 10-1 and 10-3 (See FIG. 43D).

Figure 43E:
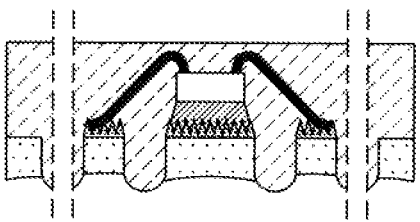

Lastly, semiconductor packages arrayed in multiple rows are singulated by dicing, pressing or the like (See FIG. 43E).

Figure 43F:
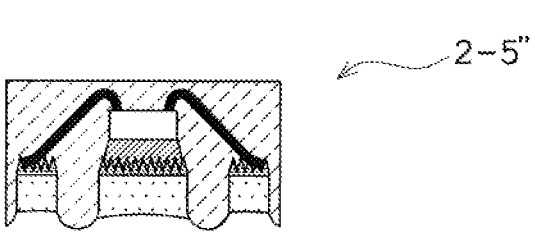

Thereby, a semiconductor package 2-5" using the substrate 1-5" for mounting a semiconductor element thereon of this embodiment mode is obtained (See FIG. 43F).

Twelfth Embodiment Mode

Figure 44A:
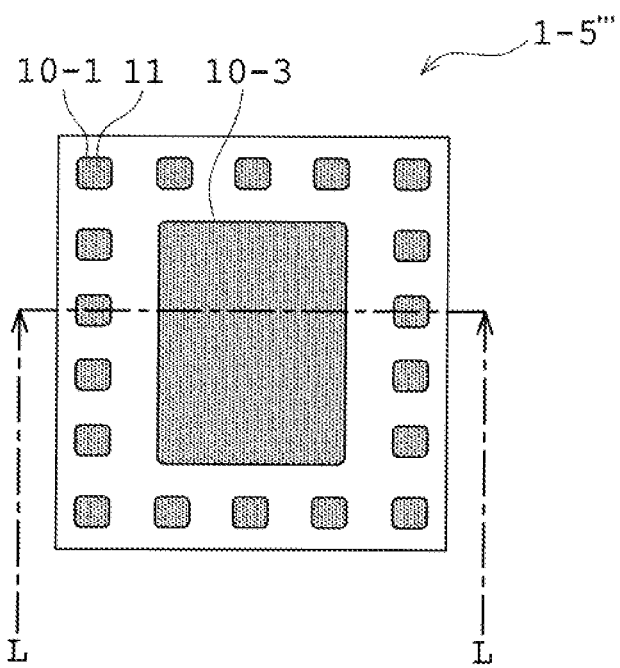
FIGS. 44A-44C are diagrams that show one example of substrate for mounting a semiconductor element thereon according to a twelfth embodiment mode of the present invention, where
Figure 44B:
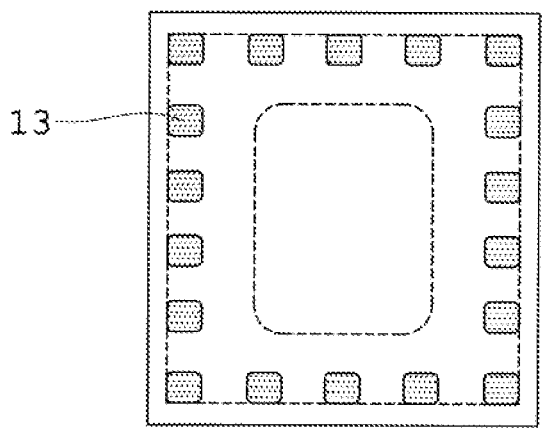
Figure 44C:
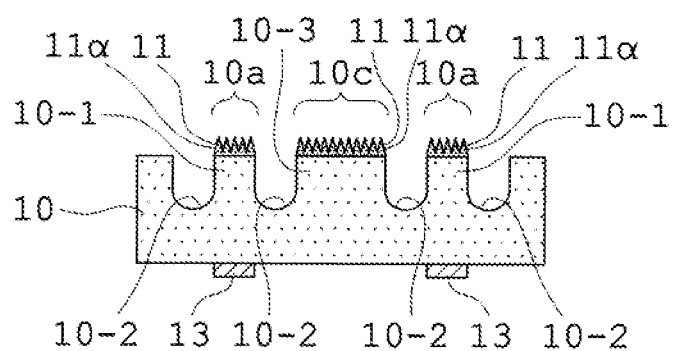
Figure 45A:
FIGS. 45A-45M are explanatory diagrams that show one example of manufacturing procedure for the substrate for mounting a semiconductor element thereon according to the twelfth embodiment mode of the present invention.
Figure 45B:
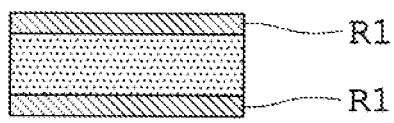
Figure 45C:
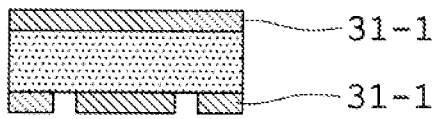
Figure 45D:
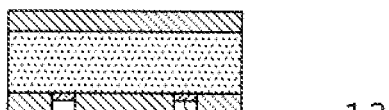
Figure 45E:
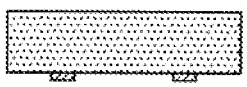
Figure 45F:
Figure 45G:
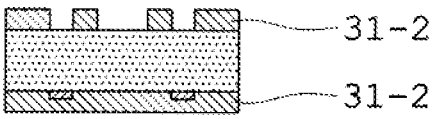
Figure 45H:
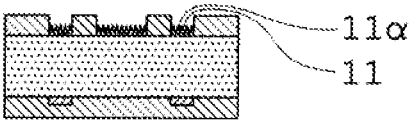
Figure 45I:
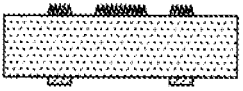
Figure 45J:
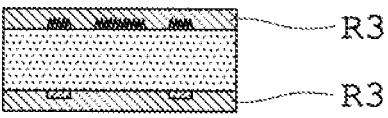
Figure 45K:
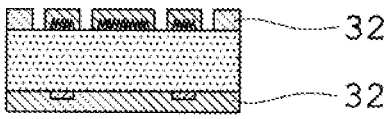
Figure 45L:
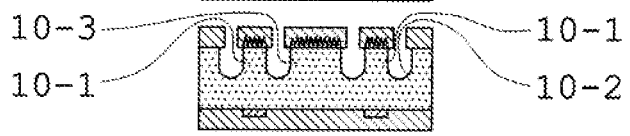
Figure 45M:

FIGS. 44A-44C are diagrams that show one example of substrate for mounting a semiconductor element thereon according to a twelfth embodiment mode of the present invention, where FIG. 44A is a top view, FIG. 44B is a bottom view and FIG. 44C is an explanatory diagram schematically showing the L-L cross section in FIG. 44A. FIGS. 45A-45M are explanatory diagrams that show one example of manufacturing procedure for the substrate for mounting a semiconductor element thereon according to the twelfth embodiment mode of the present invention. FIGS. 46A-46F are explanatory diagrams that show one example of manufacturing procedure for a semiconductor package using the substrate for mounting a semiconductor element thereon according to the twelfth embodiment mode of the present invention.

As shown in FIG. 44B and FIG. 44C, in a substrate 1-5''' for mounting a semiconductor element thereon according this embodiment mode, at positions corresponding to external connection terminal portions 10b on the lower surface of a metal plate 10, a plating layer 13 for external connection is formed. The remaining configurations are substantially the same as in the substrate 1-5" for mounting a semiconductor element thereon of the eleventh embodiment mode.

Next, an example of manufacturing procedure for the substrate 1-5''' for mounting a semiconductor element thereon of this embodiment mode will be described in reference to FIGS. 45A-45M.

The manufacturing procedure for the substrate 1-5''' for mounting a semiconductor element thereon of this embodiment mode is substantially the same as the manufacturing procedure for the substrate 1-5' for mounting a semiconductor element thereon of the tenth embodiment mode shown in FIGS. 38A-38M (See FIG. 45A through FIG. 45M).

The processes for forming the roughened silver plating layer 11 with acicular projections and the reinforcing plating layer 11α covering the outer surface of the acicular projections in the roughened silver plating layer 11, and the kinds and plating thicknesses of plating metals composing the roughened silver plating layer 11 and the reinforcing plating layer 11α are substantially the same as those in the lead frame 1-1 of the first embodiment mode.

Next, an example of manufacturing procedure for a semiconductor package using the substrate 1-5''' for mounting a semiconductor element thereon of the twelfth embodiment mode will be described in reference to FIGS. 46A-46F.

First, from preparation of the substrate 1-5''' for mounting a semiconductor element thereon (See FIG. 46A), mounting of the semiconductor element 20 (See FIG. 46B) through formation of a sealing resin upon use of a mold (See FIG. 46C), the manufacturing procedure is substantially the same as that for a semiconductor package using the substrate 1-5'' for mounting a semiconductor element thereon of the eleventh embodiment mode (See FIG. 43A through FIG. 43C).

Figure 46A:
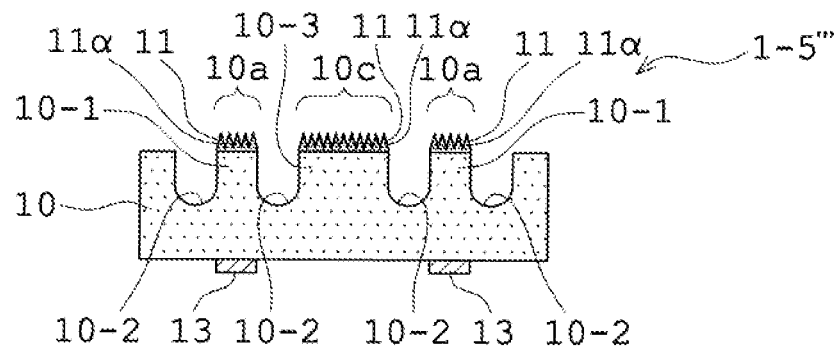
FIGS. 46A-46F are explanatory diagrams that show one example of manufacturing procedure for a semiconductor package using the substrate for mounting a semiconductor element thereon according to the twelfth embodiment mode of the present invention.
Figure 46B:
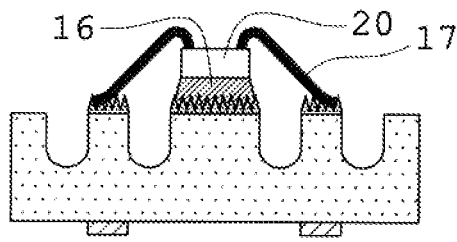
Figure 46C:
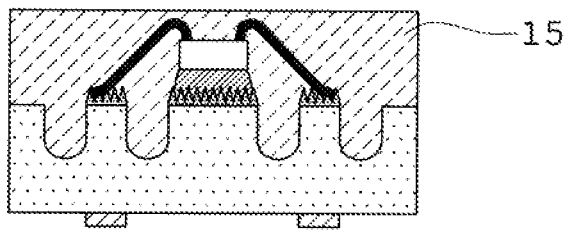
Figure 46D:
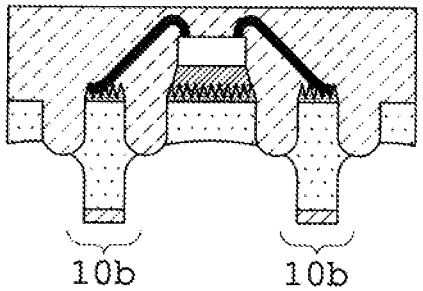

Then, half-etching is performed on the lower surface side upon use of the plating layer 13 for external connection as an etching mask, to form the external connection terminal portions 10b (See FIG. 46D).

Figure 46E:
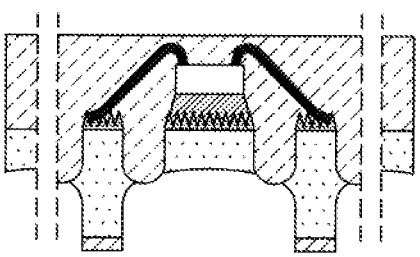

Lastly, semiconductor packages arrayed in multiple rows are singulated by dicing, pressing or the like (See FIG. 46E).

Figure 46F:
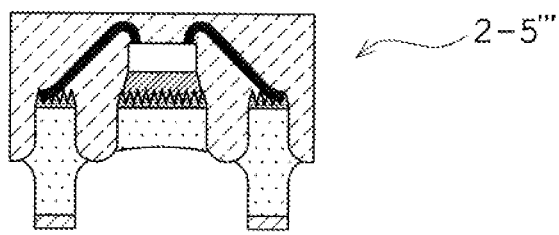

Thereby, a semiconductor package 2-5''' using the substrate 1-5''' for mounting a semiconductor element thereon of this embodiment mode is obtained (See FIG. 46F).

Thirteenth Embodiment Mode

Figure 47A:
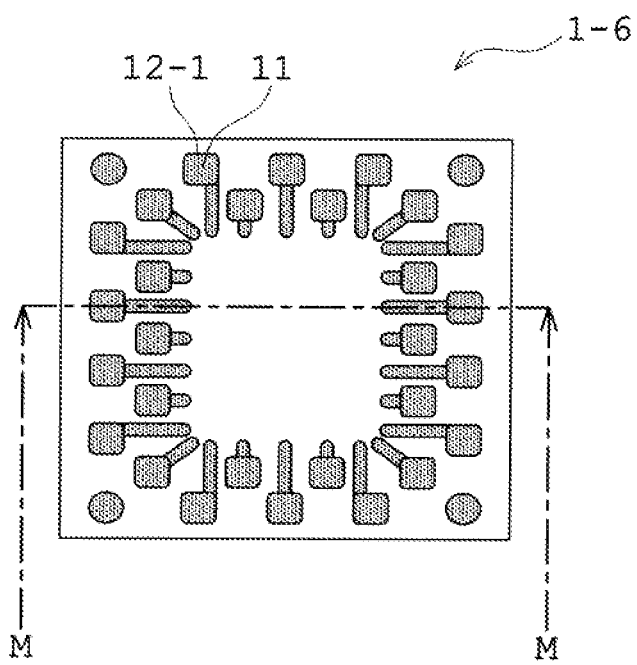
FIGS. 47A-47B are diagrams that show one example of substrate for mounting a semiconductor element thereon according to a thirteenth embodiment mode of the present invention, where
Figure 47B:
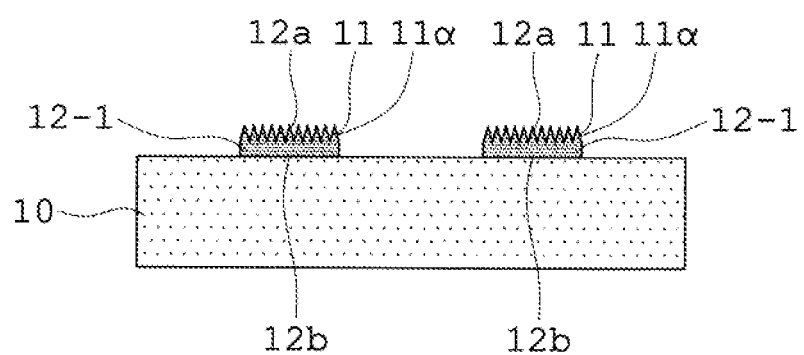
Figure 48:
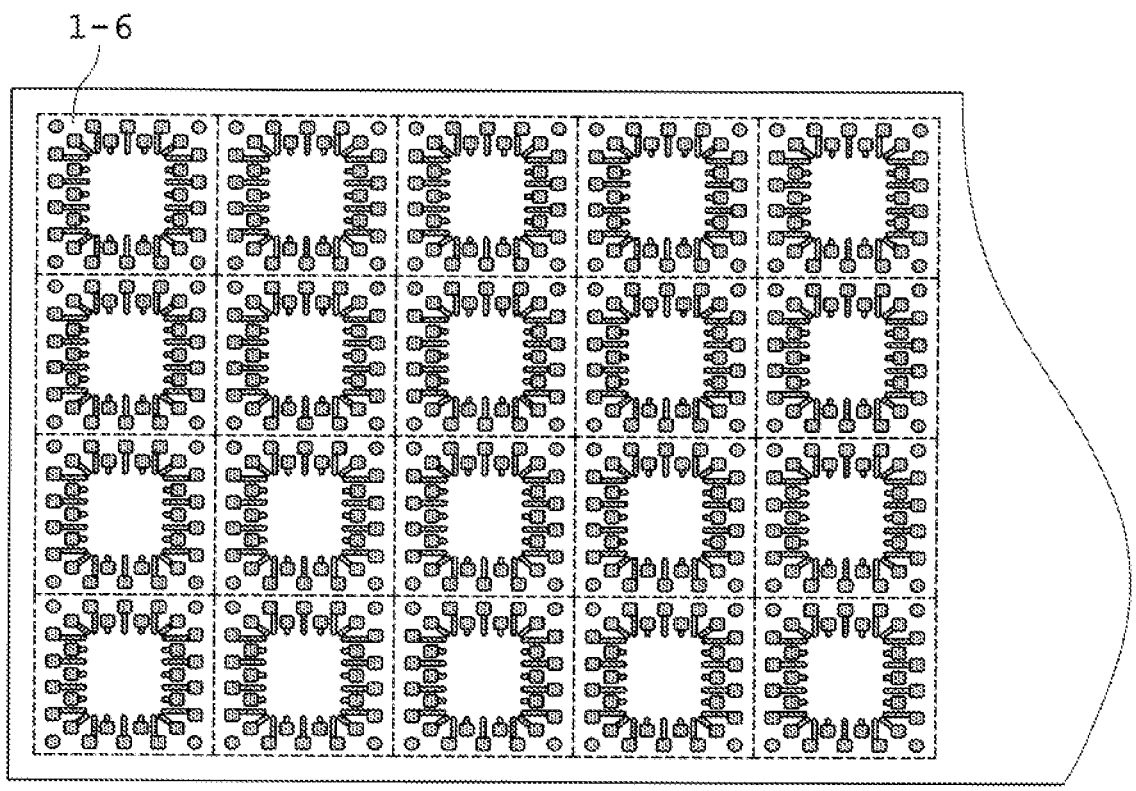
FIG. 48 is a plan view that shows one example of substrates for mounting semiconductor elements thereon arrayed in multiple rows according to the thirteenth embodiment mode of the present invention.

FIGS. 47A-47B are diagrams that show one example of substrate for mounting a semiconductor element thereon according to a thirteenth embodiment mode of the present invention, where FIG. 47A is a plan view and FIG. 47B is an explanatory diagram schematically showing the M-M cross section in FIG. 47A. FIG. 48 is a plan view that shows one example of substrates for mounting semiconductor elements thereon arrayed in multiple rows according to the thirteenth embodiment mode of the present invention. FIGS. 49A-49E are explanatory diagrams that show one example of manufacturing procedure for the substrate for mounting a semiconductor element thereon according to the thirteenth embodiment mode of the present invention. FIGS. 50A-50F are explanatory diagrams that show one example of manufacturing procedure for a semiconductor package using the substrate for mounting a semiconductor element thereon according to the thirteenth embodiment mode of the present invention.

As shown in FIG. 47A, a substrate 1-6 for mounting a semiconductor element thereon of this embodiment mode is provided with, on an upper surface of a metal plate 10 made of a copper-based material, a plurality of columnar terminal portions 12-1 extending from four sides toward a site on which a semiconductor element is to be mounted.

The columnar terminal portions 12-1 are composed only of plating layers of different metals and, as shown in FIG. 47B, are provided with a roughened silver plating layer 11 having acicular projections and, as an outermost plating layer, a reinforcing plating layer 11α covering an outer surface of the acicular projections in the roughened silver plating layer 11.

As shown in FIG. 47B, the columnar terminal portions 12-1 are configured so that, in a complete semiconductor package, one-side surface thereof serves as internal connection terminal portions 12a to be connected with a semiconductor element as well as other-side surface thereof serves as external connection terminal portions 12b to be connected with an external board.

The columnar terminal portions 12-1 are configured so that a plating layer thereof that is in contact with the metal plate 10 is a gold plating layer.

For the columnar terminal portions 12-1, undercoat plating layers beneath the roughened silver plating layer 11 can be formed by plating with metals selected among gold, palladium, nickel and the like and alloys thereof, to laminate them orderly.

The plating layers beneath the reinforcing plating layer 11α in the columnar terminal portions 12-1 can be composed of plating layers made of metals laminated in the order of gold/nickel/silver. In this case, it is preferable that, on an outer surface of sites corresponding to the columnar terminal portions 12-1 on the upper surface side of the metal plate 10, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a roughened silver plating layer with acicular projections with a thickness of 0.2 μm or more and 3.0 μm or less, much preferably 0.5 μm.

Also, the plating layers beneath the reinforcing plating layer 11α in the columnar terminal portions 12-1 can be composed of plating layers made of metals laminated in the order of gold/palladium/nickel/silver. In this case, it is preferable that, on an outer surface of sites corresponding to the columnar terminal portions 12-1 on the upper surface side of the metal plate 10, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a roughened silver plating layer with acicular projections with a thickness of 0.2 μm or more and 3.0 μm or less, much preferably 0.5 μm.

Also, the plating layers beneath the reinforcing plating layer 11α in the columnar terminal portions 12-1 can be composed of plating layers made of metals laminated in the order of gold/palladium/nickel/palladium/silver. In this case, it is preferable that, on an outer surface of sites corresponding to the columnar terminal portions 12-1 on the upper surface side of the metal plate 10, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a roughened silver plating layer with acicular projections with a thickness of 0.2 μm or more and 3.0 μm or less, much preferably 0.5 μm.

Also, the plating layers beneath the reinforcing plating layer 11α in the columnar terminal portions 12-1 can be composed of plating layers made of metals laminated in the order of gold/nickel/palladium/silver. In this case, it is preferable that, on an outer surface of sites corresponding to the columnar terminal portions 12-1 on the upper surface side of the metal plate 10, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a roughened silver plating layer with acicular projections with a thickness of 0.2 µm or more and 3.0 µm or less, much preferably 0.5 µm.

Also, the plating layers beneath the reinforcing plating layer 11α in the columnar terminal portions 12-1 can be composed of plating layers made of metals laminated in the order of gold/nickel/palladium/gold/silver. In this case, it is preferable that, on an outer surface of sites corresponding to the columnar terminal portions 12-1 on the upper surface side of the metal plate 10, there is formed a gold plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a gold plating layer with a thickness of 0.0005 µm or more and 0.5 µm or less, much preferably 0.005 µm, on which formed is a roughened silver plating layer with acicular projections with a thickness of 0.2 µm or more and 3.0 µm or less, much preferably 0.5 µm.

Also, the plating layers beneath the reinforcing plating layer 11α in the columnar terminal portions 12-1 can be composed of plating layers made of metals laminated in the order of gold/palladium/nickel/palladium/gold/silver. In this case, it is preferable that, on an outer surface of sites corresponding to the columnar terminal portions 12-1 on the upper surface side of the metal plate 10, there is formed a gold plating layer with a thickness of 0.005 µm or more and 0.5 µm or less, much preferably 0.05 µm, on which formed is a palladium plating layer with a thickness of 0.005 µm or more and 0.5 µm or less, much preferably 0.05 µm, on which formed is a smooth-crystal nickel plating layer with a thickness of 5.0 µm or more and 80.0 µm or less, much preferably 30.0 µm, on which formed is a palladium plating layer with a thickness of 0.005 µm or more and 1.5 µm or less, much preferably 0.05 µm, on which formed is a gold plating layer with a thickness of 0.0005 µm or more and 0.5 µm or less, much preferably 0.005 µm, on which formed is a roughened silver plating layer with acicular projections with a thickness of 0.2 µm or more and 3.0 µm or less, much preferably 0.5 µm.

In these cases, a silver flash layer with a thickness of 0.4 µm or more and 4.0 µm or less, preferably 1.0 µm is formed as the reinforcing plating layer 11α covering the outer surface of the acicular projections in the roughened silver plating layer 11.

The reinforcing plating player 11α covering the outer surface of the acicular projections in the roughened silver plating layer 11 may be configured of, in place of a silver flash layer, a three-layer plating layer composed of a nickel plating layer with a thickness of 0.4 µm or more and 4.0 µm or less, preferably 1.0 µm, a palladium plating layer with a thickness of 0.005 µm or more and 0.1 µm or less, preferably 0.01 µm, and a gold plating layer with a thickness of 0.0005 µm or more and 0.01 µm or less, preferably 0.001 µm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 µm.

Also, the material of the metal plate 10 as a base of the substrate 1 for mounting a semiconductor element thereon can be a stainless steel-based alloy other than copper-based materials such as a copper alloy.

In the case where the material of the metal plate 10 is a stainless steel-based alloy, the columnar terminal portions 12-1 includes plating layers made of metals laminated in the order of gold/nickel/palladium/silver. In this case, it is preferable that, on one-side surface of the metal plate 10 at sites corresponding to the columnar terminal portions 12-1, there is formed a gold plating layer with a thickness of 0.005 µm or more and 0.5 µm or less, much preferably 0.05 µm, on which formed is a smooth-crystal nickel plating layer with a thickness of 20.0 µm or more and 80.0 µm or less, much preferably 30.0 µm, on which formed is a palladium plating layer with a thickness of 0.005 µm or more and 1.5 µm or less, much preferably 0.05 µm, on which formed is a roughened silver plating layer having acicular projections at its outer surface, with a thickness of 0.2 µm or more and 3.0 µm or less, much preferably 0.5 µm.

In this case, a silver flash layer with a thickness of 0.4 µm or more and 4.0 µm or less, preferably 1.0 µm is formed as the reinforcing plating layer 11α covering the outer surface of the acicular projections in the roughened silver plating layer 11.

The reinforcing plating player 11α covering the outer surface of the acicular projections in the roughened silver plating layer 11 may be configured of, in place of a silver flash layer, a three-layer plating layer composed of a nickel plating layer with a thickness of 0.4 µm or more and 4.0 µm or less, preferably 1.0 µm, a palladium plating layer with a thickness of 0.005 µm or more and 0.1 µm or less, preferably 0.01 µm, and a gold plating layer with a thickness of 0.0005 µm or more and 0.01 µm or less, preferably 0.001 µm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 µm.

In the columnar terminal portions 12-1 formed of plating layers of metals laminated in the order indicated in each of the examples above, the roughened silver plating layer 11 having acicular projections at its outer surface and having a crystal structure in which the crystal direction <101> occupies a largest proportion among the crystal directions <001>, <111> and <101> has a surface area ratio (i. e. the ratio of the surface area of the roughened silver plating layer to the surface area of the corresponding smooth surface) of 1.30 or more and 6.00 or less, preferably 3.00.

An outer surface of the reinforcing plating layer 11α is shaped to have acicular projections with a surface area ratio of 1.30 or more and 6.00 or less to a surface area of a smooth surface, as inheriting the acicular projections of the roughened silver plating layer 11.

The substrate 1-6 for mounting a semiconductor element thereon of this embodiment mode is configured so that, as shown in FIG. 48, the individual substrates 1-6 for mounting semiconductor elements thereon are arrayed in multiple rows.

Next, an example of manufacturing procedure for the substrate 1-6 for mounting a semiconductor element thereon of this embodiment mode will be described in reference to FIGS. 49A-49E.

First, a metal plate 10 made of a copper-based material is prepared as a base of the substrate for mounting a semiconductor element (See FIG. 49A).

Then, resist layers R1 are formed on both surfaces of the metal plate 10 (See FIG. 49B).

Then, the resist layer R1 on the upper surface side of the metal plate 10 is exposed and developed upon use of a glass mask carrying a predetermined pattern corresponding to columnar terminal portions 12-1 as well as the entire region of the resist layer R1 on the lower surface side of the metal plate 10 is exposed and developed, to form plating resist masks 31 having openings at sites corresponding to the columnar terminal portions 12-1 on the upper surface side of the metal plate 10 and covering the entire region on the lower surface side of the metal plate 10 (See FIG. 49C).

Figure 49D:
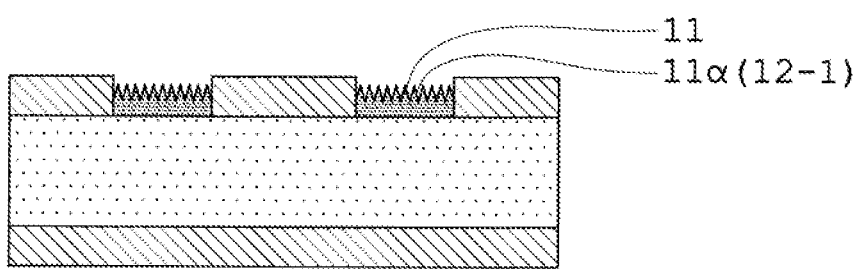

Then, upon use of the plating resist masks 31, a roughened silver plating layer 11 having acicular projections is formed on the upper surface of the metal plate 10 at the sites corresponding to the columnar terminal portions 12-1, and thereon a reinforcing plating layer 11α is formed as an outermost plating layer (See FIG. 49D).

Figure 49E:
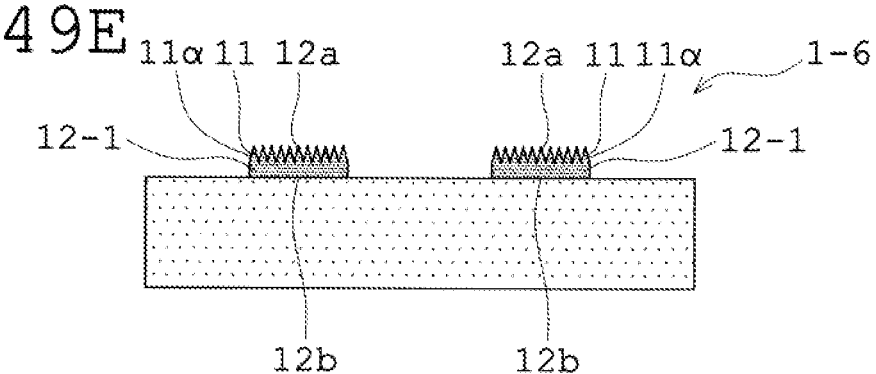

Then, the plating resist masks 31 are removed (See FIG. 49E).

Thereby, the substrate 1-6 for mounting a semiconductor element thereon of this embodiment mode is completed.

Regarding the process for forming the columnar terminal portions 12-1 including the silver plating layer 11 having acicular projections and, as an outermost plating layer, the reinforcing plating layer 11α covering the outer surface of the acicular projections in the roughened silver plating layer 11, in the case where the plating layers beneath reinforcing plating layer 11α in the columnar terminal portions 12-1 are composed of plating layers made of metals laminated in the order of gold/nickel/silver, it is preferable that, on an outer surface of sites corresponding to the columnar terminal portions 12-1 on one surface side of the metal plate 10, which serves as a base of the substrate for mounting a semiconductor element, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is the roughened silver plating layer 11 with acicular projections with a thickness of 0.2 μm or more and 3.0 μm or less, much preferably 0.5 μm.

Also, in the case where the plating layers beneath the reinforcing plating layer 11α in the columnar terminal portions 12-1 are composed of plating layers made of metals laminated in the order of gold/palladium/nickel/silver, it is preferable that, on an outer surface of sites corresponding to the columnar terminal portions 12-1 on one surface side of the metal plate 10, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a roughened silver plating layer with acicular projections with a thickness of 0.2 μm or more and 3.0 μm or less, much preferably 0.5 μm.

In the case where the plating layers beneath the reinforcing plating layer 11α in the columnar terminal portions 12-1 are composed of plating layers made of metals laminated in the order of gold/palladium/nickel/palladium/silver, it is preferable that, on an outer surface of sites corresponding to the columnar terminal portions 12-1 on one surface side of the metal plate 10, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is the roughened silver plating layer 11 with acicular projections with a thickness of 0.2 μm or more and 3.0 μm or less, much preferably 0.5 μm.

In the case where the plating layers beneath the reinforcing plating layer 11α in the columnar terminal portions 12-1 are composed of plating layers made of metals laminated in the order of gold/nickel/palladium/silver, it is preferable that, on an outer surface of sites corresponding to the columnar terminal portions 12-1 on one surface side of the metal plate 10, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is the roughened silver plating layer 11 with acicular projections with a thickness of 0.2 μm or more and 3.0 μm or less, much preferably 0.5 μm.

In the case where the plating layers beneath the reinforcing plating layer 11α in the columnar terminal portions 12-1 are composed of plating layers made of metals laminated in the order of gold/nickel/palladium/gold/silver, it is preferable that, on an outer surface of sites corresponding to the columnar terminal portions 12-1 on one surface side of the metal plate 10, there is formed a gold plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a gold plating layer with a thickness of 0.0005 μm or more and 0.5 μm or less, much preferably 0.005 μm, on which formed is the roughened silver plating layer 11 with acicular projections with a thickness of 0.2 μm or more and 3.0 μm or less, much preferably 0.5 μm.

In the case where the plating layers beneath the reinforcing plating layer 11α in the columnar terminal portions 12-1 are composed of plating layers made of metals laminated in the order of gold/palladium/nickel/palladium/gold/silver, it is preferable that, on an outer surface of sites corresponding to the columnar terminal portions 12-1 on one surface side of the metal plate 10, there is formed a gold plating layer with a thickness of 0.005 μm or more and 0.5 μm or less, much preferably 0.05 μm, on which formed is a palladium plating layer with a thickness of 0.005 μm or more and 0.5 μm or less, much preferably 0.05 μm, on which formed is a smooth-crystal nickel plating layer with a thickness of 5.0 μm or more and 80.0 μm or less, much preferably 30.0 μm, on which formed is a palladium plating layer with a thickness of 0.005 μm or more and 1.5 μm or less, much preferably 0.05 μm, on which formed is a gold plating layer with a thickness of 0.0005 μm or more and 0.5 μm or less, much preferably 0.005 μm, on which formed is the roughened silver plating layer 11 with acicular projections with a thickness of 0.2 μm or more and 3.0 μm or less, much preferably 0.5 μm.

In these cases, a silver flash layer with a thickness of 0.4 μm or more and 4.0 μm or less, preferably 1.0 μm is formed as the reinforcing plating layer 11α covering the outer surface of the acicular projections in the roughened silver plating layer 11.

The reinforcing plating player 11α covering the outer surface of the acicular projections in the roughened silver plating layer 11 may be configured of, in place of a silver flash layer, a three-layer plating layer composed of a nickel plating layer with a thickness of 0.4 μm or more and 4.0 μm or less, preferably 1.0 µm, a palladium plating layer with a thickness of 0.005 µm or more and 0.1 µm or less, preferably 0.01 µm, and a gold plating layer with a thickness of 0.0005 µm or more and 0.01 µm or less, preferably 0.001 µm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 µm.

Also, the material of the metal plate 10, which serves as a base of the substrate 1-6 for mounting a semiconductor element thereon, may be a stainless steel-based alloy. In this case, the columnar terminal portions 12-1 is configured of plating layers made of metals laminated in the order of gold/nickel/palladium/silver. In this case, it is preferable that, on an outer surface of sites corresponding to the columnar terminal portions 12-1 on the upper surface side of the metal plate 10, there is formed a gold plating layer with a thickness of 0.005 µm or more and 0.5 µm or less, much preferably 0.05 µm, on which formed is a smooth-crystal nickel plating layer with a thickness of 20.0 µm or more and 80.0 µm or less, much preferably 30.0 µm, on which formed is a palladium plating layer with a thickness of 0.005 µm or more and 1.5 µm or less, much preferably 0.05 µm, on which formed is a roughened silver plating layer having acicular projections at its outer surface, with a thickness of 0.2 µm or more and 3.0 µm or less, much preferably 0.5 µm.

In this case, a silver flash layer with a thickness of 0.4 µm or more and 4.0 µm or less, preferably 1.0 µm is formed as the reinforcing plating layer 11α covering the outer surface of the acicular projections in the roughened silver plating layer 11.

The reinforcing plating player 11α covering the outer surface of the acicular projections in the roughened silver plating layer 11 may be configured of, in place of a silver flash layer, a three-layer plating layer composed of a nickel plating layer with a thickness of 0.4 µm or more and 4.0 µm or less, preferably 1.0 µm, a palladium plating layer with a thickness of 0.005 µm or more and 0.1 µm or less, preferably 0.01 µm, and a gold plating layer with a thickness of 0.0005 µm or more and 0.01 µm or less, preferably 0.001 µm laminated in this order. In the case where the reinforcing plating layer 11α is configured of a nickel plating layer, a palladium plating layer and a gold plating layer laminated in this order, the upper limit of the total thickness of the reinforcing plating layer 11α is 4.0 µm.

In order to form the roughened silver plating layer 11 having acicular projections with a surface area ratio (i.e. the ratio of the surface area of the roughened silver plating layer to the surface area of a smooth surface) of 1.30 or more and 6.00 or less and with a crystal structure in which the crystal direction <101> occupies a largest proportion among the crystal directions <001>, <111> and <101>, the silver concentration in a silver plating bath composed of a methanesulfonic acid-based silver plating solution is set in the range of 1.0 g/L or more and 10 g/L or less. In particular, it is much preferable that the silver concentration is in the range of 1.5 g/L or more and 5.0 g/L or less.

A silver concentration lower than 1.0 g/L is not preferable because a roughened silver plating film cannot be formed sufficiently. A silver concentration higher than 10 g/L causes the film of the roughened silver plating layer to have a smooth surface, or fails to form acicular silver crystals, and thus is not preferable.

Next, an example of manufacturing procedure for a semiconductor package using the substrate 1-6 for mounting a semiconductor element thereon of this embodiment mode will be described in reference to FIGS. 50A-50F.

Figure 50A:
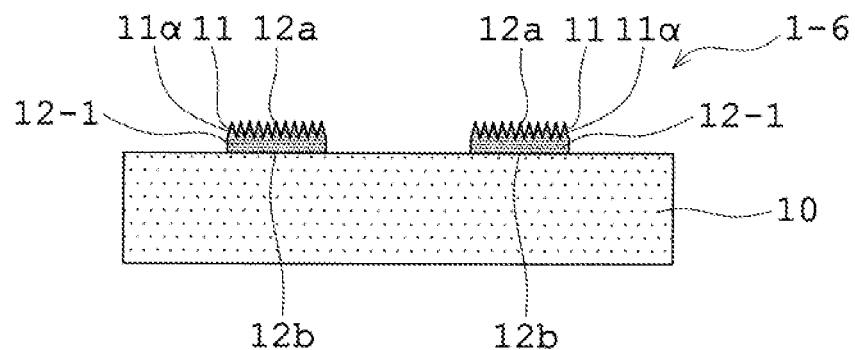
FIGS. 50A-50F are explanatory diagrams that show one example of manufacturing procedure for a semiconductor package using the substrate for mounting a semiconductor element thereon according to the thirteenth embodiment mode of the present invention.

First, the substrate 1-6 for mounting a semiconductor element thereon manufactured in accordance with the manufacturing procedure shown in FIGS. 49A-49E is prepared (See FIG. 50A).

Figure 50B:
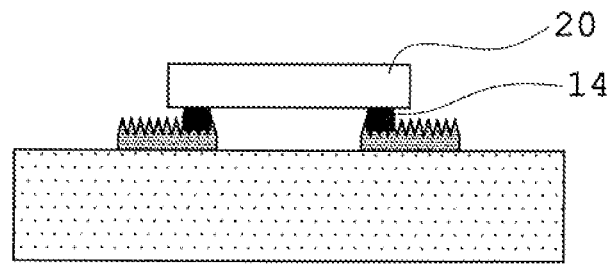

Then, solder 14 is printed on a site on which a semiconductor element is to be mounted, which is in the internal connection terminal portions 12a on top faces of the columnar terminal portions 12-1 of the substrate 1-6 for mounting a semiconductor element thereon, and a semiconductor element 20 is mounted thereon and fixed, so that electrodes of the semiconductor element 20 and the internal connection terminal portions 12a of the substrate 1-6 for mounting a semiconductor element thereon are electrically connected (See FIG. 50B).

Figure 50C:
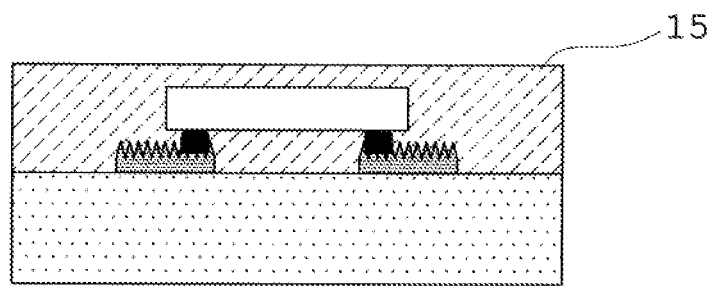

Then, a mold is used to seal, with a sealing resin 15, a surrounding space region on the upper surface side of the substrate 1-6 for mounting a semiconductor element thereon (See FIG. 50C).

Figure 50D:
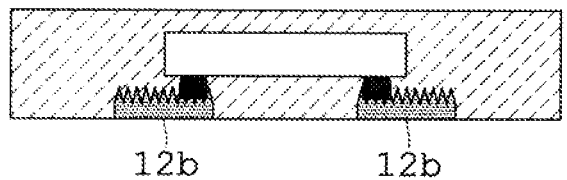

Then, the metal plate 10 serving as a base of the substrate 1 for mounting a semiconductor element thereon is removed by etching in the case of the metal plate 10 being made of a copper-based material or by peeling in the case of the metal plate 10 being made of a stainless steel-based material (See FIG. 50D).

Figure 50E:
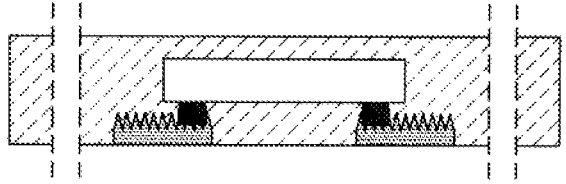

Lastly, semiconductor packages arrayed in multiple rows are singulated by dicing, pressing or the like (See FIG. 50E).

Figure 50F:
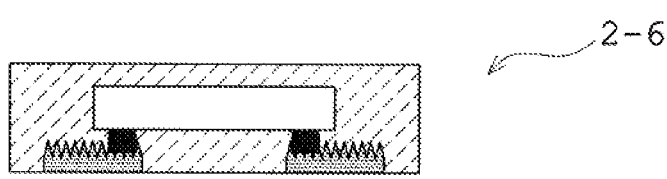

Thereby, a semiconductor package 2-6 using the substrate 1-6 for mounting a semiconductor element thereon of this embodiment mode is obtained (See FIG. 50F).

Fourteenth Embodiment Mode

Figure 51A:
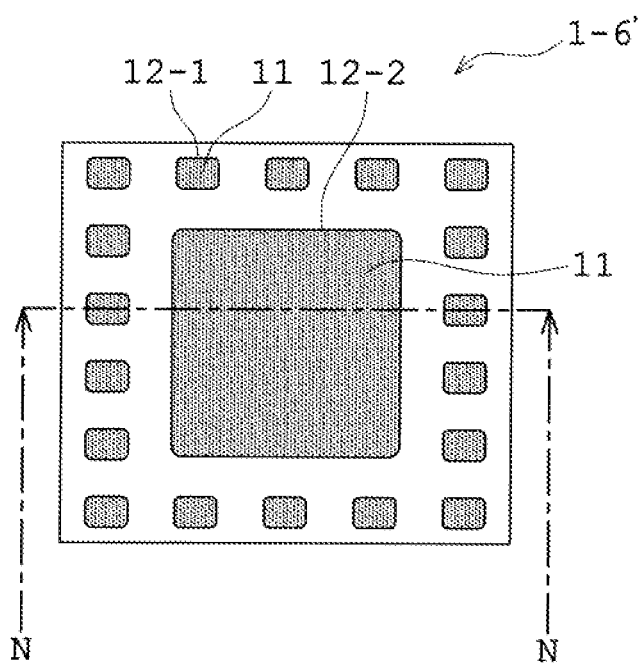
FIGS. 51A-51B are diagrams that show one example of substrate for mounting a semiconductor element thereon according to a fourteenth embodiment mode of the present invention, where
Figure 51B:
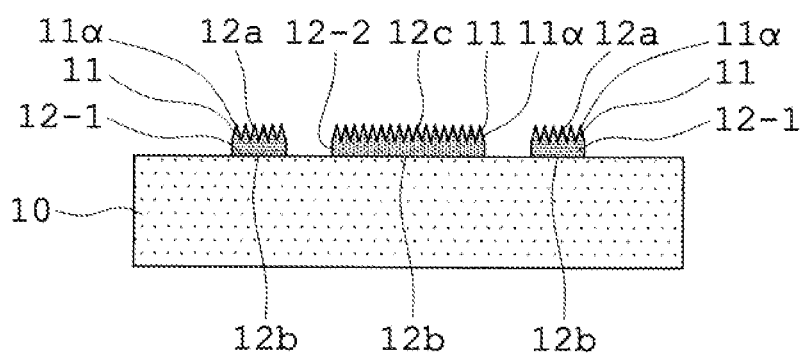
Figure 52:
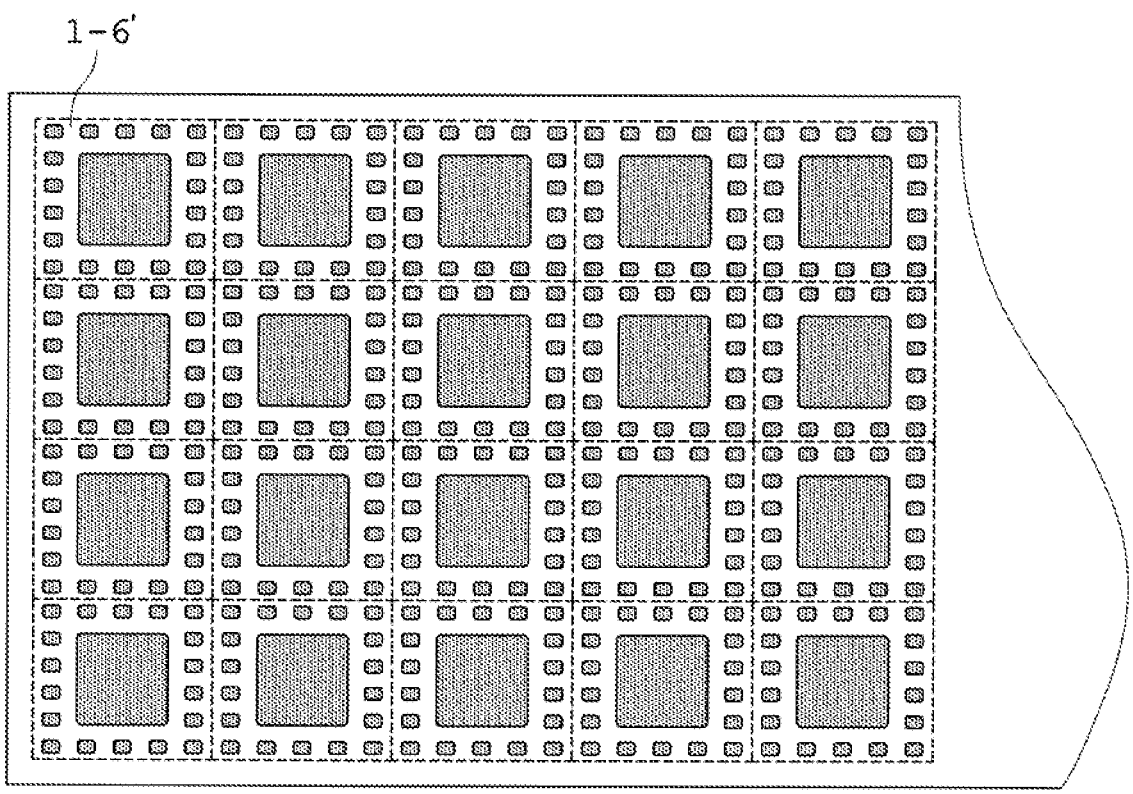
FIG. 52 is a plan view that shows one example of substrates for mounting semiconductor elements thereon arrayed in multiple rows according to the fourteenth embodiment mode of the present invention.
Figure 53A:
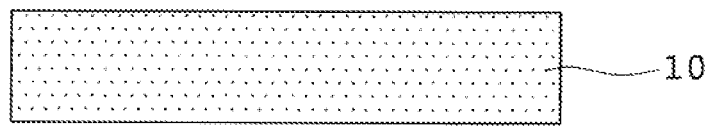
FIGS. 53A-53E are explanatory diagrams that show one example of manufacturing procedure for the substrate for mounting a semiconductor element thereon according to the fourteenth embodiment mode of the present invention.
Figure 53B:
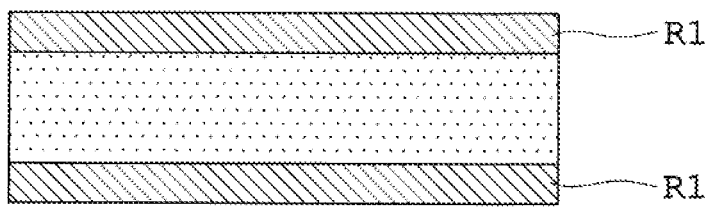
Figure 53C:
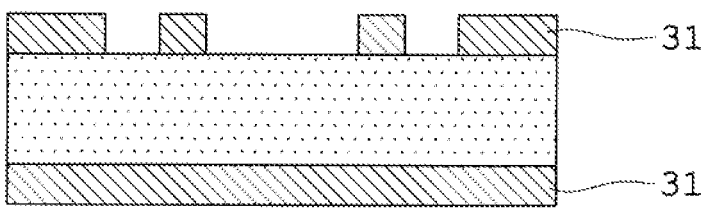
Figure 53D:
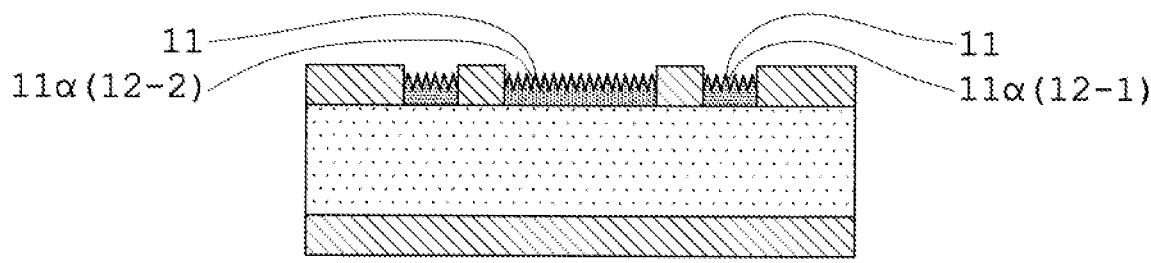
Figure 53E:
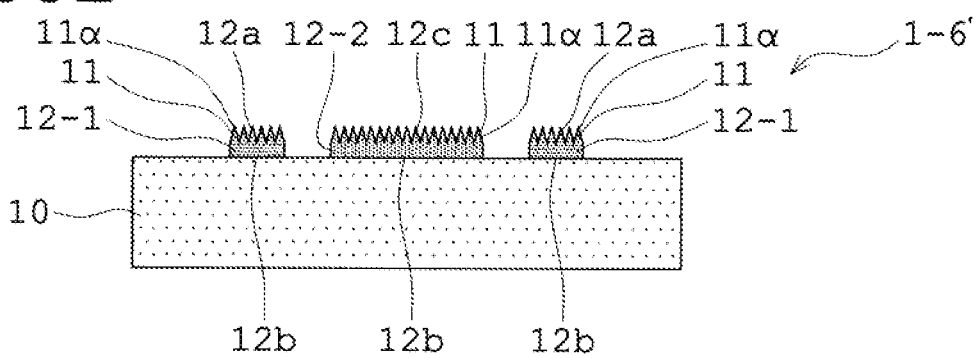

FIGS. 51A-51B are diagrams that show one example of substrate for mounting a semiconductor element thereon according to a fourteenth embodiment mode of the present invention, where FIG. 51A is a top view and FIG. 51B is an explanatory diagram schematically showing the N-N cross section in FIG. 51A. FIG. 52 is a plan view that shows one example of substrates for mounting semiconductor elements thereon arrayed in multiple rows according to the fourteenth embodiment mode of the present invention. FIGS. 53A-53E are explanatory diagrams that show one example of manufacturing procedure for the substrate for mounting a semiconductor element thereon according to the fourteenth embodiment mode of the present invention. FIGS. 54A-54F are explanatory diagrams that show one example of manufacturing procedure for a semiconductor package using the substrate for mounting a semiconductor element thereon according to the fourteenth embodiment mode of the present invention.

As shown in FIG. 51A, a substrate 1-6' for mounting a semiconductor element thereon of this embodiment mode is provided with a columnar terminal portion 12-2 with a large area arranged at the center position and a plurality of columnar terminal portions 12-1 with small areas arrayed along four sides around the columnar terminal portion 12-2. The columnar terminal portion 12-2 is configured, at the top face thereof, as a pad portion 12c on which a semiconductor element is to be mounted, and the columnar terminal portions 12-1 are configured, at the top faces thereof, as internal connection terminal portions 12a to be electrically connected with the semiconductor element via bonding wires.

The columnar terminal portions 12-1, 12-2 are composed only of plating layers of different metals and, as shown in FIG. 51B, are provided with a roughened silver plating layer 11 having acicular projections, and, as an outermost plating layer, a reinforcing plating layer 11α covering an outer surface of the acicular projections in the roughened silver plating layer 11.

The remaining configurations are substantially the same as in the substrate 1-6 for mounting a semiconductor element thereon of the thirteenth embodiment mode.

The substrate 1-6' for mounting a semiconductor element thereon of this embodiment mode is configured so that, as shown in FIG. 52, the individual substrates 1-6' for mounting semiconductor elements thereon are arrayed in multiple rows.

Next, an example of manufacturing procedure for the substrate 1-6' for mounting a semiconductor element thereon of this embodiment mode will be described in reference to FIGS. 53A-53E.

The manufacturing procedure for the substrate 1-6' for mounting a semiconductor element thereon of this embodiment mode is substantially the same as the manufacturing procedure for the substrate 1-6 for mounting a semiconductor element thereon of the thirteenth embodiment mode shown in FIGS. 49A-49E, and the process of forming the reinforcing plating layer 11α covering the outer surface of acicular projections in the roughened silver plating layer 11 and the kinds and plating thicknesses of plating metals composing the roughened silver plating layer 11 and the reinforcing plating layer 11α also are substantially the same as those in the substrate 1-6 for mounting a semiconductor element thereon of the thirteenth embodiment mode (See FIG. 53A through FIG. 53E).

Next, an example of manufacturing procedure for a semiconductor package using the substrate 1-6' for mounting a semiconductor element thereon of this embodiment mode will be described in reference to FIGS. 54A-54F.

Figure 54A:
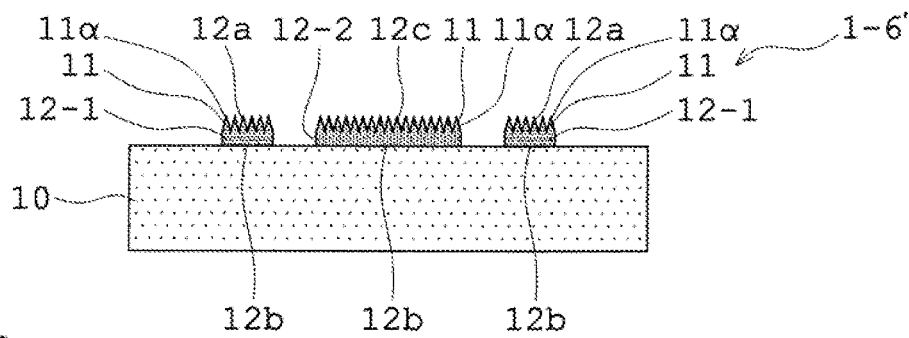
FIGS. 54A-54F are explanatory diagrams that show one example of manufacturing procedure for a semiconductor package using the substrate for mounting a semiconductor element thereon according to the fourteenth embodiment mode of the present invention.

First, the substrate 1-6' for mounting a semiconductor element thereon manufactured in accordance with the manufacturing procedure shown in FIGS. 53A-53E is prepared (See FIG. 54A).

Figure 54B:
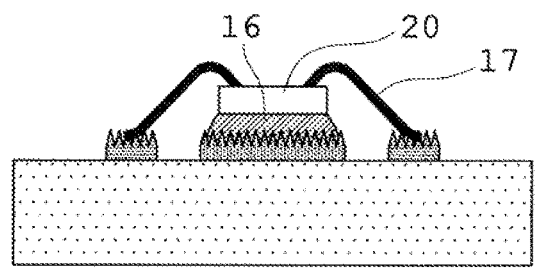

Then, a semiconductor element 20 is mounted and fixed on the pad portion 12c of the columnar terminal portion 12-2 on the upper surface side of the substrate 1-6' for mounting a semiconductor element thereon via die bond 16, and electrodes of the semiconductor element 20 and the internal connection terminal portions 12a of the columnar terminal portions 12-1 are electrically connected via bonding wires 17 (See FIG. 54B).

Figure 54C:
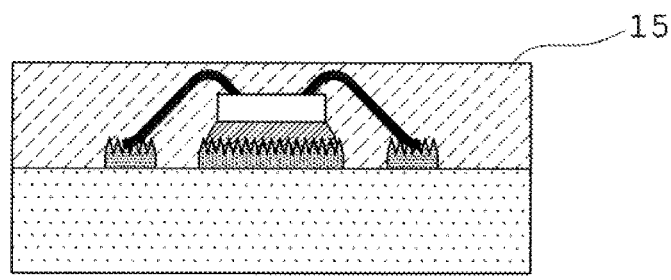
Figure 54D:
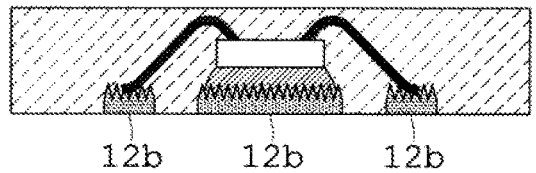
Figure 54E:
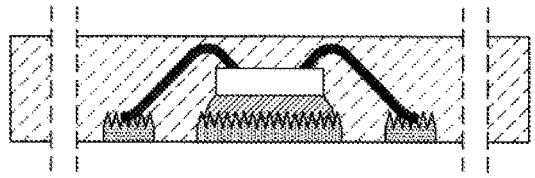

After that, resin sealing, removal of the metal plate 10, and singulation of individual semiconductor packages are carried out substantially in the same manner as in the case of the substrate for mounting a semiconductor element of the thirteenth embodiment mode (See FIG. 54C through FIG. 54E).

Figure 54F:
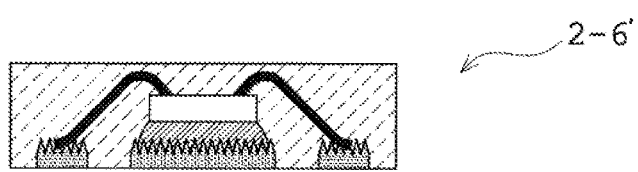

Thereby a semiconductor package 2-6' using the lead frame 1-6' of this embodiment mode is obtained (See FIG. 54F).

Embodied Example 1

A device for mounting a semiconductor element thereon of Embodied Example 1 is a lead frame corresponding to the lead frame 1-1 of the first embodiment mode, as one example of lead frame in which the roughened silver plating layer 11 is formed directly on the entire surface of the lead frame base 10 without an undercoat plating layer between.

In Embodied Example 1, a strip copper material having a thickness of 0.2 mm and a width of 180 mm was prepared as the lead frame base 10 (See FIG. 3A). Resist layers R1 with a thickness of 25 μm were formed on both surfaces of the copper material (See FIG. 3B) and were developed after exposure upon use of glass masks carrying predetermined patterns, to form etching resist masks 32 (See FIG. 3C). Then, etching treatment was made (See FIG. 3D) and the etching resist mask 32 were removed, to form a predetermined lead frame shape (See FIG. 3E).

The entire surface of the metal plate 10, which had been shaped into the predetermined lead frame shape, was subjected to pretreatment with alkali and acid, and then was electroplated in the following manner.

By use of a silver plating bath with a silver concentration of 3.5 g/L, which was composed of a methanesulfonic acid-based silver plating solution, plating was performed for 45 seconds at a current density of 5 A/dm$^2$ and at a temperature of 60° C., to form a roughened silver plating layer 11 with a thickness of about 1.5 μm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). Then, by use of a silver plating bath with a silver concentration of 65 g/L, which was composed of a cyan-based silver plating solution, plating was performed for 60 seconds at a current density of 3 A/dm$^2$, to form a silver flash layer with a thickness of 1.0 μm as a reinforcing plating layer 11α covering the outer surface of the acicular projections in the roughened silver plating layer 11 (See FIG. 3F), and thereby the lead frame 1-1 of Embodied Example 1 was obtained.

Embodied Example 2

A device for mounting a semiconductor element thereon of Embodied Example 2 is a lead frame corresponding to the lead frame 1-2' of the fourth embodiment mode, as one example of lead frame having a structure in which, in consideration of electrical connection to a semiconductor element being made by wire bonding (gold wire or copper wire), a nickel plating layer is applied to top faces of the lead frame base 10 as an undercoat barrier plating layer for preventing thermal diffusion of copper residing in the lead frame base 10.

In Embodied Example 2, a strip copper material having a thickness of 0.2 mm and a width of 180 mm was prepared as the lead frame base 10 (See FIG. 15A). First resist layers R1 with a thickness of 25 μm was formed on both surfaces of the copper material (See FIG. 15B), and the entire region of the first resist layer R1 on the upper surface side of the metal plate 10 was exposed and developed as well as the first resist layer R1 on the lower surface side of the metal plate 10 was exposed and developed upon use of a glass mask carrying a predetermined pattern corresponding to external connection terminal portions 10b, to form first plating resist masks 31-1 covering the entire region on the upper surface side of the metal plate 10 and having openings at sites corresponding to the external connection terminal portions 10b on the lower surface side of the metal plate 10 (See FIG. 15C).

Then, upon use of the first plating resist masks 31-1, a nickel plating layer having a thickness of 1.0 μm, a palladium plating layer having a thickness of 0.01 μm, and a gold plating layer having a thickness of 0.001 μm were laminated in this order on the lower surface of the metal plate 10 at the sites corresponding to the external connection terminal portions 10*b*, to form a plating layer 13 for external connection (See FIG. 15D).

Then, the first plating resist masks 31-1 were removed (See FIG. 15E), and second resist layers R2 were formed on the both sides of the metal plate 10 (See FIG. 15F).

Then, the second resist layer R2 on the upper surface side of the metal plate 10 was exposed and developed upon use of a glass mask carrying a predetermined pattern dependent on the lead frame to be manufactured, as well as the entire region of the second resist layer R2 on the lower surface side of the metal plate 10 was exposed and developed, to form second plating resist masks 31-2 having openings at sites corresponding to the lead frame on the upper surface side of the metal plate 10 and covering the entire region on the lower surface side of the metal plate 10 (See FIG. 15G).

Then, upon use of the second plating resist masks 31-2, the sites determined by the lead frame on the upper surface side of the metal plate 10 were subjected to pretreatment with alkali and acid, and then was electroplated in the following manner.

First, by use of a nickel plating bath composed of nickel sulfamate, nickel chloride and boric acid, plating was performed for 1 minute and 30 seconds at a current density of 2 A/dm$^2$, to form a nickel plating layer as a smooth undercoat having a thickness of about 1.0 μm. Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60° C., to form a roughened silver plating layer 11 with a thickness of about 0.5 μm having acicular projections and having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). Then, by use of a silver plating bath with a silver concentration of 65 g/L, which was composed of a cyan-based silver plating solution, plating was performed for 60 seconds at a current density of 3 A/dm$^2$, to form a silver flash layer with a thickness of 1.0 μm as a reinforcing plating layer 11α covering the outer surface of the acicular projections in the roughened silver plating layer 11 (See FIG. 15H). Then, the second plating resist masks 31-2 were removed (See FIG. 15I), and third resist layers R3 were formed on the both sides of the metal plate 10 (See FIG. 15J). Then, exposure and development were performed upon use of glass masks carrying a pattern corresponding to the lead frame, to form etching resist masks 32 (See FIG. 15K). Then, etching was performed on the both sides, to form the predetermined lead frame shape (See FIG. 15L), and the etching resist masks 32 were removed (See FIG. 15M), and thereby the lead frame 1-2' of Embodied Example 2 was obtained.

Embodied Example 3

A device for mounting a semiconductor element thereon of Embodied Example 3 is a lead frame corresponding to the lead frame 1-3' of the sixth embodiment mode, as one example of lead frame having a structure in which, in consideration of electrical connection to a semiconductor element being made by wire bonding (gold wire or copper wire), a nickel plating layer and palladium plating layer are laminated on (a) and (b) of a lead frame base 10, where (a) is top faces and (b) is faces that form concavities or through holes between the top faces and bottom faces of the lead frame base 10, as an undercoat barrier plating layer for preventing thermal diffusion of copper residing in the lead frame base 10.

In Embodied Example 3, a strip copper material having a thickness of 0.2 mm and a width of 180 mm was prepared as the lead frame base 10 (See FIG. 23A). First resist layers R1 with a thickness of 25 μm were formed on both surfaces of the copper material (See FIG. 23B), and the entire region of the first resist layer R1 on the upper surface side of the metal plate 10 was exposed and developed as well as the first resist layer R1 on the lower surface side of the metal plate 10 was exposed and developed upon use of a glass mask carrying a predetermined pattern corresponding to external connection terminal portions 10*b*, to form first plating resist masks 31-1 covering the entire region on the upper surface side of the metal plate 10 and having openings at sites corresponding to the external connection terminal portions 10*b* on the lower surface side of the metal plate 10 (See FIG. 23C).

Then, upon use of the first plating resist masks 31-1, a nickel plating layer having a thickness of 1.0 μm, a palladium plating layer having a thickness of 0.01 μm, and a gold plating layer having a thickness of 0.001 μm were laminated in this order on the lower surface of the metal plate 10 at the sites corresponding to the external connection terminal portions 10*b*, to form a plating layer 13 for external connection (See FIG. 23D).

Then, the first plating resist masks 31-1 were removed (See FIG. 23E), a second resist layer R2 having a fast peelability as taking a peeling time of 1 minute or so was formed on the upper side of the metal plate 10, and a second resist layer R2' having a slow peelability as taking a pealing time of 5 minutes or so was formed on the lower side of the metal plate 10 (See FIG. 23F).

Then, exposure and development were performed upon use of glass masks carrying a pattern corresponding to a predetermined lead frame shape, to form etching resist masks 32 and 32' (See FIG. 23G).

Then, etching was performed on the both sides, to form the predetermined lead frame shape (See FIG. 23H).

Then, by immersion in a stripper bath for about 1 minute, the etching resist mask 32 on the upper surface side of the metal plate 10 was removed while the etching resist mask 32' on the lower surface side of the metal plate 10 was left unremoved (See FIG. 23I).

Then, upon use of the etching resist mask 32' as a second plating resist mask, (a) and (b) of the metal plate 10, where (a) is top faces and (b) is faces that form concavities or through holes between the top faces and bottom faces of the metal plate 10, were subjected to pretreatment with alkali and acid, and then were electroplated in the following manner.

First, by use of a nickel plating bath composed of nickel sulfamate, nickel chloride and boric acid, plating was performed for 1 minute and 30 seconds at a current density of 2 A/dm$^2$, to form a nickel plating layer as a smooth undercoat having a thickness of about 1.0 μm. Then, by use of a palladium plating bath composed of a dichloroamine-based palladium plating solution, plating was performed for 10 seconds at a current density of 2 A/dm$^2$, to form a palladium plating layer as a smooth undercoat having a thickness of about 0.01 μm. Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60° C., to form a roughened silver plating layer 11 with a thickness of about 0.6 μm having acicular projections and having values shown in Table 1 regarding surface area ratio (i.e. the ratio of the surface area of the roughened silver plating layer to the surface area of a smooth surface), proportions of crystal directions <001>, <111> and <101>, and crystal grain diameter (average value). Then, by use of a silver plating bath with a silver concentration of 65 g/L, which was composed of a cyan-based silver plating solution, plating was performed for 60 seconds at a current density of 3 A/dm², to form a silver flash layer with a thickness of 1.0 μm as a reinforcing plating layer 11α covering the outer surface of the acicular projections in the roughened silver plating layer 11 (See FIG. 23J).

Then, by immersion in a stripper bath for about 4 minutes, the resist mask 32' on the lower surface side of the metal plate 10 was removed, (See FIG. 23K), and thereby the lead frame 1-3' of Embodied Example 3 was obtained.

Embodied Example 4

A device for mounting a semiconductor element thereon of Embodied Example 4 is a lead frame corresponding to the lead frame 1-4 of the seventh embodiment mode, as an example of lead frame having a structure in which, in consideration of electrical connection to a semiconductor element being made via solder, a silver plating layer is applied to faces of a lead frame base 10 that form concavities or a through hole between the top faces and bottom faces of the lead frame base 10, as an undercoat barrier plating for facilitating silver diffusion to solder.

In Embodied Example 4, a strip copper material having a thickness of 0.2 mm and a width of 180 mm was prepared as the lead frame base 10 (See FIG. 27A). First resist layers R1 with a thickness of 25 μm were formed on both surfaces of the copper material (See FIG. 27B), and the first resist layer R1 on the upper surface side of the metal plate 10 was exposed and developed upon use of a glass mask carrying a predetermined pattern corresponding to internal connection terminal portions 10a as well as the first resist layer R1 on the lower surface side of the metal plate 10 was exposed and developed upon use of a glass mask carrying a predetermined pattern corresponding to external connection terminal portions 10b, to form first plating resist masks 31-1 having openings at sites corresponding to the internal connection terminal portions 10a on the upper surface side of the metal plate 10 and having openings at sites corresponding to the external connection terminal portions 10b on the lower surface side of the metal plate 10, respectively (See FIG. 27C).

Then, upon use of the first plating resist masks 31-1, a nickel plating layer having a thickness of 1.0 μm, a palladium plating layer having a thickness of 0.01 μm, and a gold plating layer having a thickness of 0.001 μm were laminated in this order at the sites corresponding to the internal connection terminal portions 10a on the upper surface of the metal plate 10 and at the sites corresponding to the external connection terminal portions 10b on the lower surface of the metal plate 10, to form a plating layer 12 for internal connection and a plating layer 13 for external connection (See FIG. 27D).

Then, the first plating resist masks 31-1 were removed (See FIG. 27E), and second resist layers R2 were formed on the both sides of the metal plate 10 (See FIG. 27F).

Then, exposure and development were performed upon use of glass masks carrying a pattern corresponding to a predetermined lead frame shape, to form etching resist masks 32 (See FIG. 27G).

Then, etching was performed on the both sides, to form the predetermined lead frame shape (See FIG. 27H).

Then, upon use of the etching resist masks 32 on the both sides of the metal plate 10 as second plating resist masks, faces of the metal plate 10 that form concavities or through holes between the top faces and bottom faces of the metal plate 10 were subjected to pretreatment with alkali and acid, and then were electroplated in the following manner.

By use of a silver plating bath composed of a cyan-based silver plating solution, plating was performed for 60 seconds at a current density of 3 A/dm², to form a silver plating layer as a smooth undercoat having a thickness of about 1.1 μm. Then, by use of a silver plating bath with a silver concentration of 3.5 g/L, which was composed of a methanesulfonic acid-based silver plating solution, plating was performed for 15 seconds at a temperature of 60° C. and at a current density of 5 A/dm², to form a roughened silver plating layer 11 with a thickness of about 0.6 μm having acicular projections and having values shown in Table 1 regarding surface area ratio (i.e. the ratio of the surface area of the roughened silver plating layer to the surface area of a smooth surface), proportions of crystal directions <001>, <111> and <101>, and crystal grain diameter (average value). Then, by use of a silver plating bath with a silver concentration of 65 g/L, which was composed of a cyan-based silver plating solution, plating was performed for 60 seconds at a current density of 3 A/dm², to form a silver flash layer with a thickness of 1.0 μm as a reinforcing plating layer 11α covering the outer surface of the acicular projections in the roughened silver plating layer 11 (See FIG. 27I).

Then, the resist masks 32 were removed (See FIG. 27J), and thereby the lead frame 1-4 of Embodied Example 4 was obtained.

Embodied Example 5

A device for mounting a semiconductor element thereon of Embodied Example 5 is a substrate for mounting a semiconductor element thereon corresponding to the substrate 1-5 for mounting a semiconductor element thereon of the ninth embodiment mode, as an example of substrate for mounting a semiconductor element thereon having a structure in which, in consideration of electrical connection to a semiconductor element being made via solder, a nickel plating layer, a palladium plating layer and a gold plating layer are made to laminate top faces of the columnar terminal portions 10-1 as undercoat barrier plating for preventing diffusion of copper residing in the columnar terminal portions 10-1.

In Embodied Example 5, a strip copper material having a thickness of 0.125 mm and a width of 180 mm was prepared as a base 10 of a substrate for mounting a semiconductor element thereon (See FIG. 35A). First resist layers R1 with a thickness of 25 μm were formed on both surfaces of the copper material (See FIG. 35B). Then the first resist layer R1 on the upper surface side of the metal plate 10 was exposed and developed upon use of a glass mask carrying a predetermined pattern corresponding to columnar terminal portions 10-1 as well as the entire region of the first resist layer R1 on the lower surface side of the metal plate 10 was exposed and developed, to form plating resist masks 31 having openings at sites corresponding to the columnar terminal portions 10-1 on the upper surface side of the metal plate 10 and covering the entire region on the lower surface side of the metal plate 10 (See FIG. 35C).

Then, upon use of the plating resist masks 31, the sites corresponding to the columnar terminal portions 10-1 on the upper surface side of the metal plate 10 were subjected to pretreatment with alkali and acid, and then were electroplated in the following manner.

First, by use of a nickel plating bath composed of nickel sulfamate, nickel chloride and boric acid, plating was performed for 1 minute and 30 seconds at a current density of 2 A/dm$^2$, to form a nickel plating layer as a smooth undercoat having a thickness of about 1.0 µm. Then, by use of a palladium plating bath composed of a dichloroamine-based palladium plating solution, plating was performed for 10 seconds at a current density of 2 A/dm$^2$, to form a palladium plating layer as a smooth undercoat having a thickness of about 0.01 µm. Then, by use of a gold plating bath composed of a cyan-based gold plating solution, plating was performed for 10 seconds at a current density of 2 A/dm$^2$, to form a smooth gold plating layer with a thickness of about 0.001 µm. Then, by use of a silver plating bath with a silver concentration of 3.5 g/L, which was composed of a methanesulfonic acid-based silver plating solution, plating was performed for 15 seconds at a temperature of 60° C. and at a current density of 5 A/dm$^2$, to form a roughened silver plating layer 11 with a thickness of about 0.5 mun having acicular projections and having values shown in Table 1 regarding surface area ratio (i.e. the ratio of the surface area of the roughened silver plating layer to the surface area of a smooth surface), proportions of crystal directions <001>, <111> and <101>, and crystal grain diameter (average value). Then, by use of a silver plating bath with a silver concentration of 65 g/L, which was composed of a cyan-based silver plating solution, plating was performed for 60 seconds at a current density of 3 A/dm$^2$, to form a silver flash layer with a thickness of 1.0 µm as a reinforcing plating layer 11α covering the outer surface of the acicular projections in the roughened silver plating layer 11 (See FIG. 35D).

Then, the plating resist masks 31 were removed (See FIG. 35E), second resist layers R2 were formed on the both sides of the metal plate 10 (See FIG. 35F), and the second resist layer R2 on the upper surface side of the metal plate 10 was exposed and developed upon use of a glass mask carrying a predetermined pattern corresponding to the columnar terminal portions 10-1 as well as the entire region of the second resist layer R2 on the lower surface side of the metal plate 10 was exposed and developed, to form etching resist masks 32 covering the columnar terminal portions 10-1 and having openings at sites corresponding to concavities 10-2 on the upper surface side of the metal plate 10 and covering the entire region on the lower surface side of the metal plate 10 (See FIG. 35G).

Then, half-etching was performed on the upper surface, to form the columnar terminal portions 10-1 and the concavities 10-2 (See FIG. 35H), the etching resist masks 32 were removed (See FIG. 35I), and thereby the substrate 1-5 for mounting a semiconductor element thereon of Embodied Example 5 was obtained.

Embodied Example 6

A device for mounting a semiconductor element thereon of Embodied Example 6 is one example of substrate for mounting a semiconductor element thereon corresponding to the substrate 1-6 for mounting a semiconductor element thereon of the thirteenth embodiment mode.

In Embodied Example 6, a strip stainless steel material (SUS430) with a thickness of 0.15 mm and a width of 180 mm was prepared as a base 10 of a substrate for mounting a semiconductor element thereon (See FIG. 49A), and two sheets of film resist each with a thickness of 38 µm were laminated on the upper surface side of the stainless steel material and one sheet of the same film resist was laminated on the lower surface side, to form resist layers R1 (See FIG. 49B).

Lamination was conducted at a roll temperature of 105° C., a roll pressure of 0.5 MPa, and a feed rate of 2.5 m/min. The laminated film resist was a negative resist for which exposure with ultraviolet light was available.

Then, the resist layer R1 on the upper surface side was exposed and developed by use of a ultraviolet mercury lamp as a light source upon use of a glass mask carrying a predetermined pattern corresponding to columnar terminal portions 12-1 as well as the entire region of the resist layer R1 on the lower surface side of the metal plate 10 was exposed and developed, to form plating resist masks 31 having openings at sites corresponding to the columnar terminal portions 12-1 on the upper surface side of the metal plate 10 and covering the entire region on the lower surface side of the metal plate 10 (See FIG. 49C).

Then, upon use of the plating resist masks 31, the sites corresponding to internal connection terminal portions 12a on the upper surface of the metal plate 10 were subjected to pretreatment with alkali and acid (removal of surface oxide film and activation treatment of the surface) and then were electroplated in the following manner.

To be specific, first, a gold plating layer with a thickness of 0.05 µm was formed, and thereon, by use of a nickel plating bath composed of nickel sulfamate, nickel chloride and boric acid, plating was performed for 90 minutes at a current density of 2 A/dm$^2$, to form a smooth-crystal nickel plating layer with a thickness of 31.0 µm, and thereon a palladium plating layer of 0.06 µm was formed.

Then, by use of a silver plating bath with a silver concentration of 3.5 g/L, which was composed of a methanesulfonic acid-based silver plating solution, plating was performed for 15 seconds at a current density of 5 A/dm$^2$ and at a temperature of 60'C, to form a roughened silver plating layer 11 with a thickness of 0.5 µm having acicular projections and having values shown in Table 1 regarding surface area ratio (i.e. the ratio of the surface area of the roughened silver plating layer to the surface area of a smooth surface), proportions of crystal directions <001>, <111> and <101>, and crystal grain diameter (average value), thereby completing the columnar terminal portions 12-1 (See FIG. 49D).

Then, the plating resist masks 31 were removed by an alkaline solution (See FIG. 49E), and thereby the substrate 1-6 for mounting a semiconductor element thereon of Embodied Example 6 was obtained.

Embodied Example 7

A device for mounting a semiconductor element thereon of Embodied Example 7 is one example of lead frame corresponding to the lead frame 1-1 of the first embodiment mode.

In Embodied Example 7, the lead frame 1-1 of Embodied Example 7 was obtained by substantially the same manufacturing procedure and under substantially the same conditions as in Embodied Example 1 except that plating layers composed of the following three layers were formed as the reinforcing plating layer 11α covering the outer surface of the acicular projections in the roughened silver plating layer 11.

In formation of the reinforcing plating layer 11α, first, by use of a nickel plating bath composed of nickel sulfamate, nickel chloride and boric acid, plating was performed for 1 minute and 30 seconds at a current density of 2 A/dm$^2$, to form a nickel plating layer with a thickness of about 1.0 μm. Then, by use of a palladium plating bath composed of a dichloroamine-based palladium plating solution, plating was performed for 10 seconds at a current density of 2 A/dm², to form a palladium plating layer with a thickness of about 0.01 μm. Then, by use of a gold plating bath composed of a cyan-based gold plating solution, plating was performed for 10 seconds at a current density of 2 A/dm², to form a gold plating layer with a thickness of about 0.001 μm.

Embodied Example 8

A device for mounting a semiconductor element thereon of Embodied Example 8 is one example of lead frame corresponding to the lead frame 1-2' of the fourth embodiment mode.

In Embodied Example 8, the lead frame 1-2' of Embodied Example 8 was obtained by substantially the same manufacturing procedure and under substantially the same conditions as in Embodied Example 2 except that, substantially as same as Embodied Example 7, plating layers composed of three layers that were a nickel plating layer with a thickness of 1.0 μm, a palladium plating layer with a thickness of 0.01 μm, and a gold plating layer with a thickness of 0.001 μm, were formed as the reinforcing plating layer 11α covering the outer surface of the acicular projections in the roughened silver plating layer 11.

Embodied Example 9

A device for mounting a semiconductor element thereon of Embodied Example 9 is one example of lead frame corresponding to the lead frame 1-3' of the sixth embodiment mode.

In Embodied Example 9, the lead frame 1-3' of Embodied Example 9 was obtained by substantially the same manufacturing procedure and under substantially the same conditions as in Embodied Example 3 except that, substantially as same as Embodied Example 7, plating layers composed of three layers that were a nickel plating layer with a thickness of 1.0 μm, a palladium plating layer with a thickness of 0.01 μm, and a gold plating layer with a thickness of 0.001 μm, were formed as the reinforcing plating layer 11α covering the outer surface of the acicular projections in the roughened silver plating layer 11.

Embodied Example 10

A device for mounting a semiconductor element thereon of Embodied Example 10 is one example of lead frame corresponding to the lead frame 1-4 of the seventh embodiment mode.

In Embodied Example 10, the lead frame 1-4 of Embodied Example 10 was obtained by substantially the same manufacturing procedure and under substantially the same conditions as in Embodied Example 4 except that, substantially as same as Embodied Example 7, plating layers composed of three layers that were a nickel plating layer with a thickness of 1.0 μm, a palladium plating layer with a thickness of 0.01 μm, and a gold plating layer with a thickness of 0.001 μm, were formed as the reinforcing plating layer 11α covering the outer surface of the acicular projections in the roughened silver plating layer 11.

Embodied Example 11

A device for mounting a semiconductor element thereon of Embodied Example 11 is one example of substrate for mounting a semiconductor element thereon corresponding to the substrate 1-5 for mounting a semiconductor element thereon of the ninth embodiment mode.

In Embodied Example 11, the substrate 1-5 for mounting a semiconductor element thereon of Embodied Example 11 was obtained by substantially the same manufacturing procedure and under substantially the same conditions as in Embodied Example 5 except that, substantially as same as Embodied Example 7, plating layers composed of three layers that were a nickel plating layer with a thickness of 1.0 μm, a palladium plating layer with a thickness of 0.01 μm, and a gold plating layer with a thickness of 0.001 μm, were formed as the reinforcing plating layer 11α covering the outer surface of the acicular projections in the roughened silver plating layer 11.

Embodied Example 12

A device for mounting a semiconductor element thereon of Embodied Example 12 is one example of substrate for mounting a semiconductor element thereon corresponding to the substrate 1-6 for mounting a semiconductor element thereon of the thirteenth embodiment mode.

In Embodied Example 12, the the substrate 1-6 for mounting a semiconductor element thereon of Embodied Example 12 was obtained by substantially the same manufacturing procedure and under substantially the same conditions as in Embodied Example 6 except that, substantially as same as Embodied Example 7, plating layers composed of three layers that were a nickel plating layer with a thickness of 1.0 μm, a palladium plating layer with a thickness of 0.01 μm, and a gold plating layer with a thickness of 0.001 μm, were formed as the reinforcing plating layer 11α covering the outer surface of the acicular projections in the roughened silver plating layer 11.

Comparative Example 1

A device for mounting a semiconductor element thereon of Comparative Example 1 is one example of lead frame in which a smooth silver plating layer is formed directly on the entire surface of the lead frame base without an undercoat plating layer between.

In Comparative Example, up to formation of a lead frame shape and pretreatment for electroplating, the steps were carried out substantially in the same manner as in Embodied Example 1. In the subsequent electroplating treatment, by use of a silver plating bath with a silver concentration of 65 g/L, which was composed of a cyan-based silver plating solution, plating was performed for 3 minutes at a current density of 3 A/dm², to form a silver plating layer with a thickness of 2.5 μm and having a smooth surface, and thereby a lead frame of Comparative Example 1 was obtained.

Comparative Example 2

A device for mounting a semiconductor element thereon of Comparative Example 2 is one example of lead frame in which a silver plating layer having a roughened surface with unevenness expressed by a surface area ratio (here, the ratio of the surface area of the roughened silver plating layer to the surface area of a smooth surface) of less than 1.30 is formed on the entire surface of a lead frame base.

In Comparative Example 2, up to formation of a lead frame shape and pretreatment for electroplating, the steps were carried out substantially in the same manner as in Embodied Example 1. In the subsequent electroplating treatment, by use of a silver plating bath with a silver concentration of 65 g/L, which was composed of a cyan-based silver plating solution, plating was performed for 6 minutes at a current density of 3 A/dm$^2$, to form a silver plating layer with a thickness of 5.0 μm and having a smooth surface. Then, the outer surface of the silver plating layer was subjected to microetching treatment for 2 minutes by use of a stripping solution for silver plating, to form a roughened surface with unevenness at the outer surface of the silver plating layer, and thereby a lead frame of Comparative Example 2 was obtained. The silver plating layer given the roughened surface with unevenness at the outer surface had a thickness of 2.8 μm, which was about half the thickness of the silver plating layer having the smooth surface.

Comparative Example 3

A device for mounting a semiconductor element thereon of Comparative Example 3 is one example of lead frame in which an undercoat plating layer having a roughened surface is formed on the entire surface of a lead frame base, and a silver plating layer is formed thereon.

In Comparative Example 3, up to formation of a lead frame shape through pretreatment for electroplating, the steps were carried out substantially in the same manner as in Embodied Example 1. In the subsequent electroplating treatment, first, by use of a nickel plating bath composed of nickel sulfamate, nickel chloride and boric acid, plating was performed for 7 minutes and 30 seconds at a current density of 2 A/dm$^2$, to form a nickel plating layer with a thickness of about 5.0 μm and a smooth surface. Then, the outer surface of the nickel plating layer was subjected to microetching treatment for 2 minutes by use of a stripping solution for nickel plating, to form a roughened surface with unevenness at the outer surface of the nickel plating layer. The nickel plating layer given the roughened surface with unevenness at its outer surface had a thickness of 2.6 μm, which was about half the thickness of the nickel plating layer having a smooth surface. Then, by use of a silver plating bath with a silver concentration of 65 g/L, which was composed of a cyan-based silver plating solution, plating was performed for 1 minute and 30 seconds at a current density of 3 A/dm$^2$, to form, as following the surface shape of the underlying nickel plating layer, a silver plating layer with a thickness of 1.5 μm and a roughened surface with unevenness having values shown in Table 1 regarding surface area ratio (i.e. the ratio of the surface area of the roughened silver plating layer to the surface area of a corresponding smooth surface), proportions of crystal directions <001>, <111> and <101>, and crystal grain diameter (average value). Thereby, the lead frame of Comparative Example 3 was obtained.

Comparative Example 4

A device for mounting a semiconductor element thereon of Comparative Example 4 is one example of substrate for mounting a semiconductor element thereon in which an outermost plating layer in columnar terminal portions composed only of plating layers is configured of a smooth silver plating layer.

In Comparative Example 4, up to formation of a nickel plating layer in eletroplating treatment, the steps were carried out substantially in the same manner as in Embodied Example 6. Then, by use of a silver plating bath with a silver concentration of 65 g/L, which was composed of a cyan-based silver plating solution, plating was performed for 1 minute and 30 seconds at a current density of 3 A/dm$^2$, to form a silver plating layer with a thickness of 1.5 μm and having a smooth surface, to complete the columnar terminal portions. Then, plating resist masks were removed by an alkaline solution, and thereby the substrate for mounting a semiconductor element thereon of Comparative Example 4 was obtained.

Comparative Example 5

A device for mounting a semiconductor element thereon of Comparative Example 5 is a substrate for mounting a semiconductor element thereon in which an outermost plating layer in columnar terminal portions composed only of plating layers is a smooth silver plating layer, as one example of substrate for mounting a semiconductor element thereon in which the columnar terminal portions are configured to include a silver plating layer having a roughened surface with unevenness expressed by a surface area ratio (here, the ratio of the surface area of the silver plating layer to the surface area of a smooth surface) of less than 1.30 as an outermost plating layer.

In Comparative Example 5, up to formation of a gold plating layer in electroplating treatment, the steps were carried out substantially in the same manner as in Embodied Example 6. Then, by use of a nickel plating bath composed of nickel sulfamate, nickel chloride and boric acid, plating was performed for 90 minutes at a current density of 2 A/dm$^2$, to form a nickel plating layer with a thickness of about 31.0 μm on the gold plating layer. Then, by use of a silver plating bath with a silver concentration of 65 g/L, which was composed of a cyan-based silver plating solution, plating was performed for 5 minutes at a current density of 3 A/dm$^2$, to form a silver plating layer with a thickness of 4.0 μm having a smooth surface. Then, the outer surface of the silver plating layer was subjected to microetching treatment for 2 minutes by use of a stripping solution for silver plating, to form a roughened surface with unevenness at the outer surface of the silver plating layer, thereby completing the columnar terminal portions. The silver plating layer given the roughened surface with unevenness at the outer surface had a thickness of 1.7 μm. Then, the plating resist masks were removed by alkaline solution, and thereby the substrate for mounting a semiconductor element thereon of Comparative Example 5 was obtained.

Comparative Example 6

A device for mounting a semiconductor element thereon of Comparative Example 6 is a substrate for mounting a semiconductor element thereon in which an outermost plating layer in columnar terminal portions composed only of plating layers is a smooth silver plating layer, as one example of substrate for mounting a semiconductor element thereon in which an undercoat plating layer with a roughened surface at its outer surface is formed and thereon a silver plating layer is formed, to constitute the columnar terminal portions.

In Comparative Example 6, up to formation of a gold plating layer in electroplating treatment, the steps were carried out substantially in the same manner as in Embodied Example 6. Then, by use of a nickel plating bath composed of nickel sulfamate, nickel chloride and boric acid, plating was performed for 97 minutes at a current density of 2 A/dm$^2$, to form a nickel plating layer with a thickness of about 34.5 μm. Then, the outer surface of the nickel plating layer was subjected to microetching treatment for 2 minutes by use of a stripping solution for nickel plating, to form a roughened surface with unevenness at the outer surface of the nickel plating layer. The nickel plating layer given the roughened surface with unevenness at the outer surface had a thickness of 32 μm. Then, by use of a silver plating bath with a silver concentration of 65 g/L, which was composed of a cyan-based silver plating solution, plating was performed for 1 minute and 30 seconds at a current density of 3 A/dm², to form, as following the surface shape of the underlying nickel plating layer, a silver plating layer with a thickness of 1.6 μm and a roughened surface with unevenness having values shown in Table 1 regarding surface area ratio (here, the ratio of the surface area of the silver plating layer to the surface area of a smooth surface), proportions of crystal directions <001>, <111> and <101>, and crystal grain diameter (average value), thereby completing the columnar terminal portions. Then, the plating resist masks were removed by an alkaline solution, and thereby the substrate for mounting a semiconductor element thereon of Embodied Example 6 was obtained.

Comparative Example 7

A device for mounting a semiconductor element thereon of Comparative Example 7 is one example of lead frame in which a roughened silver plating layer having acicular projections is provided as an outermost plating layer with no reinforcing silver plating layer to cover the outer surface of the acicular projections in the roughened silver plating layer being formed.

In Comparative Example, the steps were carried out substantially in the same manner as in Embodied Example 1 up to formation of the roughened silver plating layer in electroplating treatment, and thereby the lead frame of Comparative Example 7 was obtained.

Comparative Example 8

A device for mounting a semiconductor element thereon of Comparative Example 8 is a substrate for mounting a semiconductor element thereon in which an outermost plating layer in columnar terminal portions composed only of plating layers is a smooth silver plating layer, as one example of substrate for mounting a semiconductor element thereon in which a roughened silver plating layer having acicular projections is provided as an outermost plating layer with no reinforcing silver plating layer to cover the outer surface of the acicular projections in the roughened silver plating layer being formed.

In Comparative Example 8, the steps were carried out substantially in the same manner as in Embodied Example 6 up to formation of the roughened silver plating layer in electroplating treatment, and thereby the substrate for mounting a semiconductor element thereon of Comparative Example 8 was obtained.

The plating composition requirements (material of base (substrate) of device for mounting semiconductor element, type and thickness of plating layers, surface area ratio (i.e. ratio of surface area of (roughened or smooth) silver plating layer to surface area of corresponding smooth surface), proportions of crystal directions in silver plating layer, and crystal grain diameter (average value)), for each of the devices for mounting semiconductor elements thereon of Embodied Examples 1 to 12 and Comparative Examples 1 to 8 are shown in Table 1 and Table 2.

It is noted that the field of view observed at 10,000× through a scanning electron microscope (SEM: Scanning Electron Microscope) was analyzed by an electron backscatter diffraction analyzer (EBSD: Electron Backscatter Diffraction) so that the proportions of crystal directions were calculated upon allowable angles for the respective directions being set to 15°. Further, a diameter of a crystal grain was defined as a diameter of a circle with an area equivalent to that of the crystal grain, which was defined by a grain boundary where the direction difference was 15" or more.

The plating thickness of a silver plating layer was measured by an X-ray fluorescence analyzer (SFT3300 manufactured by SII), and the plating thickness of a plating layer using nickel/palladium/gold plating was measured by an X-ray fluorescence analyzer (SFT3300 manufactured by SII).

The surface area ratio was measured by use of a 3D laser microscope (OLS4100 manufactured by OLYMPUS).

TABLE 1

| Example | Base Material | Undercoat Plating Layer | | | | | Ag Plating Layer | | | | | | |
|---|---|---|---|---|---|---|---|---|---|---|---|---|---|
| | | Surface Morphology | Thickness (μm) | | | | Surface Morphology | Thickness (μm) | Surface Area Ratio | Proportion of Crystal Direction (%) | | | Crystal Grain (μm) |
| | | | Au | Ag | Ni | Pd | Au | | | | <001> | <111> | <101> | |
| Embodied Example 1 | Copper | — | — | — | — | — | — | Acicular Projections | 1.5 | 3.1 | 8.7 | 16.3 | 23.6 | 0.1818 |
| Embodied Example 2 | Copper | Smooth | — | — | 1.0 | — | — | Acicular Projections | 0.5 | 3.0 | 9.2 | 16.1 | 22.7 | 0.1935 |
| Embodied Example 3 | Capper | Smooth | — | — | 1.0 | 0.01 | — | Acicular Projections | 0.6 | 3.1 | 8.8 | 15.9 | 23.2 | 0.2037 |
| Embodied Example 4 | Copper | Smooth | — | 1.1 | — | — | — | Acicular Projections | 0.6 | 2.9 | 9.0 | 15.8 | 22.8 | 0.1865 |
| Embodied Example 5 | Copper | Smooth | — | — | 1.0 | 0.01 | 0.001 | Acicular Projections | 0.5 | 3.1 | 8.6 | 16.3 | 23.0 | 0.1903 |
| Embodied Example 6 | Stainless Steel | Smooth | 0.05 | — | 30.0 | 0.05 | — | Acicular Projections | 0.5 | 3.1 | 8.8 | 16.0 | 23.1 | 0.1907 |
| Embodied Example 7 | Copper | — | — | — | — | — | — | Acicular Projections | 1.5 | 3.1 | 8.7 | 16.3 | 23.6 | 0.1818 |
| Embodied Example 8 | Copper | Smooth | — | — | 1.0 | — | — | Acicular Projections | 0.5 | 3.0 | 9.2 | 16.1 | 22.7 | 0.1935 |
| Embodied Example 9 | Copper | Smooth | — | — | 1.0 | 0.01 | — | Acicular Projections | 0.6 | 3.1 | 8.8 | 15.9 | 23.2 | 0.2037 |

TABLE 1-continued

| Example | Base Material | Undercoat Plating Layer Surface Morphology | Thickness (μm) Au | Ag | Ni | Pd | Au | Ag Plating Layer Surface Morphology | Thickness (μm) | Surface Area Ratio | Proportion of Crystal Direction (%) <001> | <111> | <101> | Crystal Grain (μm) |
|---|---|---|---|---|---|---|---|---|---|---|---|---|---|---|
| Embodied Example 10 | Copper | Smooth | — | 1.1 | — | — | — | Acicular Projections | 0.6 | 2.9 | 9.0 | 15.8 | 22.8 | 0.1865 |
| Embodied Example 11 | Copper | Smooth | — | — | 1.0 | 0.01 | 0.001 | Acicular Projections | 0.5 | 3.1 | 8.6 | 16.3 | 23.0 | 0.1903 |
| Embodied Example 12 | Stainless Steel | Smooth | 0.05 | — | 30.0 | — | 0.05 | Acicular Projections | 0.5 | 3.0 | 8.6 | 15.9 | 22.8 | 0.2013 |
| Comparative Example 1 | Copper | — | — | — | — | — | — | Smooth | 2.5 | 1.1 | 23.4 | 12.3 | 6.3 | 0.3058 |
| Comparative Example 2 | Copper | — | — | — | — | — | — | Unevenness by Etching | 2.8 | 1.3 | 22.6 | 14.2 | 7.2 | 0.3268 |
| Comparative Example 3 | Copper | Unevenness by Etching | — | 2.6 | — | — | — | Unevenness following Ni Layer | 1.5 | 1.3 | 22.9 | 13.8 | 7.0 | 0.3120 |
| Comparative Example 4 | Stainless Steel | Smooth | 0.05 | — | 30.0 | — | — | Smooth | 1.5 | 1.0 | 23.5 | 14.0 | 6.7 | 0.3308 |
| Comparative Example 5 | Stainless Steel | Smooth | 0.05 | — | 31.0 | — | — | Unevenness by Etching | 1.7 | 1.3 | 22.8 | 13.9 | 7.1 | 0.3121 |
| Comparative Example 6 | Stainless Steel | Unevenness by Etching | 0.05 | — | 32.0 | — | — | Unevenness following Ni Layer | 1.6 | 1.3 | 22.5 | 13.8 | 7.0 | 0.3288 |
| Comparative Example 7 | Copper | — | — | — | — | — | — | Acicular Projections | 1.5 | 3.1 | 8.7 | 16.3 | 23.6 | 0.1818 |
| Comparative Example 8 | Stainless Steel | Smooth | 0.05 | — | 30.0 | — | 0.05 | Acicular Projections | 0.5 | 3.1 | 8.8 | 16.0 | 23.1 | 0.1907 |

TABLE 2

| Example | Reinforcing Plating Layer Thickness (μm) Ag | Ni | Pd | Au | Outermost Layer Surface Morphology | Surface Area Ratio | Proportion of Crystal Direction (%) <001> | <111> | <101> | Crystal Grain Diameter (μm) |
|---|---|---|---|---|---|---|---|---|---|---|
| Embodied Example 1 | 1.0 | — | — | — | Following Acicular Projections | 3.0 | 8.6 | 15.9 | 22.8 | 0.1925 |
| Embodied Example 2 | 1.0 | — | — | — | Following Acicular Projections | 3.0 | 9.0 | 16.0 | 23.1 | 0.2037 |
| Embodied Example 3 | 1.0 | — | — | — | Following Acicular Projections | 2.9 | 8.9 | 16.0 | 22.8 | 0.1987 |
| Embodied Example 4 | 1.0 | — | — | — | Following Acicular Projections | 3.0 | 9.0 | 16.1 | 23.4 | 0.1832 |
| Embodied Example 5 | 1.0 | — | — | — | Following Acicular Projections | 3.1 | 8.8 | 16.0 | 23.1 | 0.1964 |
| Embodied Example 6 | 1.0 | — | — | — | Following Acicular Projections | 3.0 | 8.8 | 15.8 | 23.2 | 0.2035 |
| Embodied Example 7 | — | 1.0 | 0.01 | 0.001 | Following Acicular Projections | 3.1 | 8.6 | 15.8 | 22.8 | 0.1956 |
| Embodied Example 8 | — | 1.0 | 0.01 | 0.001 | Following Acicular Projections | 3.0 | 8.8 | 16.1 | 23.2 | 0.1987 |
| Embodied Example 9 | — | 1.0 | 0.01 | 0.001 | Following Acicular Projections | 2.9 | 8.9 | 16.0 | 23.0 | 0.1956 |
| Embodied Example 10 | — | 1.0 | 0.01 | 0.001 | Following Acicular Projections | 3.0 | 9.1 | 15.9 | 23.2 | 0.1934 |
| Embodied Example 11 | — | 1.0 | 0.01 | 0.001 | Following Acicular Projections | 3.1 | 8.7 | 15.9 | 22.7 | 0.1976 |
| Embodied Example 12 | — | 1.0 | 0.01 | 0.001 | Following Acicular Projections | 3.0 | 9.0 | 16.0 | 22.8 | 0.1902 |
| Comparative Example 1 | — | — | — | — | Smooth | 1.1 | 23.4 | 12.3 | 6.3 | 0.3058 |
| Comparative Example 2 | — | — | — | — | Unevenness by Etching | 1.3 | 22.6 | 14.2 | 7.2 | 0.3268 |
| Comparative Example 3 | — | — | — | — | Unevenness Following Ni Layer | 1.3 | 22.3 | 13.8 | 7.0 | 0.3120 |
| Comparative Example 4 | — | — | — | — | Smooth | 1.0 | 23.5 | 14.0 | 6.7 | 0.3308 |
| Comparative Example 5 | — | — | — | — | Unevenness by Etching | 1.3 | 22.8 | 13.9 | 7.1 | 0.3121 |

TABLE 2-continued

| | Reinforcing Plating Layer Thickness (μm) | | | | Outermost Layer | | Proportion of Crystal Direction (%) | | | |
|---|---|---|---|---|---|---|---|---|---|---|
| Example | Ag | Ni | Pd | Au | Surface Morphology | Surface Area Ratio | <001> | <111> | <101> | Crystal Grain Diameter (μm) |
| Comparative Example 6 | — | — | — | — | Unevenness Following Ni Layer | 1.3 | 22.5 | 13.8 | 7.0 | 0.3288 |
| Comparative Example 7 | — | — | — | — | Acicular Projections | 3.1 | 8.7 | 16.3 | 23.6 | 0.1818 |
| Comparative Example 8 | — | — | — | — | Acicular Projections | 0.5 | 3.1 | 8.8 | 16.0 | 0.1907 |

Evaluation of Resin Adhesiveness

A cylindrical resin mold of Φ2 mm for evaluation purpose was formed on the outermost plating layer of each of the completed devices for mounting semiconductor elements thereon of Embodied Examples 1 to 12 and Comparative Examples 1 to 8. The shear strength of this resin was measured with a bond tester Dage Series 4000 (manufactured by Dage Corporation), to evaluate resin adhesiveness.

The evaluation results of resin adhesiveness of Embodied Examples 1 to 5 and 7 to 11, and Comparative Examples 1 to 3 and 7 are shown in Table 3. The evaluation results of resin adhesiveness of Embodied Examples 6 and 12 and Comparative Examples 4 to 6 and 8 are shown in Table 4.

TABLE 3

| Examples | Adhesion Strength (MPa) | Process Time (Set to 100 for Comparative Example 1) | Amount of Ag Use (Set to 100 for Comparative Example 1) | Strength Evaluation of Acicular Projections |
|---|---|---|---|---|
| Embodied Example 1 | 15 | 33 | 100 | good |
| Embodied Example 2 | 15 | 50 | 60 | good |
| Embodied Example 3 | 15 | 50 | 60 | good |
| Embodied Example 4 | 15 | 33 | 100 | good |
| Embodied Example 5 | 15 | 50 | 60 | good |
| Embodied Example 7 | 15 | 50 | 60 | good |
| Embodied Example 8 | 15 | 50 | 20 | good |
| Embodied Example 9 | 15 | 50 | 20 | good |
| Embodied Example 10 | 15 | 50 | 60 | good |
| Embodied Example 11 | 15 | 50 | 20 | good |
| Comparative Example 1 | 10 | 100 | 100 | — |
| Comparative Example 2 | 11 | 200 | 200 | — |
| Comparative Example 3 | 12 | 250 | 60 | — |
| Comparative Example 7 | 15 | 25 | 60 | poor |

TABLE 4

| Examples | Adhesion Strength (MPa) | Process Time (Set to 100 for Comparative Example 4) | Amount of Ag Use (Set to 100 for Comparative Example 1) | Strength Evaluation of Acicular Projections |
|---|---|---|---|---|
| Embodied Example 6 | 15 | 100 | 180 | good |
| Embodied Example 12 | 15 | 100 | 33 | good |
| Comparative Example 4 | 15 | 100 | 100 | — |
| Comparative Example 5 | 15 | 100 | 270 | — |
| Comparative Example 6 | 15 | 108 | 100 | — |
| Comparative Example 8 | 15 | 180 | 33 | poor |

Each of the devices for mounting semiconductor elements thereon of Comparative Examples 1 and 4, with a shear strength of 10 MPa, was observed hardly to have a sufficient resin adhesiveness for practical use.

In contrast, as shown in Table 3 and Table 4, every one of the devices for mounting semiconductor elements thereon of Embodied Examples 1 to 12 and Comparative Examples 7 and 8 had a shear strength 1.5 times the shear strength of each of the devices for mounting a semiconductor element thereon of Comparative Examples 1 and 4, and was observed to have a remarkably improved resin adhesiveness.

On the other hand, although each of the devices for mounting semiconductor elements thereon of Comparative Examples 2, 3, 5 and 6 had an improved resin adhesiveness with a shear strength higher than the shear strength of each of the substrates for mounting semiconductor elements thereon of Comparative Examples 1 and 4, it had only 1.1 or 1.2 times as high as the shear strength of each of the substrates for mounting semiconductor elements thereon of Comparative Example 1 and 4 and failed to achieve a remarkable effect of improved resin adhesiveness as the substrates for mounting semiconductor elements thereon of Embodied Examples 1 to 12 and Comparative Examples 7 and 8 won.

Evaluation of Productivity (1) (Device for Mounting Semiconductor Element Thereon Having Configuration in Which Terminals Contain Metal Plate) Comparison was made regarding the processing time and the amount of silver plating required to form the surface morphology of the outermost plating layer in each of the devices for mounting semiconductor elements thereon of Embodied Examples 1 to 5 and 7 to 11 and Comparative Examples 2, 3 and 7 into the form having a roughened surface, to evaluate productivity. In evaluation of productivity, upon the processing time and the amount of use of silver plating for the device for mounting a semiconductor element thereon of Comparative Example 1, in which a smooth silver plating layer was formed as the outermost plating layer, being set to 100, respectively, relative numerical values were used as evaluation values. In addition, since a device for mounting a semiconductor element thereon should be subjected to plating process while being line-conveyed, the evaluation value of the processing time was calculated on the basis of the time required for forming a metal plating layer that required the longest plating time in the plating process for the device for mounting a semiconductor element thereon of each of Embodied Examples and Comparative Examples (Embodied Examples 1 and 4: reinforcing silver plating; Embodied Examples 2, 3, 5, 8, 9: undercoat nickel plating; Embodied Examples 7, 10 and 11: reinforcing nickel plating; Comparative Examples 2: smooth silver plating; Comparative Example 3: smooth nickel plating; Comparative Example 7, roughened silver plating).

The evaluation results of productivity (the processing time and the amount of silver plating required to form the surface morphology of the outermost plating layer into the form having a roughened surface) of Embodied Examples 1 to 5 and 7 to 11 and Comparative Examples 2, 3 and 7 are shown in Table 3.

The device for mounting a semiconductor element thereon of Comparative Example 2 is an example in which, after formation of a silver plating layer with a smooth surface and a thickness of about 5.0 µm, a roughened, uneven surface was formed at the outer surface of the silver plating layer by microetching treatment with use of a silver plating stripping solution. The thickness of the silver plating layer with a roughened, uneven surface at the outer surface was 2.8 µm, which is about half the thickness of the silver plating layer with a smooth surface. As shown in Table 3, with the processing time being 200 and the amount of silver use being 200, the productivity was observed to be poor because of, in addition to the long processing time, a very high cost of silver, the prime cost of which is expensive.

The device for mounting a semiconductor element thereon of Comparative Example 3 is an example in which, after formation of a nickel plating layer with a smooth surface and a thickness of about 5.0 µm, a roughened, uneven surface was formed at the outer surface of the silver plating layer by microetching treatment with use of a nickel plating stripping solution. The thickness of the nickel plating layer with a roughened, uneven surface at the outer surface was 2.6 µm, which is about half the thickness of the nickel plating layer with a smooth surface. As shown in Table 3, with the processing time being 250 and the amount of silver use being 60, it was observed that, although the cost of silver could be saved to some extent, the productivity was very poor because of the very long processing time.

On the other hand, as shown in Table 3, for every one of the devices for mounting a semiconductor element thereon of Embodied Examples 1 to 5 and 7 to 11 and Comparative Example 7, the processing time was 25 to 50 and the amount of silver use was 20 to 100; the productivity was observed to be remarkably improved with the processing time being reduced by 75 to 87.5% and the amount of silver use being reduced by 50 to 90% as compared with the device for mounting a semiconductor element thereon of Comparative Example 2. In addition, the devices for mounting semiconductor elements thereon of Embodied Examples 8, 9, and 11 were observed to achieve remarkably improved productivity with the processing time being reduced by 80% and the amount of silver use being reduced by 67% as compared with the device for mounting a semiconductor element thereon of Comparative Example 3. Regarding the devices for mounting semiconductor elements thereon of Embodied Examples 2, 3, 5, 7 and 10, although the amount of silver use was about the same as the device for mounting a semiconductor element thereon of Comparative Example 3, it was significantly reduced as compared with the device for mounting a semiconductor element thereon of Comparative Example 2. In addition, the productivity was observed to be remarkably improved, with the processing time being reduced by 80% as compared with the device for mounting a semiconductor element thereon of Comparative Example 3. Regarding the devices for mounting semiconductor elements thereon of Embodied Examples 1 and 4, although the amount of silver use was increased by 67% as compared with the device for mounting a semiconductor element thereon of Comparative Example 3, it was significantly reduced as compared with the device for mounting a semiconductor element thereon of Comparative Example 2. In addition, the productivity was observed to be remarkably improved, with the processing time being reduced by 87% as compared with the device for mounting a semiconductor element thereon of Comparative Example 3.

Evaluation of Productivity (2) (Device for Mounting Semiconductor Element Thereon Having Configuration in Which Terminals Is Composed Only of Plating Layers)

Since each of the devices for mounting semiconductor elements thereon of Embodied Examples 6 and 12 and Comparative Examples 5, 6, 8, had the configuration in which the columnar terminal portions are composed only of plating layers, the processing time for plating takes longer than those for the devices for mounting semiconductor elements thereon of Embodied Examples 1 to 5 and 7 to 11 and Comparative Example 7. Therefore, evaluation of productivity was made through comparison among those having columnar terminal portions composed only of plating layers.

Comparison was made regarding the processing time and the amount of silver plating required to form the surface morphology of the outermost plating layer in each of the devices for mounting semiconductor elements thereon of Embodied Examples 6 and 12 and Comparative Examples 5, 6 and 8 into the form having a roughened surface, to evaluate productivity. In evaluation of productivity, upon the processing time and the amount of use of silver plating for the device for mounting a semiconductor element thereon of Comparative Example 4, in which a smooth silver plating layer was formed as the outermost plating layer, being set to 100, respectively, relative numerical values were used as evaluation values. In addition, since a device for mounting a semiconductor element thereon should be subjected to plating process while being line-conveyed, the evaluation value of the processing time was calculated on the basis of the time required for forming a metal plating layer that required the longest plating time in the plating process for the device for mounting a semiconductor element thereon of each of Embodied Examples and Comparative Examples (Embodied Examples 6 and 12: undercoat nickel plating; Comparative Examples 5, 6 an 8: smooth nickel plating).

The evaluation results of productivity (the processing time and the amount of silver plating required to form the surface morphology of the outermost plating layer into the form having a roughened surface) of Embodied Examples 6 and 12 and Comparative Examples 5, 6 and 8 are shown in Table 4.

The device for mounting a semiconductor element thereon of Comparative Example 5 is an example in which, after formation of a silver plating layer with a thickness of 4.0 µm having a smooth surface, a roughened surface with unevenness was formed at the outer surface of the silver plating layer by microetching treatment using a stripping solution for silver plating. The thickness of the silver plating layer having the roughened surface with unevenness at the outer surface was 1.5 µm, which is about half the thickness of the silver plating layer with a smooth surface. As shown in Table 4, with the processing time being 100 and the amount of silver use being 270, the productivity was observed to be poor because of a very high cost of silver, the prime cost of which is expensive.

The device for mounting a semiconductor element thereon of Comparative Example 6 is an example in which, after formation of a nickel plating layer with a thickness of 34.5 µm having a smooth surface, a roughened surface with unevenness was formed at the outer surface of the silver plating layer by microetching treatment using a stripping solution for nickel plating. The thickness of the nickel plating layer having a roughened surface with unevenness at the outer surface was 32.0 µm. As shown in Table 4, with the processing time being 108 and the amount of silver use being 100, the productivity was observed to be poor because of the increased processing time.

On the other hand, as shown in Table 4, for each of the devices for mounting a semiconductor element thereon of Embodied Examples 6 and 12 and Comparative Example 8, the processing time was 100 and the amount of silver use was 33 to 100; although the processing time was at the same level, the production cost was observed to be remarkably reduced with the amount of silver use being reduced by 63 to 87%, as compared with the device for mounting a semiconductor element thereon of Comparative Example 5. Regarding the device for mounting a semiconductor element thereon of Embodied Example 6, although the amount of silver use was at the same level, the productivity was observed to be improved with the processing time being reduced by 8% as compared with the device for mounting a semiconductor element thereon of Comparative Example 6. Regarding the devices for mounting semiconductor elements thereon of Embodied Example 6 and Comparative Example 8, the productivity was observed to be remarkably improved with the processing time being reduced by 8% and the amount of silver use being reduced by 67%, as compared with the device for mounting a semiconductor element thereon of Comparative Example 6.

Evaluation of Strength of Acicular Projections

The strength of acicular projections at the outer surface was evaluated for the devices for mounting semiconductor elements thereon of Embodied Examples 1 to 12 and Comparative Examples 7 and 8 as follows.

Regarding the evaluation method, after Scotch600 adhesive tape manufactured by 3M was applied to the outer surface of acicular projections formed at the outer surface of each device for mounting a semiconductor element thereon, evaluation was made through observation of whether any breakage of the acicular projections appears or not on the adhesive surface of the tape as peeled off via an optical microscope at ×20.

The evaluation criterion was such that, when no sliver of acicular projection was found adhered to the adhesive surface of the tape, judgment was "good", while when any sliver of acicular projections was found adhered to the adhesive surface of the tape, the judgment was "poor".

The evaluation results are shown in Table 3 and Table 4.

As shown in Table 3 and Table 4, each of the devices for mounting semiconductor elements thereon of Comparative Examples 7 and 8 was given the judgment result "poor" regarding the strength of acicular projections.

In contrast, every one of the devices for mounting semiconductor elements thereon of Embodied Examples 1 to 12 was given the judgement result of "good" regarding the strength of acicular projections, and thus was observed to be capable of preventing decrease in adhesion to the resin caused by breakage of acicular projections in the roughened silver plating layer and of retaining a remarkably high adhesion to the sealing resin.

In the description above, "top faces of a lead frame base (metal plate)" is intended to mean faces of a lead frame base (metal plate) that are positioned at a highest level on the upper surface side, and "bottom faces of a lead frame base (metal plate)" is intended to mean faces of a lead frame base (metal plate) that are positioned at a lowest level on the lower surface side. Also, "faces that form concavities or through holes between the top faces and bottom faces of the lead frame base (metal plate)" includes "faces that form concavities in reference to the top faces on the upper surface side", "faces that form concavities in reference to the bottom faces on the lower surface side" and "wall faces of through holes from the top faces to the bottom faces".

Although the preferred embodiment modes and the embodied examples of the present invention have been described in detail above, the present invention is not limited to the embodiment modes and the embodied examples described above. Various modifications and substitutions may be made to the embodiment modes and the embodied examples described above without departing from the scope of the present invention.

The description has been made that, in the device for mounting a semiconductor element thereon of the present invention, the material of the base is a copper-based material such as a copper alloy. However, a nickel-based alloy also may be employed as a material of the base of the device for mounting a semiconductor element thereon.

What is claimed is:

1. A device for mounting a semiconductor element thereon, the device comprising:
   a metal plate serving as a base;
   a silver plating layer having acicular projections, formed on at least either of the following (a) and (b) of the metal plate:
      (a) top faces,
      (b) faces that form concavities or through holes between the top faces and bottom faces; and
   a reinforcing plating layer that covers, as an outermost plating layer, an outer surface of the acicular projections in the roughened silver plating layer,
   wherein the roughened silver plating layer has a crystal structure in which the crystal direction <101> occupies a largest proportion among the crystal directions <001>, <111> and <101>, and
   wherein an outer surface of the reinforcing plating layer is shaped to have acicular projections having a surface area ratio of 1.30 or more and 6.00 or less to a surface area of a corresponding smooth surface, as inheriting the acicular projections in the roughened silver plating layer.

2. The device for mounting a semiconductor element thereon according to claim 1,
   wherein a thickness of the reinforcing plating layer is 0.4 µm or more and 4.0 µm or less.

3. The device for mounting a semiconductor element thereon according the claim 1, wherein an average diameter of crystal grains in the roughened silver plating layer is smaller than 0.28 µm.

4. The device for mounting a semiconductor element thereon according to claim 1,
wherein an undercoat plating layer is provided between the metal plate and the roughened silver plating layer.

5. The device for mounting a semiconductor element thereon according to claim 1,
wherein the device for mounting a semiconductor element thereon is configured as a lead frame, and the metal frame serving as a base is made of a copper-based material.

6. A substrate for mounting a semiconductor element thereon, comprising:
a metal plate made of a copper-based material and having columnar terminal portions defined by concavities formed on an upper surface of the metal plate;
a roughened silver plating layer having acicular projections, formed on top faces of the columnar terminal portions; and
a reinforcing plating layer that covers, as an outermost plating layer, an outer surface of the acicular projections in the roughened silver plating layer,
wherein the roughened silver plating layer has a crystal structure in which the crystal direction <101> occupies a largest proportion among the crystal directions <001>, <111> and <101>, and
wherein an outer surface of the reinforcing plating layer is shaped to have acicular projections having a surface area ratio of 1.30 or more and 6.00 or less to a surface area of a corresponding smooth surface, as inheriting the acicular projections in the roughened silver plating layer.

7. A substrate for mounting a semiconductor element thereon, comprising:
a metal plate; and
columnar terminal portions consisting of plating layers, formed on an upper surface of the metal plate;
wherein the columnar terminal portions include a roughened silver plating layer having acicular projections and a reinforcing plating layer that covers, as an outermost plating layer, an outer surface of the acicular projections in the roughened silver plating layer,
wherein the roughened silver plating layer has a crystal structure in which the crystal direction <101> occupies a largest proportion among the crystal directions <001>, <111> and <101>, and
wherein an outer surface of the reinforcing plating layer is shaped to have acicular projections having a surface area ratio of 1.30 or more and 6.00 or less to a surface area of a corresponding smooth surface, as inheriting the acicular projections in the roughened silver plating layer.

* * * * *